(12) United States Patent
Luo et al.

(10) Patent No.: US 12,505,974 B2
(45) Date of Patent: Dec. 23, 2025

(54) SYSTEMS AND METHODS FOR FOCUSING CHARGED—PARTICLE BEAMS

(71) Applicant: ASML Netherlands B.V., Veldhoven (NL)

(72) Inventors: Ying Luo, San Jose, CA (US);
Zhonghua Dong, Sunnyvale, CA (US);
Xuehui Yin, Union City, CA (US);
Long Di, San Jose, CA (US); Nianpei Deng, Fremont, CA (US); Wei Fang, Milpitas, CA (US); Lingling Pu, San Jose, CA (US); Ruochong Fei, San Jose, CA (US); Bohang Zhu, San Jose, CA (US); Yu Liu, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 750 days.

(21) Appl. No.: 17/418,741

(22) PCT Filed: Dec. 19, 2019

(86) PCT No.: PCT/EP2019/086459
§ 371 (c)(1),
(2) Date: Jun. 25, 2021

(87) PCT Pub. No.: WO2020/136094
PCT Pub. Date: Jul. 2, 2020

(65) Prior Publication Data
US 2022/0068590 A1 Mar. 3, 2022

Related U.S. Application Data

(60) Provisional application No. 62/944,958, filed on Dec. 6, 2019, provisional application No. 62/786,131, filed on Dec. 28, 2018.

(51) Int. Cl.
*H01J 37/147* (2006.01)
*H01J 37/20* (2006.01)
(Continued)

(52) U.S. Cl.
CPC .......... *H01J 37/1471* (2013.01); *H01J 37/20* (2013.01); *H01J 37/21* (2013.01); *H01J 37/28* (2013.01);
(Continued)

(58) Field of Classification Search
CPC ........ H01J 37/1471; H01J 37/00; H01J 37/02; H01J 37/20; H01J 37/21; H01J 37/26;
(Continued)

(56) References Cited

U.S. PATENT DOCUMENTS 4,063,103 A * 12/1977 Sumi ...................... B82Y 10/00
250/398
5,557,105 A * 9/1996 Honjo ................. H01J 37/3007
250/397
(Continued)

FOREIGN PATENT DOCUMENTS

CN 1411025 A 4/2003
CN 103782240 A 5/2014
(Continued)

OTHER PUBLICATIONS

International search report in PCT Application No. PCT/EP2019/086459, mailed Jun. 26, 2020 (5 pages).
(Continued)

*Primary Examiner* — Jason L Mccormack
(74) *Attorney, Agent, or Firm* — FINNEGAN, HENDERSON, FARABOW, GARRETT & DUNNER LLP

(57) ABSTRACT

Systems and methods for irradiating a sample with a charged-particle beam are disclosed. The charged-particle
(Continued)

beam system may comprise a stage configured to hold a sample and is movable in at least one of X-Y-Z axes. The charged-particle beam system may further comprise a position sensing system to determine a lateral and vertical displacement of the stage, and a beam deflection controller configured to apply a first signal to deflect a primary charged-particle beam incident on the sample to at least partly compensate for the lateral displacement, and to apply a second signal to adjust a focus of the deflected charged-particle beam incident on the sample to at least partly compensate for the vertical displacement of the stage. The first and second signals may comprise an electrical signal having a high bandwidth in a range of 10 kHz to 50 kHz, and 50 kHz to 200 kHz, respectively.

16 Claims, 20 Drawing Sheets

(51) Int. Cl.
  *H01J 37/21* (2006.01)
  *H01J 37/28* (2006.01)
(52) U.S. Cl.
  CPC .............. *H01J 2237/0216* (2013.01); *H01J 2237/20285* (2013.01); *H01J 2237/20292* (2013.01)
(58) Field of Classification Search
  CPC .............. H01J 37/28; H01J 2237/0216; H01J 2237/20285; H01J 2237/20292; H01J 2237/202
  USPC ............... 250/306, 307, 311, 396 R, 440.11
  See application file for complete search history.

(56) References Cited

U.S. PATENT DOCUMENTS

| | | | | |
|---|---|---|---|---|
| 5,780,943 | A * | 7/1998 | Ono | G03F 7/70691 310/90.5 |
| 6,407,373 | B1 | 6/2002 | Dotan | |
| 9,324,540 | B2 | 4/2016 | Tachibana et al. | |
| 9,400,176 | B2 | 7/2016 | Wang et al. | |
| 2002/0048026 | A1 | 4/2002 | Isshiki et al. | |
| 2006/0060781 | A1* | 3/2006 | Watanabe | B82Y 40/00 250/310 |
| 2007/0235646 | A1 | 10/2007 | Tanii et al. | |
| 2009/0140143 | A1 | 6/2009 | Fukuda et al. | |
| 2011/0260055 | A1 | 10/2011 | Wang et al. | |
| 2013/0016327 | A1 | 1/2013 | Looije et al. | |
| 2013/0214155 | A1 | 8/2013 | Winkler et al. | |
| 2013/0342827 | A1 | 12/2013 | Ummethala et al. | |
| 2014/0339425 | A1 | 11/2014 | Yano et al. | |
| 2015/0213995 | A1* | 7/2015 | Muray | H01J 37/05 250/311 |
| 2018/0284620 | A1 | 10/2018 | Ogasawara | |

FOREIGN PATENT DOCUMENTS

| | | |
|---|---|---|
| EP | 00566963 A3 | 10/1993 |
| EP | 1596072 A2 | 11/2005 |
| GB | 2552324 A | 1/2018 |
| JP | H05-299048 A | 11/1993 |
| JP | H11-149895 A | 6/1999 |
| JP | 2000-331634 A | 11/2000 |
| JP | 2000-337846 A | 12/2000 |
| JP | 2001133417 A | 5/2001 |
| JP | 2003051435 A | 2/2003 |
| JP | 2005-019258 A2 | 1/2005 |
| JP | 2005286133 A | 10/2005 |
| JP | 2007-194126 A | 8/2007 |
| JP | 2008-130361 A | 6/2008 |
| JP | 2010282810 A | 12/2010 |
| JP | 2011227768 A | 11/2011 |
| JP | 2012182467 A | 9/2012 |
| JP | 2012234754 A | 11/2012 |
| JP | 2013-125583 A | 6/2013 |
| KR | 2001-0007394 A | 1/2001 |
| TW | 201411680 A | 3/2014 |

OTHER PUBLICATIONS

Notice of Reasons for Rejection from the Japan Patent Office issued in related Japanese Patent Application No. 2021-533478; mailed Jul. 4, 2022 (14 pgs.).

Notification of Reason(s) for Refusal from the Korean Patent Office issued in related Korean Patent Application No. 10-2021-7020090; mailed Feb. 13, 2023 (12 pgs.).

* cited by examiner

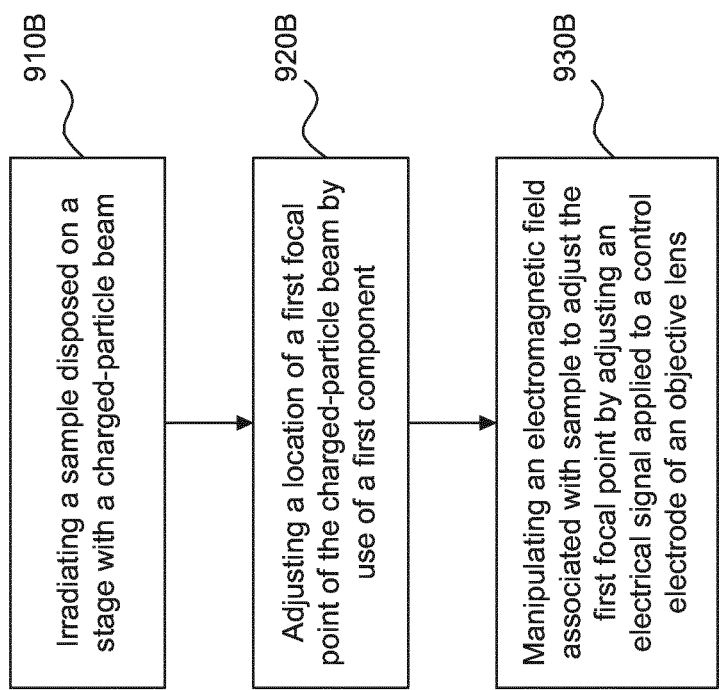

1000

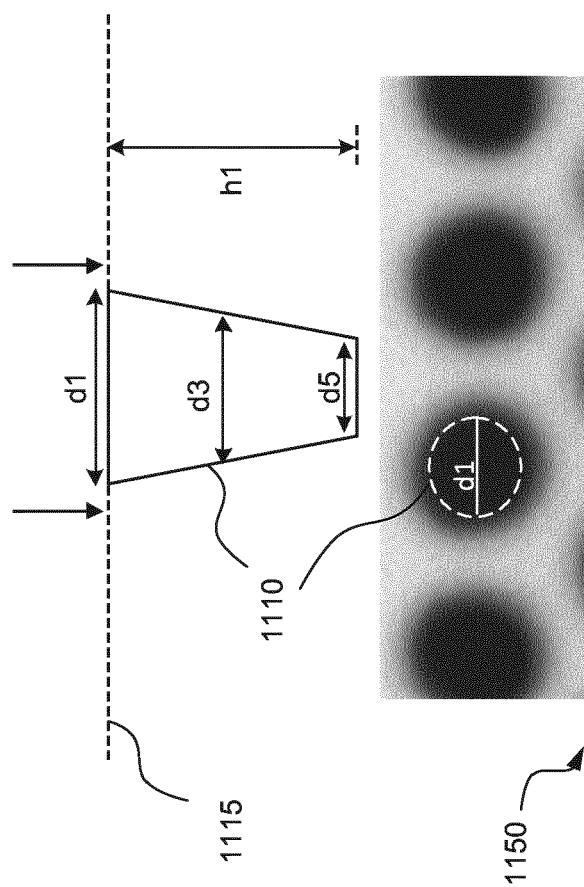
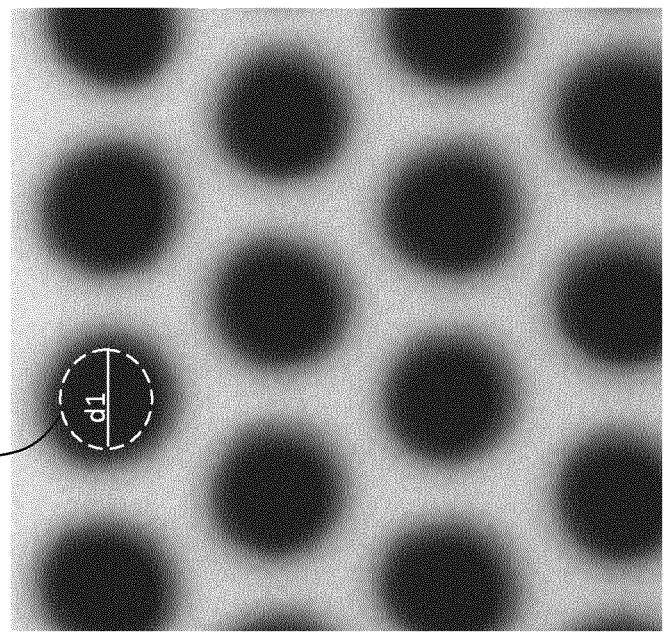
FIG. 11A
FIG. 11B

SYSTEMS AND METHODS FOR FOCUSING CHARGED—PARTICLE BEAMS

CROSS-REFERENCE TO RELATED APPLICATIONS

This application claims priority to International Application No. PCT/EP2019/086459, filed Dec. 19, 2019, and published as WO 2020/136094, which claims priority of U.S. application 62/786,131 which was filed on Dec. 28, 2018, and US application 62/944,958 which was filed on Dec. 6, 2019., and which is incorporated herein in its entirety by reference. The contents of these applications are incorporated herein by reference in their entireties.

FIELD

The description herein relates to the field of charged-particle beam systems, and more particularly to systems and methods of focusing charged-particle beams and dynamically compensating for vibration.

BACKGROUND

In manufacturing processes of integrated circuits (ICs), unfinished or finished circuit components are inspected to ensure that they are manufactured according to design and are free of defects. Inspection systems utilizing optical microscopes or charged particle (e.g., electron) beam microscopes, such as a scanning electron microscope (SEM) can be employed. As the physical sizes of IC components continue to shrink, accuracy and yield in defect detection become more and more important. However, imaging resolution and throughput of inspection tools struggles to keep pace with the ever-decreasing feature size of IC components. The accuracy, resolution and throughput of such inspection tools may be limited by the lack of desired precision in stage motion and control mechanisms.

Thus, related art systems face limitations in, for example, high precision stage motion control mechanisms for charged-particle beam inspection systems in semiconductor manufacturing processes. Further improvements in the art are desired.

SUMMARY

Embodiments of the present disclosure provide systems and methods for high precision three-dimension stage control for a charged-particle beam system. In one aspect of the disclosure, a charged-particle beam system is disclosed. The charged-particle beam system comprises a stage configured to hold a sample and is movable in at least one of X-Y and Z axes. The charged-particle beam system may further comprise a position sensing system to determine a lateral and vertical displacement of the stage, and a controller configured to apply a first signal to deflect a primary charged-particle beam incident on the sample to at least partly compensate for the lateral displacement of the stage, and apply a second signal to adjust a focus of a deflected charged-particle beam incident on the sample to at least partly compensate for the vertical displacement of the stage. The lateral displacement may correspond to a difference between a current position of the stage and a target position of the stage in the at least one of X-Y axes. The first signal may comprise an electrical signal affecting how the primary charged-particle beam is deflected in the at least one of X-Y axes, and the electrical signal may include a signal having a bandwidth in a range of 10 kHz to 50 KHz.

In some embodiments, the controller may be further configured to dynamically adjust at least one of the first signal or the second signal during scanning of the primary charged-particle beam on the sample. The vertical displacement of the stage may correspond to a difference between a current position of the stage and a target position of the stage in the Z-axis, and the vertical displacement may vary during scanning of the primary charged-particle beam on the sample to at least partly compensate for an angular rotation about at least one of X or Y axes. The second signal may comprise a voltage signal applied to the stage, affecting how the deflected charged-particle beam incident on the sample is focused in the Z-axis, and the voltage signal may comprise a signal having a bandwidth in a range of 50 kHz to 200 kHz.

In some embodiments, the charged-particle beam system may include a stage motion controller, wherein the stage motion controller comprises a plurality of motors configured to be independently controlled by a third signal. Each of the plurality of motors may be independently controlled to adjust a leveling of the stage, such that the stage is substantially perpendicular to an optical axis of the primary charged-particle beam. In some embodiments, adjusting the leveling of the stage may be based on a geometric model of an actuation output of the stage. The third signal may comprise a plurality of control signals, each of the plurality of control signals corresponding to at least one of the plurality of motors. In some embodiments, the plurality of motors may comprise at least one of a piezoelectric motor, piezoelectric actuator, or an ultrasonic piezo-motor.

In some embodiments, the charged-particle beam system may further include first component configured to form an embedded control signal based on the plurality of control signals, and a second component configured to extract at least one of the plurality of control signals from the embedded control signal. The position sensing system of the charged-particle beam system may be configured to determine the lateral and vertical displacement of the stage using a combination of a laser interferometer and a height sensor. In some embodiments, the laser interferometer may be configured to determine the lateral displacement of the stage, and the height sensor may be configured to determine the vertical displacement of the stage.

In another aspect of the disclosure, a charged-particle beam system is disclosed. The charged-particle system may include a stage configured to hold a sample and is movable in at least a Z axis. The charged-particle beam system may further include a position sensing system configured to determine a vertical displacement of the stage, and a controller configured to apply a voltage signal to the stage, affecting how the charged-particle beam incident on the sample is focused in the Z-axis. The vertical displacement of the stage may correspond to a difference between a current position of the stage and a target position of the stage in the Z-axis, and the vertical displacement may vary during scanning of the primary charged-particle beam on the sample to at least partly compensate for an angular rotation about at least one of X or Y axes. The controller may be further configured to dynamically adjust the voltage signal during scanning of the primary charged-particle beam on the sample.

In another aspect of the disclosure, a method for irradiating a sample disposed on a stage in a charged-particle beam system is disclosed. The method may comprise generating a primary charged-particle beam from a charged-particle source, determining a lateral displacement of the stage, wherein the stage is movable in at least one of X-Y and Z axes, and applying a first signal to deflect the primary charged-particle beam incident on the sample to at least partly compensate for the lateral displacement of the stage, and applying a second signal to the stage adjust a focus of a deflected charged-particle beam incident on the sample to at least partly compensate for the vertical displacement of the stage. The lateral displacement may correspond to a difference between a current position of the stage and a target position of the stage in the at least one of X-Y axes. The vertical displacement of the stage may correspond to a difference between a current position of the stage and a target position of the stage in the Z-axis, and the vertical displacement may vary during scanning of the primary charged-particle beam on the sample to at least partly compensate for an angular rotation about at least one of X or Y axes. The controller may be further configured to dynamically adjust at least one of the first signal or the second signal during scanning of the primary charged-particle beam on the sample. The first signal may comprise an electrical signal affecting how the primary charged-particle beam is deflected in the at least one of X-Y axes, and the electrical signal may include a signal having a bandwidth in a range of 10 kHz to 50 kHz. The second signal may comprise a voltage signal applied to the stage, affecting how the deflected charged-particle beam incident on the sample is focused in the Z-axis. The voltage signal may comprise a signal having a bandwidth in a range of 50 kHz to 200 kHz In some embodiments, the method for irradiating a sample disposed on a stage in a charged-particle beam system may further comprise applying a third signal to a stage motion controller, wherein the stage motion controller comprises a plurality of motors configured to be independently controlled by the third signal. The method may further include wherein each of the plurality of motors are independently controlled to adjust a leveling of the stage, such that the stage is substantially perpendicular to an optical axis of the primary charged-particle beam. In some embodiments, adjusting the leveling of the stage may be based on a geometric model of an actuation output of the stage. The third signal may comprise a plurality of control signals, each of the plurality of control signals corresponding to at least one of the plurality of motors. In some embodiments, the plurality of motors may comprise at least one of a piezoelectric motor, piezoelectric actuator, or an ultrasonic piezo-motor.

In some embodiments, applying the third signal may comprise embedding the plurality of control signals to form an embedded control signal by a first component of a control module, and extracting at least one of the plurality of control signals from the embedded control signal by a second component of the control module. The position sensing system of the charged-particle beam system may be configured to determine the lateral and vertical displacement of the stage using a combination of a laser interferometer and a height sensor. In some embodiments, the laser interferometer may be configured to determine the lateral displacement of the stage, and the height sensor may be configured to determine the vertical displacement of the stage.

In yet another aspect of the disclosure, a method for irradiating a sample disposed on a stage in a charged-particle beam system may comprise generating a primary charged-particle beam from a charged-particle source, determining a vertical displacement of the stage, wherein the stage is movable in a Z-axis, and applying a voltage signal to the stage to adjust a focus of a deflected charged-particle beam incident on the sample to at least partly compensate for the vertical displacement of the stage. The method may further comprise determining a lateral displacement of the stage, wherein the stage is movable in at least one of X-Y axes, and applying a beam deflection signal to deflect a focused charged-particle beam incident on the sample to at least partly compensate for the lateral displacement.

In some embodiments, the method for irradiating a sample disposed on a stage in a charged-particle beam system may further comprise dynamically adjusting at least one of the voltage signal or the beam deflection signal during scanning of the primary charged-particle beam on the sample. In some embodiments, the method may further comprise applying a control signal to a stage motion controller, wherein the stage motion controller comprises a plurality of motors configured to be independently controlled by the control signal. Each of the plurality of motors may be independently controlled to adjust a leveling of the stage, such that the stage is substantially perpendicular to an optical axis of the primary charged-particle beam.

In some embodiments, applying the control signal may comprise embedding the plurality of control signals to form an embedded control signal by a first component of a control module, and extracting at least one of the plurality of control signals from the embedded control signal by a second component of the control module.

In yet another aspect of the disclosure, a non-transitory computer readable medium comprising a set of instructions that is executable by one or more processors of a charged-particle beam apparatus to cause the charged-particle beam apparatus to perform a method is disclosed. The method may comprise determining a lateral displacement of a stage, wherein the stage is movable in at least one of X-Y axes, and instructing a controller to apply a first signal to deflect the primary charged-particle beam incident on the sample to at least partly compensate for the lateral displacement. The set of instructions that is executable by the one or more processors of the apparatus may cause the apparatus to further perform applying a third signal to a stage motion controller configured to adjust a leveling of the stage, such that the stage is substantially perpendicular to an optical axis of the primary charged-particle beam.

In yet another aspect of the disclosure, a method of focusing a charged-particle beam on a sample is disclosed. The method may comprise irradiating the sample disposed on a stage of a charged-particle beam system with the charged-particle beam, adjusting a location of a first focal point of the charged-particle beam with reference to the sample using a first component of the charged-particle system, and manipulating an electromagnetic field associated with the sample to form a second focal point by adjusting the first focal point of the charged-particle beam with reference to the sample using a second component, wherein the second component is located downstream of a focusing component of an objective lens of the charged-particle system. Adjusting the location of the first focal point may comprise adjusting a position of the stage in a Z-axis, and adjusting the position of the stage in the Z-axis may comprise determining, using a height sensor, a position of the sample in the Z-axis and adjusting, using a stage motion controller, the position of the stage in the Z-axis based on the determined position of the sample. The first component of the charged-particle system may be configured to adjust a focal depth of the charged-particle beam with reference to the sample. The first component may be located upstream of the focusing component of the objective lens of the charged-particle system. The first component may comprise a charged-particle source, an anode of the charged-particle source, or a condenser lens, and the first and the second components may be different. Manipulating the electromagnetic field may comprise adjusting an electrical signal applied to the second component of the charged-particle system. The second component of the charged-particle system may comprise one or more of a control electrode of the objective lens, the sample, or the stage. Manipulating the electromagnetic field may comprise adjusting a first component of an electrical signal applied to a control electrode of an objective lens or adjusting a second component of the electrical signal applied to the stage. Adjusting the second component of the electrical signal may adjust a landing energy of the charged-particle beam on the sample. Adjusting the electrical signal may comprise adjusting a first component of an electrical signal to the control electrode of the objective lens; and adjusting a second component of the electrical signal to the stage. Adjusting the first component of the electrical signal applied to the control electrode may coarse-adjust the first focal point of the charged-particle beam on a surface of the sample, and adjusting the second component of the electrical signal to the stage to fine-adjust the first focal point of the charged-particle beam on the surface of the sample. The first component of the electrical signal may be determined based on an acceleration voltage and the landing energy of the charged-particle beam. Manipulating the electromagnetic field may comprise adjusting a magnetic field configured to influence a characteristic of the charged-particle beam. The characteristic of the charged-particle beam may comprise at least one of a path, a direction, a velocity, or an acceleration of the charged-particle beam.

In some embodiments, the landing energy of the charged-particle beam may be in a range of 500 eV to 3 keV. The first component of the electrical signal may comprise a voltage signal in a range of 5 KV to 10 KV, and the second component of the electrical signal may comprise a voltage signal in a range of −150 V to +150 V.

In yet another aspect of the disclosure, a method of focusing a charged-particle beam on a sample is disclosed. The method may comprise irradiating the sample disposed on a stage with the charged-particle beam, adjusting, using a first component of the charged-particle system, a location of a first focal point of the charged-particle beam with reference to the sample, and manipulating, by adjusting a first component of an electrical signal applied to a control electrode of an objective lens, an electromagnetic field associated with the sample to form a second focal point by adjusting the first focal point of the charged-particle beam on the sample.

In yet another aspect of the present disclosure, a charged-particle beam system is disclosed. The charged-particle beam system may comprise a stage configured to hold a sample and is movable along at least one of X-Y axes or Z-axis, and a controller having circuitry. The controller may be configured to adjust, using a first component of the charged-particle system, a location of a first focal point of the charged-particle beam with reference to the sample and manipulate, using a second component, an electromagnetic field associated with the sample to form a second focal point by adjusting the first focal point of the charged-particle beam with reference to the sample, wherein the second component is located downstream of a focusing component of an objective lens of the charged-particle system. Adjustment of the location of the first focal point may comprise adjustment of a position of the stage in the Z-axis. The system may further comprise a position sensing system configured to determine a position of the sample in the Z-axis. The position sensing system may comprise a height sensor including a laser diode-sensor assembly. The controller may be configured to adjust the position of the stage in the Z-axis based on the position of the sample determined by the position sensing system. The height sensor may be configured to determine the position of the sample in the Z-axis, and the controller may be configured to adjust the position of the stage in the Z-axis to form the first focal point of the charged-particle beam on the sample. The first component may be configured to adjust a focal depth of the charged-particle beam with reference to the sample and may be located upstream of the focusing component of the objective lens of the charged-particle system. The first component may comprise a charged-particle source, an anode of the charged-particle source, or a condenser lens, and the first and the second components of the charged-particle system may be different. Manipulation of the electromagnetic field may comprise adjustment of an electrical signal applied to the second component of the charged-particle system. The second component of the charged-particle system may comprise one or more of a control electrode of the objective lens, the sample, or the stage. Adjustment of the electrical signal applied to the second component may adjust a landing energy of the charged-particle beam on the sample. Adjustment of the electrical signal may comprise adjustment of a first component of the electrical signal applied to the control electrode of the objective lens, and adjustment of a second component of the electrical signal applied to the stage. The controller may be further configured to manipulate the electromagnetic field by adjusting a magnetic field configured to influence a characteristic of the charged-particle beam. The characteristic of the charged-particle beam may comprise at least one of a path, a direction, a velocity, or an acceleration of the charged-particle beam. Adjustment of the first component of the electrical signal applied to the control electrode may coarse-adjust the first focal point of the charged-particle beam on a surface of the sample, and adjusting the second component of the electrical signal to the stage to fine-adjust the first focal point of the charged-particle beam on the surface of the sample. The first component of the electrical signal may be determined based on an acceleration voltage and the landing energy of the charged-particle beam.

In some embodiments, the first component of the electrical signal may be determined based on an acceleration voltage and the landing energy of the charged-particle beam. The first component of the electrical signal may comprise a voltage signal in a range of 5 KV to 10 KV, and wherein the second component of the electrical signal may comprise a voltage signal in a range of −150 V to +150 V. The landing energy of the charged-particle beam is in a range of 500 eV to 3 keV.

In yet another aspect of the present disclosure, a non-transitory computer readable medium comprising a set of instructions that is executable by one or more processors of an apparatus to cause the apparatus to perform a method is disclosed. The method may comprise adjusting, using a first component of the charged-particle system, a location of a first focal point of the charged-particle beam with reference to the sample; and manipulating, using a second component, an electromagnetic field associated with the sample to form a second focal point by adjusting the first focal point of the charged-particle beam with reference to the sample, wherein the second component is located downstream of a focusing component of an objective lens of the charged-particle system. The set of instructions that is executable by the one or more processors of the apparatus may cause the apparatus to further perform determining, using a height sensor, a position of the sample in the Z-axis; and adjusting, using a stage motion controller, the position of the stage in the Z-axis based on the determined position of the sample to form a first focal point of the charged-particle beam on the sample. The set of instructions that is executable by the one or more processors of the apparatus may cause the apparatus to further perform manipulating an electromagnetic field associated with the sample by adjusting a first component of an electrical signal to coarse-adjust the first focal point of the charged-particle beam on a surface of the sample; and adjusting a second component of the electrical signal to the stage to fine-adjust the first focal point of the charged-particle beam on the surface of the sample.

In yet another aspect of the present disclosure, a method of generating a 3D image of a sample in a charged-particle beam apparatus is disclosed. The method may comprise irradiating the sample disposed on a stage with a charged-particle beam, manipulating an electromagnetic field associated with the sample to adjust a focus of the charged-particle beam with reference to the sample, forming a plurality of focal planes substantially perpendicular to a primary optical axis of the charged-particle beam based on the manipulation of the electromagnetic field, generating a plurality of image frames from the plurality of focal planes of the sample, wherein an image frame of the plurality of image frames is associated with a corresponding focal plane of the plurality of focal planes, and generating a 3D image of the sample from the plurality of image frames and corresponding focal plane information. Manipulating the electromagnetic field may comprise adjusting a first component of the electrical signal applied to a control electrode of an objective lens or adjusting a second component of the electrical signal applied to the stage.

In some embodiments, adjusting the second component of the electrical signal may adjust a landing energy of the charged-particle beam on the sample. Adjusting the landing energy may comprise adjusting a first component of the electrical signal to coarse-adjust a first focal point of the charged-particle beam on a surface of the sample, and adjusting a second component of the electrical signal to the stage to fine-adjust the first focal point of the charged-particle beam on the surface of the sample. The first component of the electrical signal may be determined based on an acceleration voltage and the landing energy of the charged-particle beam. The first component of the electrical signal may comprise a voltage signal in a range of 5 KV to 10 KV, and the second component of the electrical signal may comprise a voltage signal in a range of −150 V to +150 V. The landing energy of the charged-particle beam is in a range of 500 eV to 3 keV.

The method may further comprise forming a first focal plane of the plurality of focal planes coinciding with a top surface of the sample, and a second focal plane of the plurality of focal planes at a distance below the first focal plane. The distance between the first focal plane and the second focal plane may be adjusted dynamically based on a feature being imaged or a material of the sample. The method may comprise generating a plurality of image frames at each focal plane of the plurality of focal planes of the sample. Generating the 3D image may comprise reconstructing the plurality of image frames using a reconstruction algorithm.

In yet another aspect of the present disclosure, a charged-particle beam system is disclosed. The a charged-particle beam system may comprise a configured to hold a sample and is movable along at least one of X-Y axes and Z-axis, and a controller having circuitry. The controller may be configured to manipulate an electromagnetic field associated with the sample to adjust a focus of the charged-particle beam with reference to the sample, form a plurality of focal planes substantially perpendicular to a primary optical axis of the charged-particle beam based on the manipulation of the electromagnetic field, generate a plurality of image frames from the plurality of focal planes, wherein an image frame of the plurality of image frames is associated with a corresponding focal plane of the plurality of focal planes, and generate a 3D image of the sample from the plurality of image frames and corresponding focal plane information.

Manipulation of the electromagnetic field may comprise adjustment of a first component of the electrical signal applied to a control electrode of an objective lens or adjustment of a second component of the electrical signal applied to the stage. Adjustment of the second component of the electrical signal may comprise adjustment of a landing energy of the charged-particle beam on the sample. Adjustment of the landing energy may comprise application of a first component of the electrical signal to coarse-adjust a first focal point of the charged-particle beam on a surface of the sample; and application of a second component of the electrical signal to the stage to fine-adjust the first focal point of the charged-particle beam on the surface of the sample. The first component of the voltage signal may be determined based on an acceleration voltage and the landing energy of the charged-particle beam. The first component of the voltage signal may comprise a voltage signal in a range of 5 KV to 10 KV, and the second component of the voltage signal may comprise a voltage signal in a range of −150 V to +150 V. The landing energy of the charged-particle beam is in a range of 500 eV to 3 keV.

In some embodiments, the plurality of focal planes includes a first focal plane that coincides with a top surface of the sample and a second focal plane formed at a distance below the first focal plane. The distance between the first focal plane and the second focal plane is adjusted dynamically based on a feature being imaged or a material of the sample. The controller may be configured to generate a plurality of image frames at each focal plane of the plurality of focal planes of the sample and generate the 3D image of the sample by reconstructing the plurality of image frames using a reconstruction algorithm.

In yet another aspect of the present disclosure, a non-transitory computer readable medium comprising a set of instructions that is executable by one or more processors of an apparatus to cause the apparatus to perform a method is disclosed. The method may comprise irradiating the sample disposed on a stage with a charged-particle beam, manipulating an electromagnetic field associated with the sample to adjust a focus of the charged-particle beam with reference to the sample, forming a plurality of focal planes substantially perpendicular to a primary optical axis of the charged-particle beam based on the manipulation of the electromagnetic field, generating a plurality of image frames from the plurality of focal planes of the sample, wherein an image frame of the plurality of image frames is associated with a corresponding focal plane of the plurality of focal planes, and generating a 3D image of the sample from the plurality of image frames and corresponding focal plane information.

In some embodiments, the set of instructions that is executable by the one or more processors of the apparatus may cause the apparatus to further perform forming a first focal plane of the plurality of focal planes coinciding with a top surface of the sample, and forming a second focal plane of the plurality of focal planes at a predetermined distance below the first focal plane.

In yet another aspect of the present disclosure, a method of determining a vibration of a charged-particle beam apparatus is disclosed. The method may comprise detecting a first vibration of an electro-optic component configured to direct the charged-particle beam towards the sample, and detecting a second vibration of an electro-mechanical component configured to hold the sample, and applying, to the electro-optic component, a vibration compensation signal to compensate the first and the second vibration based on the determined vibration of the charged-particle beam apparatus. The method may further comprise adjusting a position of the sample with reference to one or more axes, wherein adjusting the position of the sample causes vibration of the electro-optic component and the electro-mechanical component. Detecting the first vibration may comprise detecting a vibration of the electro-optic component about one or more axes by use of a first sensor, and wherein the first sensor comprises an acceleration sensor mechanically coupled with the electro-optic component.

The acceleration sensor may comprise a piezoelectric sensor, a capacitive accelerometer, a micro electromechanical systems (MEMS) based accelerometer, or a piezoresistive accelerometer, and wherein the first sensor is configured to generate a voltage signal based on a frequency of the detected first vibration. Detecting the second vibration may comprise detecting a vibration of the electro-mechanical component in translational and rotational axes by use of a second sensor, wherein the second sensor comprises a plurality of position sensors configured to generate a displacement signal based on a frequency of the detected second vibration. A first position sensor of the plurality of position sensors may be configured to detect vibration of the electro-mechanical component in translational axes, and wherein a second position sensor of the plurality of position sensors may be configured to detect vibration of the electro-mechanical component in rotational axes. The method may further comprise receiving, by a first controller, the voltage signal and the displacement signal; and determining, using the first controller, the vibration compensation signal based on the received voltage signal and the displacement signal. Determining the vibration compensation signal may comprise identifying a plurality of vibration modes based on the information associated with the first and the second vibration; estimating the vibration of the electro-optic component and the electro-mechanical component based on the identified plurality of vibration modes; determining the vibration in a plurality of axes based on the estimated vibration of the electro-optic component and the electro-mechanical component; and determining the vibration compensation signal based on the determined vibration in the plurality of axes. The vibration compensation signal may be determined to compensate the vibration based on an estimation of a predicted vibration for a future time with reference to a measurement time of the first and the second vibration.

Identifying the plurality of vibration modes may comprise converting the voltage signal to a corresponding distance signal. Identifying the plurality of vibration modes may further comprise decoupling the second vibration of the electro-mechanical component and a vibration of a housing of the electro-mechanical component. Estimating the vibration of the electro-optic component and the electro-mechanical component may comprise using a simulation model, wherein the simulation model may comprise a three-dimensional finite element analysis model (3D-FEM), a finite difference analysis model (FDM), or a mathematical analysis model. The method may further comprise receiving the determined vibration compensation signal by a second controller. The method may further comprise receiving, by the second controller, a beam scan signal; and generating, by the second controller, a modified beam scan signal based on the received beam scan signal and the received vibration compensation signal. The method may further comprise generating a beam deflection signal, by a signal detector, based on the modified beam scan signal, wherein the beam deflection signal is applied to the electro-optic component, and is used to adjust a characteristic of the charged-particle beam incident on the sample. The beam deflection signal may be applied to a beam deflection controller associated with the electro-optic component wherein the characteristic of the charged-particle beam comprises a beam scan speed, a beam scan frequency, a beam scan duration, or a beam scan range. The plurality of position sensors may be disposed on a surface of the housing of the electro-mechanical component, and wherein the electro-optic component may comprise a charged-particle column, and wherein the electro-mechanical component comprises a stage configured to hold the sample and is movable in one or more of X-, Y-, or Z-axes.

In yet another aspect of this present disclosure, a charged-particle beam system is disclosed. The charged-particle beam system may comprise a first sensor configured to detect a first vibration of an electro-optic component of the charged-particle beam system; a second sensor configured to detect a second vibration of an electro-mechanical component of the charged-particle beam system; and a first controller including circuitry to generate a vibration compensation signal based on the detected first and the second vibration applied to the electro-optic component. The electro-optic component may comprise a charged-particle column and is configured to direct a charged-particle beam towards a sample. The electro-mechanical component may comprise a stage configured to hold the sample and is movable in one or more of X-, Y-, or Z-axes. An adjustment of a position of the sample may cause vibration of the electro-optic component and the electro-mechanical component.

The system may further comprise a housing configured to house the electro-mechanical component of the charged-particle beam apparatus. The electro-mechanical component may be mechanically coupled with the housing such that moving the stage causes a vibration of the housing. The electro-optic component may be mechanically coupled with the housing such that the vibration of the housing causes the first vibration of the electro-optic component. The first sensor may be further configured to detect the first vibration of the electro-optic component about one or more axes. The first sensor comprises an acceleration sensor mechanically coupled with the electro-optic component. The acceleration sensor may comprise a piezoelectric sensor, a capacitive accelerometer, a micro electromechanical systems (MEMS) based accelerometer, or a piezoresistive accelerometer. The first sensor may be configured to generate a voltage signal based on a frequency of the detected first vibration. The second sensor may be configured to detect the second vibration of the electro-mechanical component in translational and rotational axes. The second sensor may comprise a plurality of position sensors configured to generate a displacement signal based on a frequency of the detected second vibration. A first position sensor of the plurality of position sensors may be configured to detect vibration of the electro-mechanical component in translational axes, and wherein a second position sensor of the plurality of position sensors may be configured to detect vibration of the electro-mechanical component in rotational axes, and wherein the first and the second position sensors may be disposed on a surface of the housing of the electro-mechanical component. The first controller may be further configured to receive the voltage signal and the displacement signal; and determine the vibration compensation signal based on the voltage signal and the displacement signal, and wherein the first controller includes circuitry to identify a plurality of vibration modes based on information associated with the first and the second vibration; estimate the vibration of the electro-optic component and the electro-mechanical component based on the identified plurality of vibration modes; determine the vibration in a plurality of axes based on the estimated vibration of the electro-optic component and the electro-mechanical component; and determine the vibration compensation signal based on the determined vibration in the plurality of axes.

Identification of the plurality of vibration modes may comprise conversion of the voltage signal to a corresponding distance signal. Identification of the plurality of vibration modes may further comprise decoupling of the second vibration of the electro-mechanical component and a vibration of the housing of the electro-mechanical component. Estimation of the vibration of the electro-optic component and the electro-mechanical component may comprise use of a simulation model, wherein the simulation model may comprise a three-dimensional finite element analysis model (3D-FEM), a finite difference analysis model (FDM), or a mathematical analysis model. The system may further include a second controller including circuitry to receive the determined vibration compensation signal. The second controller may include circuitry to receive a beam scan signal; and generate a modified beam scan signal based on the received beam scan signal and the vibration compensation signal. The system may further comprise a signal generator configured to generate a beam deflection signal based on the modified beam scan signal. The beam deflection signal may be applied to the electro-optic component, and may be configured to adjust a characteristic of the charged-particle beam incident on the sample. The beam deflection signal may be applied to a beam deflection controller associated with the electro-optic component. The characteristic of the charged-particle beam may comprise a beam scan speed, a beam scan frequency, a beam scan duration, or a beam scan range. The vibration compensation signal may be determined to compensate the vibration based on an estimation of a predicted vibration for a future time with reference to a measurement time of the first and the second vibration.

In yet another aspect of the present disclosure, a non-transitory computer readable medium comprising a set of instructions that is executable by one or more processors of an apparatus to cause the apparatus to perform a method of determining a vibration of a charged-particle beam apparatus is disclosed. The method may comprise detecting a first vibration of an electro-optic component configured to direct the charged-particle beam towards the sample, and detecting a second vibration of an electro-mechanical component configured to hold the sample, and applying, to the electro-optic component, a vibration compensation signal to compensate the first and the second vibration based on the determined vibration of the charged-particle beam apparatus.

The set of instructions that is executable by the one or more processors of the apparatus may cause the apparatus to further perform adjusting a position of the sample with reference to one or more axes, wherein adjusting the position of the sample causes vibration of the electro-optic component and the electro-mechanical component. The set of instructions that is executable by the one or more processors of the apparatus may cause the apparatus to further perform determining a vibration compensation signal based on the voltage signal and the displacement signal. The determining of vibration compensation signal may comprise identifying a plurality of vibration modes based on the information associated with the first and the second vibration; estimating the vibration of the electro-optic component and the electro-mechanical component based on the identified plurality of vibration modes; determining the vibration in a plurality of axes based on the estimated vibration of the electro-optic component and the electro-mechanical component; and determining the vibration compensation signal based on the determined vibration in the plurality of axes. The set of instructions that is executable by the one or more processors of the apparatus may cause the apparatus to further perform receiving, by a controller, a beam scan signal; generating a modified beam scan signal based on the received beam scan signal and the vibration compensation signal; generating a beam deflection signal, by a signal generator, based on the modified beam scan signal, wherein the beam deflection signal is applied to the electro-optic component and is configured to adjust a characteristic of the charged-particle beam incident on the sample; and applying the beam deflection signal to a beam deflection controller associated with the electro-optic component.

BRIEF DESCRIPTION OF THE DRAWINGS

FIG. 9B is a flow chart showing an exemplary method of focusing a charged-particle beam on a sample, consistent with embodiments of the present disclosure.

FIGS. 11A-11F illustrate image frames and corresponding focal planes of a feature on the sample, consistent with embodiments of the present disclosure.

DETAILED DESCRIPTION

Figure 1:
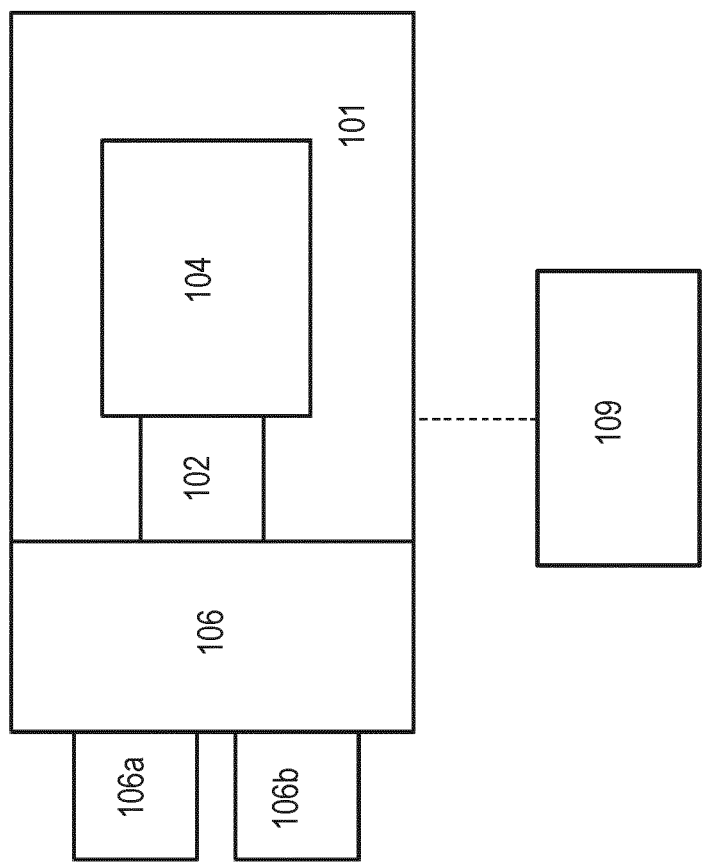
FIG. 1 is a schematic diagram illustrating an exemplary electron beam inspection (EBI) system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of apparatuses and methods consistent with aspects related to the subject matter recited in the appended claims. For example, although some embodiments are described in the context of utilizing electron beams, the disclosure is not so limited. Other types of charged particle beams may be similarly applied. Furthermore, other imaging systems may be used, such as optical imaging, photo detection, x-ray detection, etc.

The enhanced computing power of electronic devices, while reducing the physical size of the devices, can be accomplished by significantly increasing the packing density of circuit components such as, transistors, capacitors, diodes, etc. on an IC chip. For example, in a smart phone, an IC chip (which is the size of a thumbnail) may include over 2 billion transistors, the size of each transistor being less than 1/1000th of a human hair. Not surprisingly, semiconductor IC manufacturing is a complex process, with hundreds of individual steps. Errors in even one step have the potential to dramatically affect the functioning of the final product. Even one "killer defect" can cause device failure. The goal of the manufacturing process is to improve the overall yield of the process. For example, for a 50-step process to get 75% yield, each individual step must have a yield greater than 99.4%, and if the individual step yield is 95%, the overall process yield drops to 7%.

As the geometries shrink and the IC chip industry migrates to three-dimensional (3D) architectures (such as, NAND gate, Fin field-effect transistor (FinFETs), and advanced dynamic random-access memory (DRAM)), finding defects is becoming more challenging and expensive at each lower node. While high process yield is desirable in an IC chip manufacturing facility, it is also essential to maintain a high wafer throughput, defined as the number of wafers processed per hour. High process yields, and high wafer throughput can be impacted by the presence of defects, especially when defects affect the overall performance of the device and the process yield. Thus, detection and identification of micro and nano-sized defects, while maintaining high throughput is essential for high yields and low cost. In addition to detecting and identifying defects, a SEM inspection tool can also be used to identify the source of a defect by providing high-resolution images in combination with elemental analysis of the microscopic structures on the wafer.

Whether identifying defects or imaging for routine in-line inspection through high-resolution SEM imaging, it should be appreciated that precise stage motion control is critical, particularly if the dimensions of the inspection features or the defects are in tens of nanometers or less. In a high throughput, high resolution inspection environment, there may be various factors that can cause measurement errors and can impact the imaging and defect detection capabilities of the inspection tool, such as, instrument maintenance, sensor calibration, specimen tilt, manufacturing tolerances, machining errors, etc. In practice, manufacturing of very large scale integrated (VLSI) circuits requires precise overlay of the various layers within a specified tolerance limit and hence the alignment and precise positioning of a sample stage is extremely critical. In some cases, the overall overlay tolerance needed to produce a modern integrated circuit may be less than 40 nm. For example, aligning a 200 mm wafer to such tolerances may be equivalent of bringing a 50 km iceberg to dock with an accuracy of 1 cm.

In some cases, a stage can be moved in six different axes of motion, three translation and three rotation axes, introducing the possibility of motion errors in each of the six axes. Pitch effects in the X and Y axis, caused by linear movement of the stage, may generate Abbé error, resulting from an offset between the plane of the measurement axis and the axis of motion of the stage. Additionally, the existing global and local Z-leveling techniques of the stage may not be sufficient or feasible, partly because of the shrinking geometries, but also because of the impact on overall inspection throughput. Some embodiments of the proposed high precision three-dimension stage control system in this disclosure may significantly improve stage positioning and motion control accuracy by using high control bandwidth signals and independently controllable piezoelectric actuators for Z-leveling.

One of the several ways to focus a charged-particle beam (e.g. an electron beam), and thus improve imaging resolution, is by using opto-mechanical means such as adjusting the height of the stage via piezoelectric transducers. However, focusing capabilities using opto-mechanical techniques may be inadequate for some applications in nano-fabrication and inspection of devices made therefrom, for example, due to the limitations in precise motion control and associated errors, or due to the need to move the stage sufficiently fast to enable real time 3D imaging or to achieve a target throughput. Examples of sources of error include, but are not limited to, vibrations, temperature gradients, miscalibrations, etc. Therefore, it may be desirable to enhance the existing focusing capabilities by enabling the system to further fine-tune the focus of the electron beam while addressing such issues.

As the density of devices on an IC chip increases, device architectures include vertically stacked components and multiple layers for advanced features. Inspection of such devices may require a larger depth of focus so that a top surface, a bottom surface, and the intermediate layers of a feature may be imaged simultaneously while extracting useful information. For example, measuring critical dimensions of a metal contact hole or detecting a buried defect particle may be useful to analyze defects, and develop process conditions based on information obtained from accurate imaging and measurements, among other things. Using existing techniques to inspect stacked structures such as 3D NAND flash devices, for example, may provide either limited or inaccurate information, both of which may negatively impact the throughput and the quality of devices produced. Therefore, it may be desirable to enable the existing inspection tools with real-time 3D imaging capabilities, thus improving imaging range while maintaining high imaging resolution, such as by adjusting a voltage associated with a stage or lens to cause a change in an electro-magnetic field, which subsequently causes a change in a depth of focus of a charged particle beam.

High-throughput wafer inspection in single-beam and multi-beam inspection systems may be facilitated by the ability to move the sample very short distances, e.g., on the order of several nanometers, with high precision and high speed. In some applications, vibrations associated with the movement of the stage or the SEM column may limit the image resolution or inspection throughput, among other things. Although existing systems may employ vibration compensation methods to compensate for vibration-induced errors, such compensation methods may not be sufficiently accurate, such as due to inadequate detection of vibrations, inaccurate compensation, measurement delays, inability to accurately correct for vibrations real-time, etc.

In conventional charged-particle beam inspection systems, position sensing systems are used for determining the vibration of the stage or positioning the sample along an axis. The position sensors are placed on a wall of a chamber that is mechanically coupled with the stage such that vibrations of the stage may be transferred to the chamber. While the position sensors may accurately determine the vibrations of the stage with reference to the chamber, vibrations of the chamber, the position sensors, or the beam column associated with the chamber may be undetected or detected with insufficient accuracy, or the sources of vibration may be indistinguishable. In addition, the position sensors used may not detect the vibration modes in some translational or rotational axes, resulting in under-compensated or over-compensated vibration compensation signals. Therefore, it may be desirable to accurately detect, identify, isolate and compensate vibration-induced errors to minimize the loss of imaging resolution. For example, it may be desirable to detect a vibration and isolate a component of the vibration in the z-dimension. The detected z-vibration component can be analyzed and a z-vibration at a time in the future relative to when the vibration was sensed can be predicted. A voltage associated with a stage or lens can be adjusted to cause a change in an electro-magnetic field, which in turn causes a change in a depth of focus of a charged particle beam to compensate for the predicted vibration at the time that the vibration is predicted, resulting in an improved accuracy image.

Figure 2:
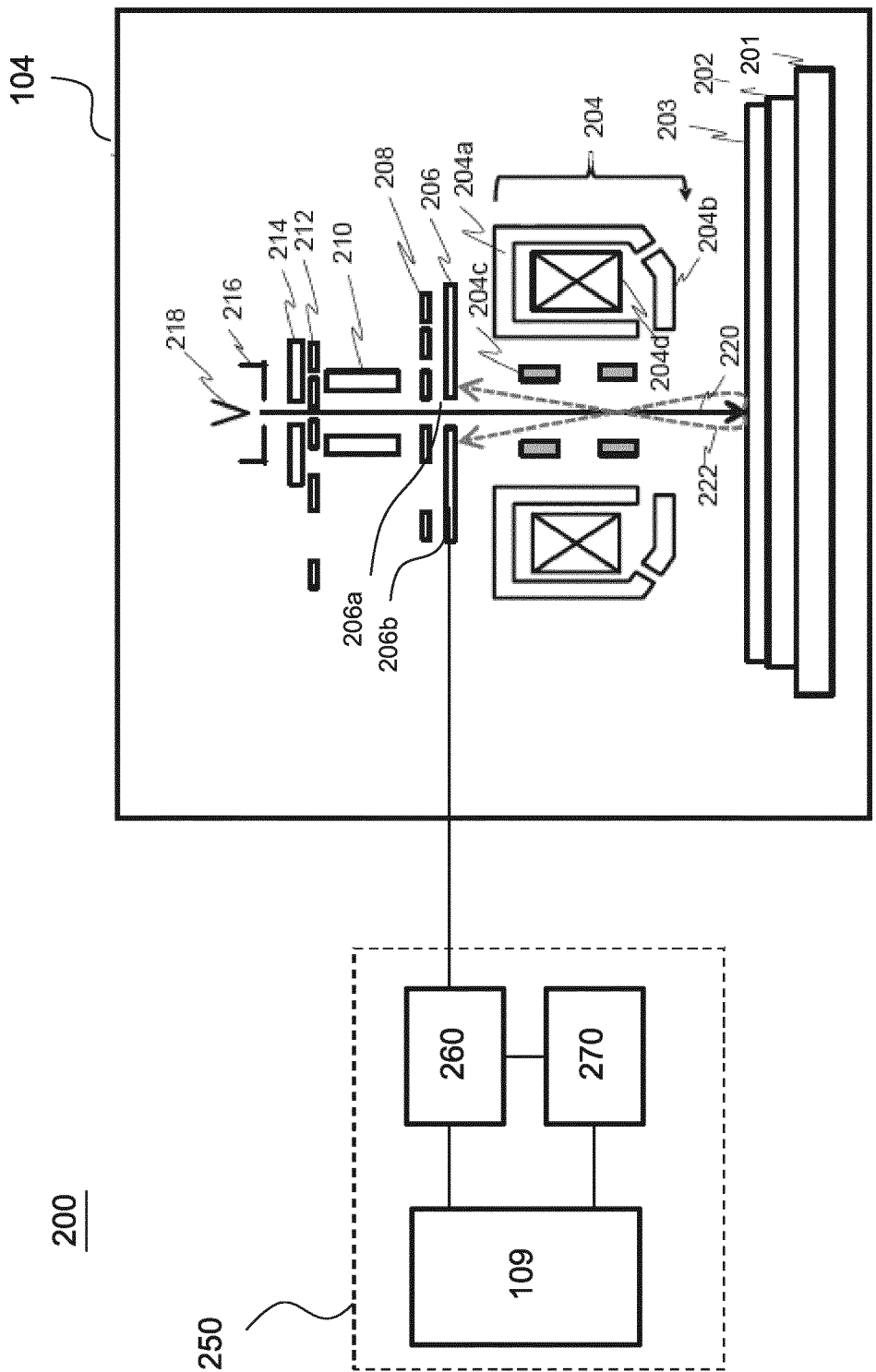
FIG. 2 is a schematic diagram illustrating an exemplary imaging system, consistent with embodiments of the present disclosure.

In one aspect of the present disclosure, a charged-particle beam system may be used to observe a wafer (such as wafer 203 of FIG. 2) disposed on a specimen stage (such as stage 201 of FIG. 2). A position sensing system (including height sensor 340 and laser interferometer 350 of FIG. 3) may determine a lateral and a vertical displacement of the stage. In response to determining the lateral displacement, a beam control module (such as beam control module 365 of FIG. 3) may apply a first high control-bandwidth signal to beam deflector (such as deflector array 320 of FIG. 3) to deflect a primary charged-particle beam incident on the wafer along a plane substantially perpendicular to the charged-particle beam. And in response to determining the vertical displacement, the beam control module may apply a second high control-bandwidth signal to the stage to adjust a focus of the deflected charged-particle beam along a plane substantially parallel to the charged-particle beam. The charged-particle beam system may further comprise a stage control module (such as stage control module 362 of FIG. 3) to apply a third signal to stage motion controller (including z-axis motion controllers 372_1, 372_2, and 372_3 of FIG. 3). Each of the z-axis motion controllers may be independently controlled to adjust a Z-leveling of the stage, such that the stage is substantially perpendicular to an optical axis of primary charged-particle beam 314.

In another aspect of the present disclosure, a method of focusing a charged-particle beam on a sample is disclosed. The method may include adjusting the location of a first focal point of the charged-particle beam with reference to the sample, using a first component located upstream of a focusing component of the objective lens of the charged-particle system (e.g., an anode of a charged-particle source). The location of the first focal point may also be adjusted by adjusting a position of the stage in Z-axis. The method may further include adjusting the first focal point to form a second focal point by adjusting the electromagnetic field of or associated with the sample. The electromagnetic field may be adjusted using a second component located downstream of the focusing component of the objective lens of the charged-particle system (e.g., a control electrode of the objective lens, the stage, or the wafer). Adjusting the second component may include applying a first component of the electrical signal to the control electrode of the objective lens to coarse-focus the first focal point and a second component of the electrical signal to the stage to fine-focus the first focal point.

In another aspect of the present disclosure, a method of focusing a charged-particle beam on a sample is disclosed. The method includes determining the vibration of a charged-particle beam system and applying a vibration compensation signal to a beam column to compensate the determined vibrations of the charged-particle beam system. The method may further include detecting a vibration of the beam column (electro-optic component) using an acceleration sensor mounted on the beam column, and detecting a vibration of the stage (electro-mechanical component) using a position sensor mounted on a housing chamber of the charged-particle beam system. The method may further include identifying vibration modes of the beam column and the stage in each of the translational and rotational axes, estimating the vibration of the beam column and the stage based on the identified vibration modes, and predicting the vibration of the beam column and the stage based on the estimated vibrations. The method may further include generating a compensated beam scan signal based on the predicted vibration and a beam scan signal, and forming a vibration compensation signal to be applied to the beam column of the charged-particle system.

In accordance with embodiments of the present disclosure, X, Y, and Z axes are Cartesian coordinates. A primary optical axis of charged-particle beam apparatus is along the Z-axis and the primary charged-particle beam from a charged-particle source travels along the Z-axis.

Relative dimensions of components in drawings may be exaggerated for clarity. Within the following description of drawings, the same or like reference numbers refer to the same or like components or entities, and only the differences with respect to the individual embodiments are described.

As used herein, unless specifically stated otherwise, the term "or" encompasses all possible combinations, except where infeasible. For example, if it is stated that a database may include A or B, then, unless specifically stated otherwise or infeasible, the database may include A, or B, or A and B. As a second example, if it is stated that a database may include A, B, or C, then, unless specifically stated otherwise or infeasible, the database may include A, or B, or C, or A and B, or A and C, or B and C, or A and B and C.

Reference is now made to FIG. 1, which illustrates an exemplary electron beam inspection (EBI) system 100 consistent with embodiments of the present disclosure. EBI system 100 may be used for imaging. As shown in FIG. 1, EBI system 100 includes a main chamber 101 a load/lock chamber 102, an electron beam tool 104, and an equipment front end module (EFEM) 106. Electron beam tool 104 is located within main chamber 101. EFEM 106 includes a first loading port 106a and a second loading port 106b. EFEM 106 may include additional loading port(s). First loading port 106a and second loading port 106b receive wafer front opening unified pods (FOUPs) that contain wafers (e.g., semiconductor wafers or wafers made of other material(s)) or samples to be inspected (wafers and samples may be used interchangeably). A lot containing a plurality of wafers may be loaded for processing as a batch.

One or more robotic arms (not shown) in EFEM 106 may transport the wafers to load/lock chamber 102. Load/lock chamber 102 is connected to a load/lock vacuum pump system (not shown) which removes gas molecules in load/lock chamber 102 to reach a first pressure below the atmospheric pressure. After reaching the first pressure, one or more robotic arms (not shown) may transport the wafer from load/lock chamber 102 to main chamber 101. Main chamber 101 is connected to a main chamber vacuum pump system (not shown) which removes gas molecules in main chamber 101 to reach a second pressure below the first pressure. After reaching the second pressure, the wafer is subject to inspection by electron beam tool 104. Electron beam tool 104 may be a single-beam system or a multi-beam system.

A controller 109 is electronically connected to electron beam tool 104. Controller 109 may be a computer configured to execute various controls of EBI system 100. While controller 109 is shown in FIG. 1 as being outside of the structure that includes main chamber 101, load/lock chamber 102, and EFEM 106, it is appreciated that controller 109 may be a part of the structure.

FIG. 2 illustrates an exemplary imaging system 200 according to embodiments of the present disclosure. Electron beam tool 104 of FIG. 2 may be configured for use in EBI system 100. Electron beam tool 104 may be a single beam apparatus or a multi-beam apparatus. As shown in FIG. 2, electron beam tool 104 may include a motorized sample stage 201, and a wafer holder 202 supported by motorized stage 201 to hold wafer 203 to be inspected. Electron beam tool 104 further includes an objective lens assembly 204, an electron detector 206 (which includes electron sensor surfaces 206a and 206b), an objective aperture 208, a condenser lens 210, a beam limit aperture 212, a gun aperture 214, an anode 216, and a cathode 218. Objective lens assembly 204, in some embodiments, may include a modified swing objective retarding immersion lens (SORIL), which includes a pole piece 204a, a control electrode 204b, a deflector 204c, and an exciting coil 204d. Electron beam tool 104 may additionally include an energy dispersive X-ray spectrometer (EDS) detector (not shown) to characterize the materials on wafer 203.

A primary charged-particle beam 220, for example, an electron beam may be emitted from cathode 218 by applying a voltage between anode 216 and cathode 218. Primary electron beam 220 passes through gun aperture 214 and beam limit aperture 212, both of which may determine the size of electron beam entering condenser lens 210, which resides below beam limit aperture 212. Condenser lens 210 focuses primary charged-particle beam 220 before the beam enters objective aperture 208 to set the size of the primary electron beam before entering objective lens assembly 204. Deflector 204c deflects primary electron beam 220 to facilitate beam scanning on wafer 203. For example, in a scanning process, deflector 204c may be controlled to deflect primary electron beam 220 sequentially onto different locations of top surface of wafer 203 at different time points, to provide data for image reconstruction for different parts of wafer 203. Moreover, deflector 204c may also be controlled to deflect primary electron beam 220 onto different sides of wafer 203 at a particular location, at different time points, to provide data for stereo image reconstruction of the wafer structure at that location. Further, in some embodiments, anode 216 and cathode 218 may be configured to generate multiple primary electron beams 220, and electron beam tool 104 may include a plurality of deflectors 204c to project the multiple primary electron beams 220 to different parts/sides of the wafer at the same time, to provide data for image reconstruction for different parts of wafer 203.

Exciting coil 204d and pole piece 204a generate a magnetic field that begins at one end of pole piece 204a and terminates at the other end of pole piece 204a. A part of wafer 203 being scanned by primary electron beam 220 may be immersed in the magnetic field and may be electrically charged, which, in turn, creates an electric field. The electric field reduces the energy of impinging primary electron beam 220 near the surface of wafer 203 before it collides with wafer 203. Control electrode 204b, being electrically isolated from pole piece 204a, controls an electric field on wafer 203 to prevent micro-arching of wafer 203 and to ensure proper beam focus.

A secondary electron beam 222 may be emitted from the part of wafer 203 upon receiving primary electron beam 220. Secondary electron beam 222 may form a beam spot on sensor surfaces 206a and 206b of electron detector 206. Electron detector 206 may generate a signal (e.g., a voltage, a current, etc.) that represents an intensity of the beam spot, and provide the signal to an image processing system 250. The intensity of secondary electron beam 222, and the resultant beam spot, may vary according to the external or internal structure of wafer 203. Moreover, as discussed above, primary electron beam 220 may be projected onto different locations of the top surface of the wafer or different sides of the wafer at a particular location, to generate secondary electron beams 222 (and the resultant beam spot) of different intensities. Therefore, by mapping the intensities of the beam spots with the locations of wafer 203, the processing system may reconstruct an image that reflects the internal or external structures of wafer 203.

Imaging system 200 may be used for inspecting a wafer 203 on stage 201, and comprises an electron beam tool 104, as discussed above. Imaging system 200 may also comprise an image processing system 250 that includes an image acquirer 260, a storage 270, and controller 109. Image acquirer 260 may comprise one or more processors. For example, image acquirer 260 may comprise a computer, server, mainframe host, terminals, personal computer, any kind of mobile computing devices, and the like, or a combination thereof. Image acquirer 260 may connect with a detector 206 of electron beam tool 104 through a medium such as an electrical conductor, optical fiber cable, portable storage media, IR, Bluetooth, internet, wireless network, wireless radio, or a combination thereof. Image acquirer 260 may receive a signal from detector 206 and may construct an image. Image acquirer 260 may thus acquire images of wafer 203. Image acquirer 260 may also perform various post-processing functions, such as generating contours, superimposing indicators on an acquired image, and the like. Image acquirer 260 may be configured to perform adjustments of brightness and contrast, etc. of acquired images. Storage 270 may be a storage medium such as a hard disk, random access memory (RAM), other types of computer readable memory, and the like. Storage 270 may be coupled with image acquirer 260 and may be used for saving scanned raw image data as original images, and post-processed images. Image acquirer 260 and storage 270 may be connected to controller 109. In some embodiments, image acquirer 260, storage 270, and controller 109 may be integrated together as one control unit.

In some embodiments, image acquirer 260 may acquire one or more images of a sample based on an imaging signal received from detector 206. An imaging signal may correspond to a scanning operation for conducting charged particle imaging. An acquired image may be a single image comprising a plurality of imaging areas. The single image may be stored in storage 270. The single image may be an original image that may be divided into a plurality of regions. Each of the regions may comprise one imaging area containing a feature of wafer 203.

Figure 3:
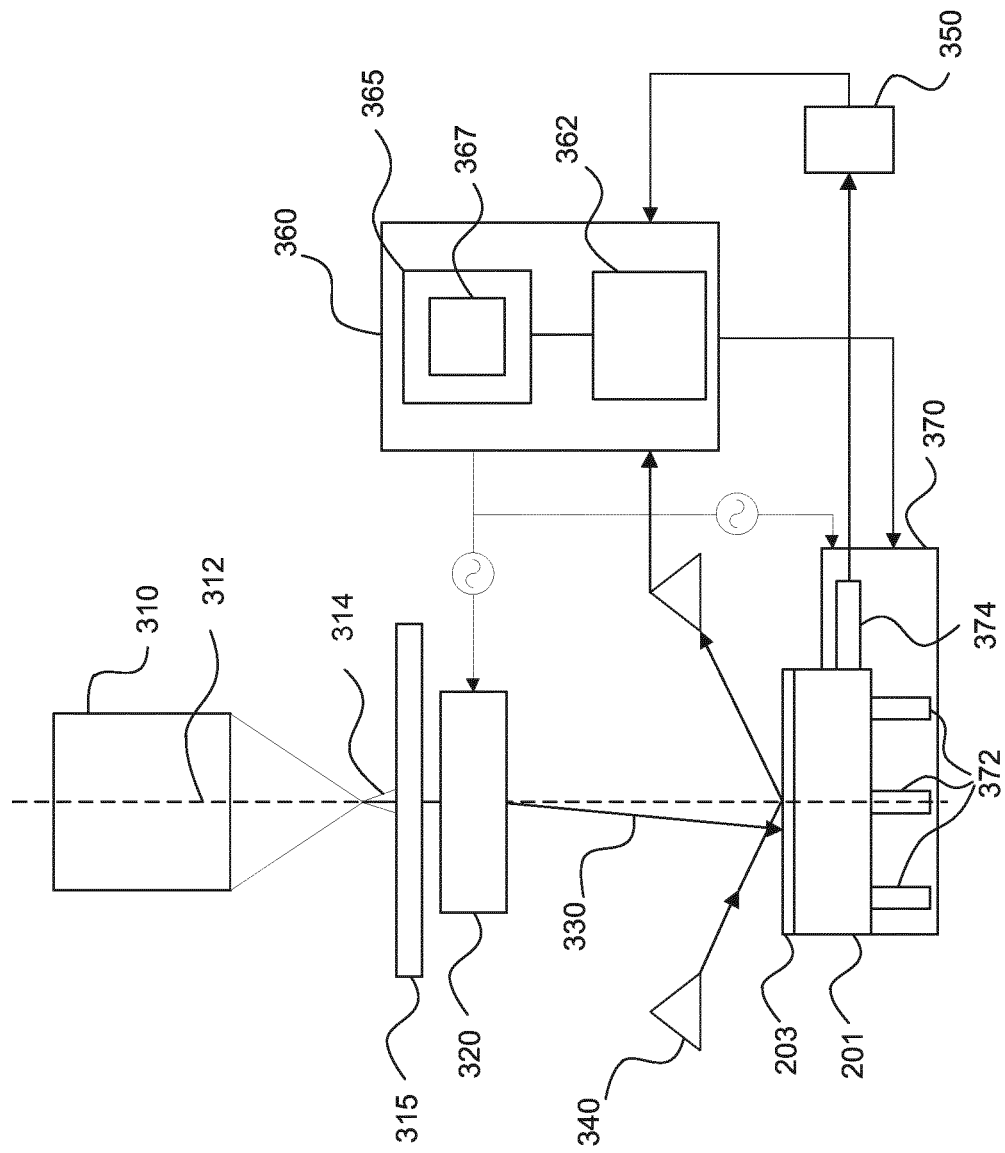
FIG. 3 is a schematic illustration of an exemplary charged-particle beam system, consistent with embodiments of the present disclosure.

Reference is now made to FIG. 3, which is an exemplary charged-particle beam system, consistent with embodiments of the present disclosure. In some embodiments, charged-particle beam system 300 comprises a charged-particle beam column 310, a primary charged-particle beam 314 having an optical axis 312, a condenser lens 315 (analogous to condenser lens 210 of FIG. 2), a deflector array 320 causing primary charged-particle beam 314 to deflect and form a deflected charged-particle beam 330 irradiating on wafer 203 disposed on stage 201, a height sensor 340, a laser interferometer 350, a system control module 360 comprising a stage control module 362 and a beam control module 365, a beam deflection controller 367, a stage motion controller 370 comprising z-axis motion controllers 372, and an X-Y axes motion controller 374. Alternatively, charged-particle beam system 300 may be a part of imaging system 200 of FIG. 2 or EBI system 100 of FIG. 1. It is to be appreciated that in the context of this disclosure a charged-particle and an electron may be interchangeably used. Similarly, elements of the claimed apparatus or methods describing the charged-particle beam(s) may be interchangeably used with an electron beam(s), as appropriate.

In some embodiments, charged-particle beam system 300 may comprise an electron beam system or an electron beam inspection system. Charged-particle beam system 300 may include charged-particle beam column 310, which may house cathode 218, anode 216, gun aperture 214, beam limit aperture 212, as shown in FIG. 2. Primary charged-particle beam 314 may be emitted from cathode 218 by applying a voltage between anode 216 and cathode 218. In some embodiments, primary charged-particle beam 314 may be an electron beam passing through gun aperture 214 and beam limit aperture 212, both of which may determine the size of charged-particle beam entering condenser lens 210 (analogous to condenser lens 315 of FIG. 3), which resides below beam limit aperture 212. Deflector array 320 may deflect primary charged-particle beam 314 to facilitate beam scanning on wafer 203.

Deflector array 320 may comprise a single deflector, multiple deflectors, or an array of deflectors to deflect primary charged-particle beam 314 off optical axis 312. Beam deflection may be configured to scan primary charged-particle beam 314 across wafer 203 during irradiation or inspection. As primary charged-particle beam 314 is deflected off optical axis 312, additional aberration may be introduced, resulting in pattern distortion. Deflecting primary charged-particle beam 314 may be done either electrostatically or magnetically. The magnetic deflector allows for a longer range of deflection than the electrostatic deflector, but its frequency response may be limited due to the inductance of the magnetic coils and the eddy current introduced by the magnetic field.

In some embodiments, charged-particle beam system 300 may include a source conversion unit (not shown in FIG. 3). The source conversion unit may comprise an image-forming element array (not shown in FIG. 3), an aberration compensator array, and a beam-limit aperture array (such as, including beam limit aperture 212 of FIG. 2). The image-forming element array may comprise a plurality of micro-deflectors or micro-lenses to form a plurality of parallel images (virtual or real) of a plurality of beamlets of primary electron beam 314. Beam-limit aperture array may limit the plurality of beamlets. It should be appreciated that the source conversion unit 120 may be configured to handle any number of beamlets.

Condenser lens 315 may be configured to focus primary charged-particle beam 314. In some embodiments, condenser lens 315 may further be configured to adjust electric currents of primary beamlets of primary charged-particle beam 314 downstream of the source conversion unit by varying the focusing power of condenser lens 315. Alternatively, the electric currents may be changed by altering the radial sizes of beam-limit aperture 212 within the beam-limit aperture array corresponding to the individual primary beamlets.

In some embodiments, charged-particle beam system 300 may include a primary projection optical system (not shown in FIG. 3). The primary projection optical system may comprise an objective lens assembly 204, a beam separator and deflection scanning unit (such as, deflector array 320 shown in FIG. 3). The beam separator may, for example, be a Wien filter comprising an electrostatic deflector generating an electrostatic dipole field E1 and a magnetic dipole field B1 (both of which are not shown in FIG. 3). In operation, beam separator may be configured to exert an electrostatic force by electrostatic dipole field E1 on individual charged-particles of primary charged-particle beam 314. The electrostatic force is equal in magnitude but opposite in direction to the magnetic force exerted by magnetic dipole field B1 of beam separator on the individual electrons. Primary charged-particle beam 314 may therefore pass at least substantially straight through beam separator with at least substantially zero deflection angles. In some embodiments, deflection scanning unit, in operation, is configured to deflect primary charged-particle beam 314, causing deflected charged-particle beam 330 to scan probe spots across individual scanning areas on wafer 203.

In practice, wafer 203 may be observed at a high magnification in charged-particle beam system 300 or EBI system 100, and stage 201 may stably supports wafer 203 and moves smoothly along horizontal X-Y axes, vertical Z-axis, stage tilt, or stage rotation. While the movements in X and Y axis may be used for selection of a field of view (FOV), the movement in Z-axis may be required for change of image resolution, depth of focus, etc. Stage 201 may, for example, be a eucentric stage. In a eucentric stage, the observation area and the focus on the surface of the wafer do not shift while tilting wafer 203.

In some embodiments, a position sensing system (not shown in FIG. 3) may be used to determine displacement of stage 201. Position sensing system may comprise height sensor 340 and laser interferometer 350. It is to be appreciated that the position sensing system may comprise more than one height sensor 340 and more than one laser interferometer 350, and other suitable components as well, for example, signal amplifiers, band-pass filters, data storage units, data processing units, etc.

In some embodiments, height sensor 340 may be used for determining longitudinal displacement of stage 201. Vertical displacement of stage 201, as referred to herein, may correspond to the difference between a target location and an actual location of stage 201 in the Z-axis. Optical height sensors, such as, height sensor 340 shown in FIG. 3, may comprise a laser diode-sensor assembly including a one-dimensional Position Sensitive Detector (1-D PSD), or a linear array of photodiodes, etc. Height sensor 340 may communicate with system control module 360 (described later in detail) such that an output of height sensor 340 is analyzed and used to further adjust the stage position. In some embodiments, the output data from height sensor 340 may be used to modify beam focus by applying a voltage to the stage to create a tunable electric field on the surface of the sample, or by adjusting the current applied to objective lens assembly 204, or by applying a voltage to the stage and the objective lens assembly 204. It is appreciated that other suitable means of focusing the incident beam may be employed. One or more optical height sensors, such as, height sensor 340 may be employed based on the complexity and the accuracy of height sensing desired. Other height sensing techniques may be used, as appropriate.

In some embodiments, vertical displacement of stage 201 may be routinely determined for equipment calibration, based on height measurement or height sensing of standard specimens. For example, wafer 203 comprising standard patterned features, such as, metal lines, photoresist layers, reflective films deposited on wafer 203, etc. may be used to calibrate equipment, sensors, motors, or stage.

High throughput inspection of wafers in a production facility, such as, a wafer fab, may require stage 201 to move quickly and accurately in repetitive patterns of stop-and-go motion. The stop-and-go motion may include multiple cycles of high acceleration, deceleration, and settling of stage 201 to travel distances in the order of several microns or nanometers. Moving stage 201 with high speeds and high acceleration may generate vibration due to system dynamics, which in turn may cause dynamic resonance within the system, for example, vibrational waves constructively interfering to cause a higher amplitude vibration throughout charged-particle beam system 300. The vibrations caused by moving stage 201 may result in translation error or displacement error in more than one axes. For example, while inspecting a die on wafer 203, stage 201 moving in X-Y axes, may cause dynamic resonance with other moving or non-moving components to cause stage vibration in Z-axis.

Accurate positioning of stage 201 may require accurate position measurement techniques, such as, for example, optical height sensors using lasers.

In some embodiments, laser interferometer 350 may be used to measure translation displacement in X-Y axes and for precise positioning of stage 201 in X-Y axes. Laser interferometer displacement measuring technique is often used as a high accuracy displacement measurement means for controlling movement of equipment such as, a stepper, employed in the photolithography process for fabricating semiconductor devices, and for controlling X-Y stages.

In some embodiments, laser interferometer 350 may be, for example, a homodyne laser interferometer or a heterodyne laser interferometer. A homodyne laser interferometer uses a single-frequency laser source, whereas a heterodyne laser interferometer uses a laser source with two close frequencies. The laser source may comprise a He—Ne gas laser emitting laser light at a wavelength of 633 nm. Other laser sources with single or multiple wavelength or frequency emissions may be used as well. In some embodiments, more than one laser interferometers may be used. A combination of a homodyne and a heterodyne laser interferometer may be used within a system.

In some embodiments, laser interferometer 350 may be used for determining lateral displacement of stage 201. Lateral displacement, as referred to herein, may correspond to the difference between a target location and an actual location of stage 201 in at least one of the X-Y axes. In practice, more than one laser interferometers (such as laser interferometer 350 shown in FIG. 3) may be employed within a system to determine lateral displacement. Since the deflection of primary charged-particle beam 314 is limited over a small area, precise mechanical stage positioning may need to be combined with beam deflection to pattern large features by exposing multiple deflection fields and piecing them together. This may be accomplished by using two laser interferometers (such as, laser interferometer 350) to measure the stage position in X- and Y-axes. In some embodiments, two split laser beams may be directed to a reference mirror and a mirror attached to the stage in each direction, then the interferometers may compare the position of the stage mirror to that of the reference mirror to detect and correct any stage position errors. For example, one laser interferometer for X-axis, and a second laser interferometer for the Y-axis. In some embodiments, more than one laser interferometers may be used for a single axis, such as, X or Y axis. Other suitable techniques may be employed as well.

Referring to FIG. 3, charged-particle beam system 300 may comprise system control module 360. System control module 360 may include stage control module 362 and beam control module 365. System control module 360 may be configured to communicate with height sensor 340, laser interferometer 350, and stage motion controller 370. System control module 360 may be configured to receive signals from height sensor 340 and process the received signals based on the determined vertical displacement of stage 201. System control module 360 may further be configured to receive signals from laser interferometer 350 and process the received signals based on the determined lateral displacement of stage 201. In some embodiments, system control module 360 may comprise a user-interface (not shown) to receive user input based on the determined lateral and vertical displacement of stage 201. The user-interface may be, for example, a visual touch-screen, a screen with user controls, an audio-visual interface, etc.

In some embodiments, system control module 360 may comprise stage control module 362 and beam control module 365. Stage control module 362 may be, for example, a circuit board including individual circuits for stage positioning and motion control. Also mounted on the circuit board may be other components including sequencer circuits, timer circuits, signal processing circuits, etc.

In some embodiments, stage control module 362 of system control module 360 may comprise a signal processing circuit. The signal processing circuit of stage control module 362 may be configured to receive a signal from height sensor 340 or laser interferometer 350. In some embodiments, stage control module 362 may be configured to receive a signal from laser interferometer 350. The signal processing circuit may determine the degree of vertical displacement of stage 201 or the degree of lateral displacement of stage 201 based on the signal received. The received signal may be, for example, an optical signal, an electrical signal, or a combination thereof.

In some embodiments, system control module 360 may comprise a beam control module 365 including a beam deflection controller 367, also referred to herein as a controller. In some embodiments, beam deflection controller 367 may be configured to apply a first signal to deflect primary charged-particle beam 314 incident on sample (e.g., wafer 203) to at least partly compensate for the lateral displacement of stage 201. Beam deflection controller 367 may be configured to apply a second signal to adjust a focus of deflected charged-particle beam 330 incident on wafer 203 to at least partly compensate for the vertical displacement of the stage.

In some embodiments, beam deflection controller 367 may be configured to dynamically adjust at least one of the first signal and/or the second signal during scanning of primary charged-particle beam 314 on wafer 203. As used herein, dynamically adjusting the signal may refer to continuously and iteratively adjusting the signal while the sample is being scanned or inspected. For example, the position of stage 201 may be constantly monitored, measured, recorded and communicated to a controller such as beam deflection controller 367. Upon receiving updated position information including lateral displacement, vertical displacement, and/or pitch and roll error information, beam deflection controller 367 may adjust the signals to at least partly compensate for the displacement based on the information received. As the wafer scanning continues, the stage position and displacement information may be continuously collected, exchanged, and used by beam deflection controller to adjust the signals.

Beam deflection controller 367 may be, for example, a control loop feedback mechanism including a proportional-integral-derivative (P-I-D) controller, a proportional-integral (P-I) controller, a proportional controller (P), or the like. In some embodiments, laser interferometer 350 may directly communicate with beam control module 365 or beam deflection controller 367 configured to deflect primary charged-particle beam 314 incident on wafer 203.

In some embodiments, laser interferometer 350 may communicate with stage control module 362 or beam control module 365 (not illustrated in FIG. 3). In some embodiments, laser interferometer 350 may communicate with beam control module 365 via stage control module 362. For example, laser interferometer 350 may communicate with the signal processing circuit (not shown) of stage control module 362 and generate a signal for beam control module 365 to deflect the incident beam corresponding to the determined lateral displacement or position of stage 201. Compensating, at least partly, for a lateral displacement of stage in X-Y axes, may also be referred to herein as, X-Y dynamic compensation. FIG. 3 illustrates one laser interferometer 350 configured to determine position or lateral displacement of stage 201, however, more than one interferometers may be used, as appropriate.

In some embodiments, the electrical signal applied by beam control module 365 to deflector array 320 may comprise a signal having a control bandwidth in the range of 10 kHz to 50 KHz. As used herein, the bandwidth of the control system, @B, may be defined to be that frequency range in which the magnitude of the closed-loop frequency response is greater than-3 dB in frequency domain.

Image resolution is directly dependent on the position of a sample or wafer 203. The repeatability and the stability of stage position may be crucial for the quality of the images in addition to resolution. Movement or small-scale vibration of stage 201 or wafer 203 during the scan can considerably affect the image quality and adversely impact the defect detection capabilities of an inspection tool. Distortion of the images may be avoided if no drift of the sample occurs once the target position has been reached. The positioning stages, for example, stage 201 may be required to move smoothly at velocities of a few nanometers/second (nm/s).

In some embodiments, stage motion controller 370 may control the motion of stage 201 in the X, Y, or Z axes. Stage motion controller 370 may comprise z-axis motion controllers 372 to move stage 201 in the Z-axis, and X-Y axes motion controller 374 to move stage 201 in at least one of X and Y axes. Stage motion controller 370 may include, for example, piezo stepping drives and actuators, ultrasonic piezo-motors, piezo-electric motors, piezo-electric actuators, etc. In some embodiments, stage motion controller 370 may communicate with and receive a signal from stage control module 362 based on the determined vertical or lateral displacement of stage 201. Z-axis motion controllers 372 may further include more than one piezo drives or piezo-actuators, as illustrated in FIG. 3. X-Y axes motion controller 374 may include more than one piezo drives or piezo-actuators as well.

To improve image resolution and contrast, users may apply a beam modifying voltage to reduce or increase the beam energy of the incident beam on wafer 203. In some embodiments, stage 201 may be held at a high bias voltage, so that the charged-particle leaving charged-particle beam column 310 are decelerated before they reach wafer 203 or stage 201. For example, in a secondary electron microscope, if the high voltage (accelerating voltage applied in the column) is −5 kV and the stage bias is −4 kV, the electrons are first accelerated in the column to an energy of 5 keV then, after leaving the column, decelerated by 4 keV, such that the effective high voltage is −1 kV without beam deceleration. In some embodiments, stage 201 may be held at a high bias voltage, so that the charged-particle leaving charged-particle beam column 310 are accelerated before they reach wafer 203 or stage 201. Applying a stage bias may be used to modify the beam energy and focus of the incident charged-particle beam in the Z-axis. The incident beam charged-particle beam may comprise primary charged-particle beam 314 or deflected charged-particle beam 330.

In some embodiments, the voltage signal applied to stage 201 via stage motion controller 370 may be, for example, an alternating current (AC) voltage signal, as illustrated in FIG. 3. The applied voltage signal may be based on the determined vertical displacement of stage 201 to compensate at least partly for the vertical displacement. Compensating, at least partly, for a vertical displacement of stage in Z-axis, may also be referred to herein as, Z dynamic compensation.

In some embodiments, the voltage signal may comprise a signal having a control bandwidth in the range of 50 kHz to 200 kHz, 60 kHz to 180 kHz, 70 kHz to 160 kHz, 80 kHz to 140 kHz, 90 kHz to 120 kHz, 100 kHz to 110 kHz, or any suitable ranges. In some embodiments, the preferred control bandwidth for the voltage signal applied to stage 201 may be 100 kHz.

In practice, moving stage 201 in any of the X-Y-Z axes may introduce pitch effects. In particular, pitch effects in X and Y axes may generate Abbé error which, if unaccounted for, may result in inaccurate stage positioning. As referred to herein, pitch effect of stage 201 in the X-axis may be defined as the angular rotation or tilting of stage 201 around Y-axis, and pitch effect of stage 201 in the Y-axis may be defined as the angular rotation or tilting of stage 201 around X-axis. It is appreciated that the angular rotation about the X-axis is referred to as roll. During scanning of wafer 203 disposed on stage 201, pitch effect compensation in the X-Y axes may require compensation of the lateral displacement (X-Y axes) and the vertical displacement (Z-axis) simultaneously and continuously. The vertical displacement may be compensated by either adjusting the focus of the incident beam on wafer 203 or by adjusting the position of stage 201 in the Z-axis. In some embodiments, the measured x-y coordinates may be corrected based on the determined Abbé error from pitch effects in the X and Y axes. The corrected x-y coordinates of stage 201 may include the displacement due to pitch effects. Beam deflection controller 367, beam control module 365, and stage control module 362 may communicate with one or more laser interferometers to receive updated stage position information.

In some embodiments, a laser interferometer (such as laser interferometer 350 of FIG. 3) may be configured to measure the compensation required to account for the pitch effects in the X-Y axes. For example, a charged-particle beam system 300 may comprise three laser interferometers, each of the three laser interferometers serving a pre-defined function. A first laser interferometer may be used to determine lateral displacement in the X-axis, a second laser interferometer may be used to determine lateral displacement in the Y-axis, and a third laser interferometer may be used to determine the pitch effects in the X-Y axes. It is to be appreciated that more than three laser interferometers may be used, as needed.

Figure 4:
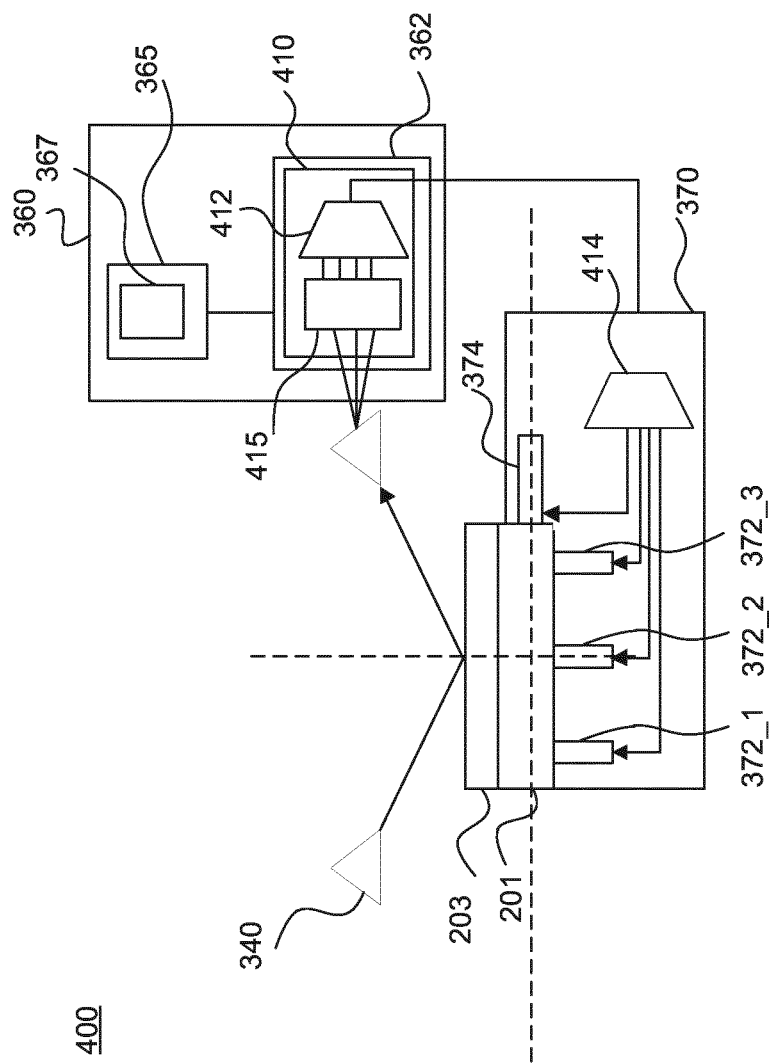
FIG. 4 is a schematic illustration of an exemplary charged-particle beam system, consistent with embodiments of the present disclosure.

As illustrated in FIG. 4, z-axis motion controllers 372 may comprise three z-axis motion controllers, such as, for example, actuators 372_1, 372_2, and 372_3, each configured to individually communicate with stage control module 362. It is to be appreciated that more z-motion controllers may be employed, as needed. For example, stage 201 holding a 300 mm wafer may utilize more z-motion controllers compared to a stage holding a 200 mm wafer, or stage 201 of an in-line charged-particle beam inspection tool may utilize more z-motion controllers compared to an offline tool. Individual control of each of the z-motion controllers, such as actuators 372_1, 372_2, and 372_3, may assist with Z-leveling of stage 201.

In some embodiments, precise positioning of stage 201 may include precise leveling of the stage such that stage 201, and thus wafer 203 disposed on stage 201, is perpendicular to optical axis 312 of charged-particle beam system 300. Leveling of stage 201 may be constantly monitored by height sensor 340. Upon determining that stage 201 is non-planar based on the signal received from height sensor 340, stage control module may generate a signal configured to move one or more z-motion controllers (such as actuator 372_1) to modify the stage leveling. A plurality of height sensors may be employed to monitor leveling, vertical displacement, and stage position in Z-axis. Stage control module 362 may be configured to receive signals from each of the plurality of height sensors.

In some embodiments, stage control module 362 further comprises a signal processing circuit 410 including one or more components configured to convert optical signals into electrical signals, such as, for example, signal converter 415, before processing the signal and generating an output signal. Signal processing circuit 410 may be, for example, a processor, a microprocessor, a control circuit, an application specific integrated circuit (ASIC), an integrated circuit, a computing device, a computer, a controller, etc. Other suitable devices and modules may be used as well.

In some embodiments, signal processing circuit 410 may comprise a signal aggregation circuit 412 configured to embed a plurality of signals from height sensor 340 into a single signal. In some embodiments, signal aggregation circuit 412 may be configured to receive one or more signals from signal converter 415. In some embodiments, signal aggregation circuit 412 may comprise a multiplexer circuit configured as a multiple-input, single-output switch. For example, signal aggregation circuit 412 may receive multiple input signals from height sensor 340, indicating stage height across a specific spot on wafer 203. In some embodiments, signal aggregation circuit 412 may receive multiple signals from each of the plurality of height sensors and process the received signals to determine whether stage 201 is levelled. In some embodiments, the multiple signals from height sensor 340 may be used to determine the vertical displacement of stage 201 or position of stage 201.

In some embodiments, signal aggregation circuit 412 may include code-division multiplexers, frequency-division multiplexers, time-division multiplexers, wavelength-division multiplexers, or statistical multiplexers, etc. In some embodiments, multiplexer circuits may comprise, for example, a 2-to-1 multiplexer, a 4-to-1 multiplexer, an 8-to-1 multiplexer, or a 16-to-1 multiplexer, etc. Other signal processing circuit types and configurations may be employed as well.

In some embodiments, stage motion controller 370 may comprise a signal segregation circuit 414. Signal segregation circuit may be, for example, a demultiplexer circuit configured as a single-input, multiple-output switch. Signal segregation circuit 414 may be configured to receive the single output signal from signal aggregation circuit 412 and generate multiple output signals to actuate one or more z-axis motion controllers 372 or X-Y axes motion controller 374. For example, when the control bandwidth for the voltage signal applied to stage 201 is 100 kHz, the voltage signal may include three separate signals embedded within, one for each of the three z-axis motion controllers.

In some embodiments, stage motion controller 370 may be configured to receive signal from signal aggregation circuit 412. Stage motion controller 370 may process the received signal based on determined lateral or vertical displacement and compensation required.

In some embodiments, each of the multiple output signals of signal segregation circuit 414 may control a z-axis motion controller. For example, as illustrated in FIG. 4, each output signal is associated with each of the z-axis motion controllers. In some embodiments, two output signals may be combined to control one z-axis motion controller. Alternatively, one output signal from signal segregation circuit 414 may control two z-axis motion controllers. It is to be appreciated that a number of combinations of output signals associated with z-axis motion controllers may be possible.

In some embodiments, an output signal from signal segregation circuit 414 may control X-Y axes motion controller 374 based on determined lateral displacement of stage 201 through laser interferometer 350. Stage motion controller 370 may comprise other circuits and components for routing signals, timing the signals, filtering the signals, etc.

In some embodiments, signal aggregation circuit 412 and signal segregation circuit 414 may comprise functional logic gates, such as, for example, AND, OR, NAND, NOR, or combinations thereof. The combinational logic gates may interface with one or more of system control module 360 or stage motion controller 370.

In some embodiments, Z-axis leveling of stage 201 may be realized by controlling the height of vertical actuators, e.g., piezo motors, with geometric model information of actuation output calculation. The geometric models may comprise mechanical models of stage, computer-aided drawings (CAD) of stage, simulations of stage dimensions and actuation of stage movement, etc.

Figure 5:
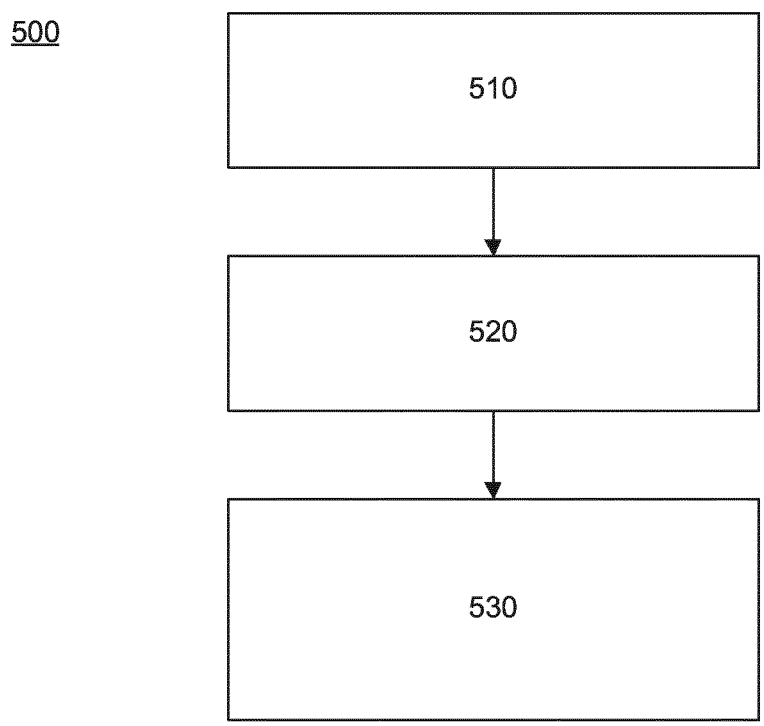
FIG. 5 is a flow chart showing an exemplary method of irradiating a sample, consistent with embodiments of the present disclosure.

FIG. 5 is a flow chart illustrating an exemplary method of irradiating a sample with a charged-particle beam using a charged-particle beam system, consistent with embodiments of the present disclosure. The method of observing a sample may be performed by charged-particle beam system 300 of FIG. 3, charged-particle beam system 800 of FIG. 8 (discussed later), or EBI system 100 of FIG. 1. It is appreciated that the charged particle beam system may be controlled to observe, image, and inspect a wafer (e.g., wafer 203 of FIGS. 2-3) or a region of interest on the wafer. Imaging may comprise scanning the wafer to image at least a portion of the wafer, a pattern on the wafer, or the wafer itself. Inspecting the wafer may comprise scanning the wafer to inspect at least a portion of the wafer, a pattern on the wafer, or the wafer itself.

In step 510, a primary charged-particle beam (e.g., primary charged-particle beam 220 of FIG. 2) is generated from a charged-particle source. In some embodiments, a charged-particle beam may refer to a spatially localized group of electrically charged particles that have approximately the same kinetic energy and direction. The electrically charged particles may comprise electrons, protons, or ions. The charged-particle source may be, for example, thermionic emission of electrons from tungsten or Lanthanum hexaboride (LaB6) cathodes, or electric-field induced emission of electrons from tungsten/Zirconium Oxide (ZrO2), etc. The charged-particle beams may comprise charged-particles having high kinetic energy due to the high acceleration electric field to drive the charged-particles towards the sample. The kinetic energy of the charged-particles may be in the range of 0.2-40 keV or higher. In some embodiments, the primary charged-particle beam may have an optical axis (e.g., optical axis 312) along which the beam travels towards the wafer or a stage (e.g., stage 201 of FIGS. 2-3).

In step 520, lateral displacement of the stage may be determined. Lateral displacement, as used herein, may refer to a difference between the current position and a target position of the stage in X-Y axes. In a charged-particle beam system, there may be multiple factors causing lateral displacement of the stage. For example, mechanical vibrations, electromagnetic interference from stray fields, temperature variations due to lens heating, errors due to stage tilt, etc.

In some embodiments, lateral displacement of the stage may be determined using precise optical position sensing techniques. A laser interferometer (e.g., laser interferometer 350 of FIG. 3) may be used to determine lateral displacement of the stage in the X-Y axes. One or more laser interferometers may communicate directly with beam control module (e.g., beam control module 365 of FIG. 3), or indirectly with beam control module via stage control module (e.g., stage control module 362 of FIG. 3). One or more laser interferometers may be configured to determine lateral displacement of the stage based on the signals detected by a photodetector of the laser interferometers. In some embodiments, the beam control module, the stage, and the laser interferometers may form a closed feedback control loop.

In step 530, upon determining lateral displacement of the stage, the beam deflection controller of beam control module may apply a signal to a primary-beam deflector (e.g., deflector array 320 of FIG. 3). The applied signal may cause the primary charged-particle beam to deflect in X or Y axis, or both, to compensate at least partly for lateral displacement of the stage. The applied signal may comprise an electrical signal having a bandwidth in the range of 10 kHz to 50 kHz. In a preferred embodiment, the bandwidth of the applied signal may be 30 kHz.

Figure 6:
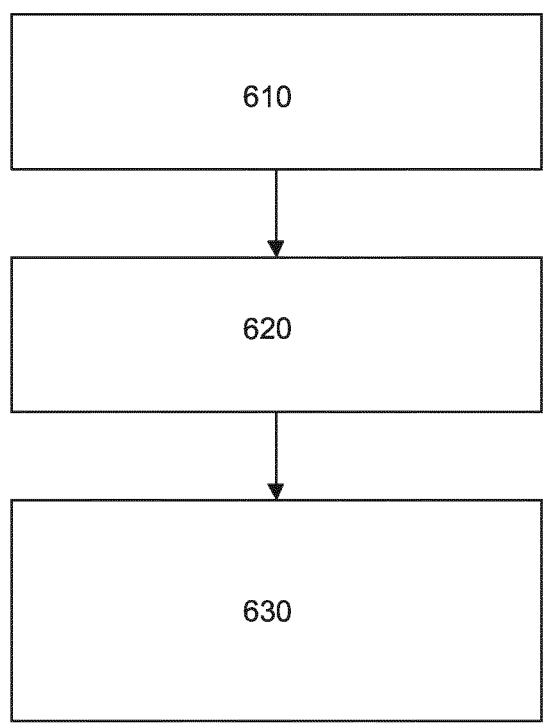
FIG. 6 is a flow chart showing an exemplary method of irradiating a sample, consistent with embodiments of the present disclosure.

FIG. 6 is a flow chart illustrating an exemplary method of irradiating a sample with a charged-particle beam using charged-particle beam system, consistent with embodiments of the present disclosure. The method of observing a sample may be performed by charged-particle beam system 300 of FIG. 3 or EBI system 100 of FIG. 1.

In step 610, analogous to step 510, a primary charged-particle beam (e.g., primary charged-particle beam 220 of FIG. 2) is generated from a charged-particle source. The primary charged-particle beam may be, for example, an electron beam generated from an electron source. The electron source may comprise, but not limited to, thermionic emission of electrons from a tungsten filament or LaB6 cathode, or field emission of electrons from a tungsten/ZrO2 cold-cathode.

In step 620, vertical displacement of a stage (e.g., stage 201 of FIGS. 2-3) may be determined. Vertical displacement, as used herein, may refer to a difference between the current position and a target position of the stage in the Z-axis. In a charged-particle beam system, there may be multiple factors causing vertical displacement of the stage. For example, mechanical vibrations, electromagnetic interference from stray fields, stage movement calibration errors, piezo motor calibration errors, etc.

In some embodiments, vertical displacement of the stage may be determined using precise optical position sensing techniques using optical height sensors (e.g., height sensor 340 of FIG. 3). Height sensors may comprise a laser diode assembly including a laser source irradiating the stage, or a wafer (e.g., wafer 203 of FIGS. 2-3) disposed on the stage, with a laser light having a predefined emission wavelength, and a laser detector configured to detect the reflected laser. Height sensors may communicate with a stage control module (e.g., stage control module 362 of FIG. 3), beam control module (beam control module 365 of FIG. 3), or both.

In step 630, upon determining the vertical displacement of the stage, a beam deflection controller (e.g., beam deflection controller 367 of FIG. 3) may apply a signal to the stage to adjust a position of the focal plane of the primary charged-particle beam in the Z-axis by moving the stage along the Z-axis. In some embodiments, the vertical movement of the stage may be performed, at least partly, using actuators such as, for example, a piezoelectric motor, piezoelectric actuator, or an ultrasonic piezo-motor, or combinations thereof. The applied signal may comprise a voltage signal having a bandwidth in the range of 50 kHz to 200 kHz. In a preferred embodiment, the bandwidth of the applied signal may be 100 KHz.

In some embodiments, the applied signal may cause the primary charged-particle beam to decelerate or accelerate towards the stage based on the polarity of the signal, modifying the focus of primary charged-particle beam incident on the wafer.

Figure 7:
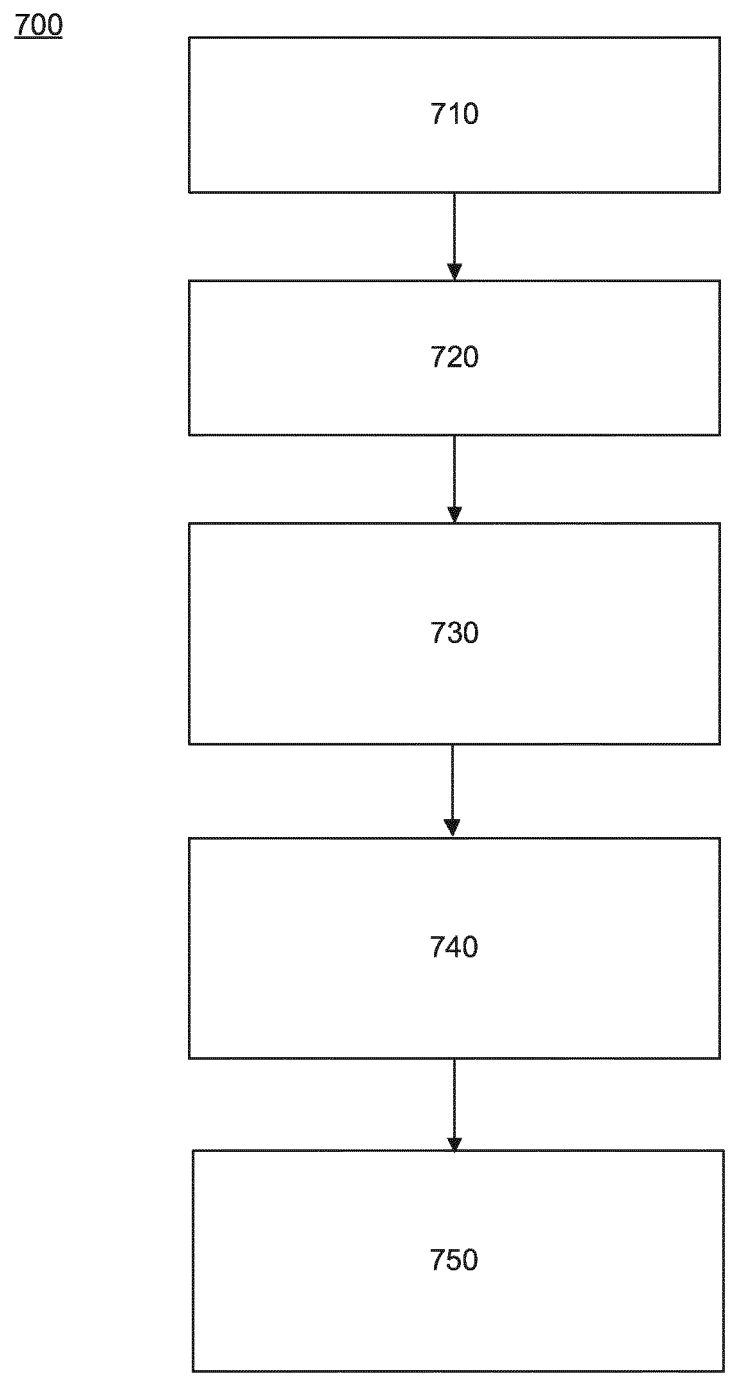
FIG. 7 is a flow chart showing an exemplary method of irradiating a sample, consistent with embodiments of the present disclosure.

FIG. 7 is a flow chart illustrating an exemplary method of irradiating a sample with a charged-particle beam using charged-particle beam system, consistent with embodiments of the present disclosure. The method of observing a sample may be performed by charged-particle beam system 300 of FIG. 3 or EBI system 100 of FIG. 1. It is appreciated that the charged particle beam apparatus may be controlled to observe, image, and inspect a wafer (e.g., wafer 203 of FIG. 2) or a region of interest on the wafer. Imaging may comprise scanning the wafer to image at least a portion of the wafer, a pattern on the wafer, or the wafer itself. Inspecting the wafer may comprise scanning the wafer to inspect at least a portion of the wafer, a pattern on the wafer, or the wafer itself. Observing the wafer may comprise monitoring the wafer or regions of interest on the wafer for certain characteristics, such as reproducibility or repeatability of patterns, among others.

In step 710, analogous to steps 510 and 610, a primary charged-particle beam (e.g., primary charged-particle beam 220 of FIG. 2) is generated from a charged-particle source. The primary charged-particle beam may be, for example, an electron beam generated from an electron source. The electron source may comprise, but not limited to, thermionic emission of electrons from a tungsten filament or LaB6 cathode, or field emission of electrons from a tungsten/ZrO2 cold-cathode. In step 720, a position sensing system comprising height sensors (e.g., height sensor 340 of FIG. 3) and laser interferometers (laser interferometer 350 of FIG. 3) may be used to determine the lateral and vertical displacement of a stage (e.g., stage 201 of FIGS. 2-3). In some embodiments, one or more optical height sensors, may be used to determine the vertical displacement and one or more laser interferometers may be used to determine the lateral displacement of the stage. In some embodiments, during scanning of wafer 203 disposed on stage 201, pitch effect compensation in the X-Y axes may require compensation of the lateral displacement (X-Y axes) and the vertical displacement (Z-axis) simultaneously and continuously. The vertical displacement may be compensated by either adjusting the focus of the incident beam on wafer 203 or by adjusting the position of stage 201 in the Z-axis. In some embodiments, the measured x-y coordinates may be corrected based on the determined Abbe error from pitch effects in the X and Y axes. The corrected x-y coordinates of stage 201 may include the displacement due to pitch effects. Beam deflection controller 367, beam control module 365, and stage control module 362 may communicate with one or more laser interferometers to receive updated stage position information. Compensating for the pitch effects in the X and Y axes may include determining lateral beam correction from the measured x-y position coordinates and continuously adjusting the focus of the primary charged-particle beam incident on the wafer to compensate for the vertical displacement, while scanning. In some embodiments, height sensors and laser interferometers may be used to determine stage positioning, stage calibration, calibration of motors and drives configured to move stage in one of the X-Y-Z axes.

In step 730, after determining the lateral displacement of the stage, a beam deflection controller (e.g., beam deflection controller 367 of FIG. 3) may apply a first signal to a primary-beam deflector (e.g., deflector array 320 of FIG. 3) to cause the primary charged-particle beam to deflect in at least one of X or Y axis. The applied signal may comprise an electrical signal having a high-control bandwidth in the range of 10 kHz to 50 kHz. The deflected charged-particle beam (e.g., deflected charged-particle beam 330 of FIG. 3) may compensate, at least partly for the determined lateral displacement of the stage.

In step 740, after determining the vertical displacement of the stage, the beam deflection controller may apply a second signal to the stage to adjust the focus of deflected charged-particle beam in the Z-axis. The applied second signal may comprise a voltage signal configured to decelerate or accelerate the charged-particle beam towards the stage. The deceleration or acceleration voltage of charged-particle beam may correspond to the vertical displacement of the stage, and may compensate, at least partly for the vertical displacement by modifying the focus of the incident charged-particle beam in the Z-axis. The voltage signal may comprise a signal having a high control-bandwidth in the range of 50 kHz to 200 kHz.

In step 750, upon determining stage positioning and stage leveling in the Z-axis based on the signals received from one or more height sensors, the stage control module (e.g., stage control module 362 of FIG. 3) may apply a signal to a stage motion controller (e.g., stage motion controller 370 of FIG. 3). In some embodiments, the signal may comprise one or more signals to independently control the z-motion controllers (e.g., actuators 372_1, 372_2 and 372_3 of FIG. 3) to adjust the Z-level of the stage such that stage is substantially perpendicular to the primary charged-particle beam.

Inspection and imaging of 3-dimensional (3D) structures, such as contact holes, vias, or interconnects on a semiconductor chip, may be performed by adjusting the focal depth of the probing charged-particles (e.g., electrons in an electron beam inspection tool) with reference to a position of the sample, such as by adjusting the landing energy of the electrons on the sample to cause a change in the focal depth, among other things. One of the several ways to adjust the focal depth or the focal plane of the primary electron beam includes adjusting the magnetic field associated with the objective lens by adjusting the electric current through the coils of the magnetic objective lens, among other things. Adjusting the magnetic field to cause a change in focal depth may induce delays related to the response time between varying the current and resultantly adjusting the magnetic field, among other things, rendering the process slow and thereby negatively impacting the inspection throughput.

Another of the several ways to adjust the focal depth or the focal plane is to adjust the landing energy of the electrons of an electron beam, such as by adjusting the voltage of the anode (e.g., anode 216), among other things. The adjustment of anode voltage may adjust the velocity or the energy of the electrons incident on the surface of the sample, thus adjusting the focal depth, among other things. Although the focal depth may be adjusted, however, the adjusted primary electron beam may be rotated with reference to one or more axes due to the change in the electromagnetic field experienced by the electrons as the beam travels downstream towards the sample. The rotation of the primary electron beam may cause the images formed therefrom to be rotated, among other things, negatively impacting the inspection throughput. Therefore, it may be desirable to provide a method to adjust the focal plane of the incident primary electrons while maintaining the desired inspection throughput, such as by adjusting the landing energy of the primary electron beam to cause the desired change in the focal plane.

Figure 8:
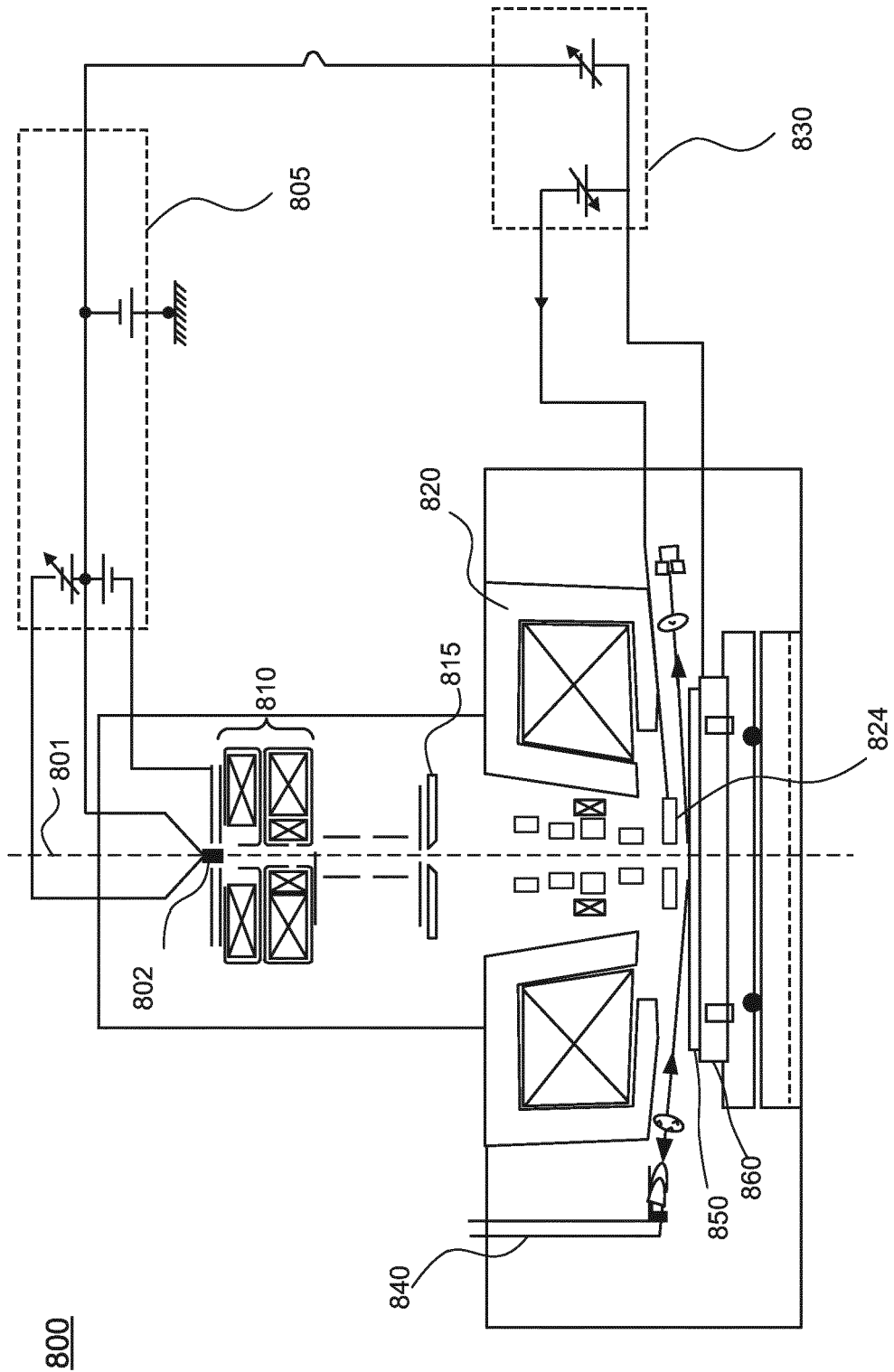
FIG. 8 is a schematic illustration of an exemplary charged-particle beam system, consistent with embodiments of the present disclosure.

Reference is now made to FIG. 8, which illustrates an exemplary charged-particle beam system 800 consistent with embodiments of the present disclosure. Charged-particle beam system 800 may include a charged-particle source comprising cathode 802 (analogous to cathode 218 of FIG. 2) configured to generate a charged-particle beam (e.g., electron beam) along a primary optical axis 801, a source supply unit 805, a condenser lens 810 (analogous to condenser lens 315 of FIG. 3), an electron detector 815 (analogous to electron detector 206 of FIG. 2), an objective lens assembly 820 (analogous to objective lens 204 of FIG. 2), a height sensor 840 configured to determine the position of a wafer 850 disposed on a stage 860. Charged-particle beam system 800 may further include a control unit 830 configured to control the electrical signals applied to stage 860 and objective lens assembly 820. Alternatively, charged-particle beam system 800 (such as an electron beam system) may be a part of imaging system 200 of FIG. 2 or EBI system 100 of FIG. 1. It is to be appreciated that although not explicitly described, charged-particle beam system 800 may comprise other standard or non-standard components to perform functions including, but not limited to, beam focusing, beam deflection, electron detection, beam-current limiting, etc.

In some embodiments, charged-particle beam system 800 may be configured to, among other things, generate and focus an electron beam on wafer 850. Focusing an electron beam may comprise adjusting the height of wafer 850 such that the electron beam is focused on a desired plane of wafer 850. It is to be appreciated that because wafer 850 is disposed on stage 860, adjusting the height of stage 860 would result in an adjustment of the height of wafer 850. One of several ways to focus the electron beam on wafer 850 may include using a combination of optical and mechanical techniques. For example, using optical components such as an optical height sensor to determine the height of stage 860 or wafer 850 and mechanical components such as piezoelectric transducers configured to mechanically move stage 860 based on the determined height. However, using purely opto-mechanical techniques for focusing electron beam may result in imprecise determinations for some applications such as inspection of 3D NAND flash devices comprising vertically stacked structures. In such cases, it may be desirable to further fine-tune the focus of the electron beam using electrical techniques discussed herein to, e.g., enhance the imaging resolution.

Source supply unit 805 may be configured to supply electrical power to the charged-particle source to generate the charged-particle beam. In some embodiments, source supply unit 805 may be configured to generate an electric field between an anode (not illustrated) (e.g., anode 216 of FIG. 2) and cathode 802 such that a charged-particle beam may be emitted from the charged-particle source. In some embodiments, the charged-particle source may comprise a field emission source wherein the charged-particles, such as electrons, are emitted from a field emission gun by placing a cathode at a large electrical field gradient. The field emission source may utilize two anode plates, or more, as appropriate. The first anode plate may be configured to cause extraction or emission of charged-particles from the field emitter, and the second anode plate may be configured to cause acceleration of extracted charged-particles towards wafer 850. Source supply unit 805 may be configured to determine and supply extraction and acceleration voltages. In some embodiments, source supply unit 805 may be an integral part of a beam control module, such as beam control module 365 of FIG. 3, or a system control module, such as system control module 360 of FIG. 3, or coupled with the system control module.

As shown in FIG. 8, charged-particle beam system 800 may comprise condenser lens 810, analogous to condenser lens 315 of FIG. 3, and may perform similar or substantially similar functions as condenser lens 315. For example, condenser lens 810 may be configured to focus the charged-particle beam. In some embodiments, electric currents of primary beamlets of primary charged-particle beam may be adjusted by varying the focusing power of condenser lens 810.

Electron detector 815 of charged-particle beam system 800 is analogous to electron detector 206 of FIG. 2 and may perform similar or substantially similar functions as electron detector 206. For example, electron detector 815 may detect secondary electrons, emitted from wafer 850 upon interaction with the electrons of primary electron beam, and generate a signal associated with an intensity of the detected secondary electrons. Objective lens assembly 820 of charged-particle beam system 800 may be similar or substantially similar to objective lens 204 of FIG. 2. Objective lens assembly 820 may comprise a control electrode 824 analogous to control electrode 204b of FIG. 2, configured to control an electric field associated with wafer 850, among other things. Objective lens assembly 820 may include, but is not limited to, a beam-focusing component configured to adjust the focus of the primary electron beam directed towards wafer 850, and a field-modulating component configured to adjust the electric field to which the primary electron beam may be exposed. In some embodiments, the field-modulating component may comprise control electrode 824. In some embodiments, the electrical excitation of control electrode 824 may be adjusted by varying a voltage, or a current to adjust the generated electric field. Charged-particle beam system 800 may further include a control unit 830 configured to control the voltage applied to stage 860 and objective lens assembly 820. In some embodiments, control unit 830 may be configured to apply voltage to control electrode 824 of objective lens assembly 820.

In the context of this disclosure, optomechanical techniques to adjust the focus of an electron beam refer to adjusting the height of stage 860 using a combination of electromechanical and optical devices including, but not limited to, piezoelectric transducers, piezo drives, lasers, interferometers, photodiodes, among others. In the context of this disclosure, electrical techniques to adjust the focus of an electron beam refer to manipulating an electromagnetic field associated with the electron beam by applying an electrical signal to stage 860, or wafer 850, or a control electrode of objective lens assembly 820 (e.g., 824 of FIG. 8).

As discussed above, in electron beam inspection tools, such as a SEM, the precision in focus of the electron beam achieved by purely opto-mechanical techniques may be inadequate for some applications, such as vertically stacked structures in an IC chip, among others. It may be desirable to limit the usage of mechanical techniques at least due to the possibility of introducing error and variability in focus of the electron beam as a result of imprecise stage motion control, or mechanical vibration, among other things. Electrical techniques, on the other hand, may provide more precise adjustment of the focal plane of the electron beam incident on a sample, by modifying the electric field or the magnetic field on the sample, and may provide a faster method for adjusting the focal plane.

Figure 9A:
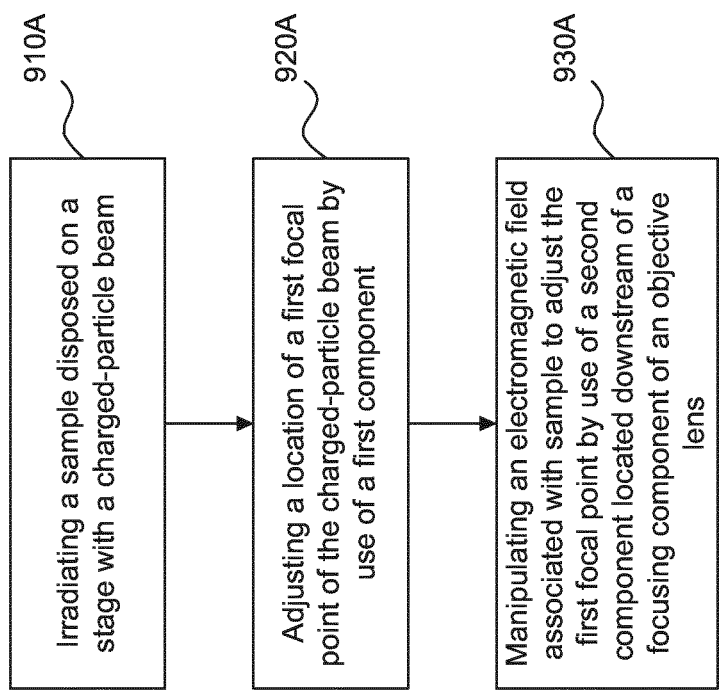
FIG. 9A is a flow chart showing an exemplary method of focusing a charged-particle beam on a sample, consistent with embodiments of the present disclosure.

Reference is now made to FIG. 9A, which illustrates a flow chart illustrating an exemplary method of focusing a charged-particle beam on a sample using charged-particle beam system 800, consistent with embodiments of the present disclosure. The method of focusing a sample may be performed by charged-particle beam system 300 of FIG. 3, charged-particle beam system 800 of FIG. 8, or EBI system 100 of FIG. 1. It is appreciated that the charged particle beam apparatus may be controlled to observe, image, and inspect a wafer (e.g., wafer 850 of FIG. 8) or a region of interest on the wafer. Imaging may comprise scanning the wafer to image at least a portion of the wafer, a pattern on the wafer, or the wafer itself. Inspecting the wafer may comprise scanning the wafer to inspect at least a portion of the wafer, a pattern on the wafer, or the wafer itself. Observing the wafer may comprise monitoring wafer or regions of interest on wafer for reproducibility and repeatability of patterns.

In step 910A, analogous to steps 510, 610, and 710, a primary charged-particle beam (e.g., primary charged-particle beam 220 of FIG. 2) is generated from a charged-particle source. The sample disposed on stage (e.g., stage 860 of FIG. 8) is irradiated with the primary charged-particle beam. In some embodiments, at least a portion of the sample may be irradiated with at least a portion of the primary charged-particle beam. The primary charged-particle beam may be, for example, an electron beam generated from an electron source. The electron source may comprise, but is not limited to, thermionic emission of electrons from a tungsten filament or LaB6 cathode, or field emission of electrons from a tungsten/ZrO2 cold-cathode.

The sample may be disposed directly on the stage. In some embodiments, the sample may be disposed on an adapter such as a sample holder, disposed on and secured to the stage. The geometric center of the sample, the sample holder, and the stage may be aligned with each other and with the primary optical axis (e.g., primary optical axis 801 of FIG. 8). The sample, sample holder, and the stage may be disposed in planes normal or substantially normal to the primary optical axis. In some embodiments, the sample or the stage may be tilted off-axis such that the primary charged-particle beam is incident on the sample at an angle smaller or larger than 90°. In some embodiments, the sample and the stage may be mechanically coupled such that the displacement of the stage in any of X-, Y-, or Z-axes results in the displacement of the sample correspondingly. In some embodiments, the sample holder and the stage may be electrically coupled such that there may be an ohmic contact or non-significant voltage potential gradient between them. In some embodiments, the sample and the sample holder may be electrically coupled such that there may be an ohmic contact or non-significant voltage potential gradient between them.

In step 920A, a location of an initial focal point of the charged-particle beam is adjusted with reference to the sample using a first component. As used herein, initial focal point refers to an approximate point or an approximate plane of focus of the charged-particle beam. In some embodiments, adjusting the location of the initial focal point may comprise determining an initial position of the stage in the Z-axis using more precise optical position sensing techniques including optical height sensors (e.g., height sensor 840 of FIG. 8), and based on the determined initial position of the stage and a desired focal plane of the primary charged-particle beam, adjusting the position of the stage such that the initial focal point of the primary charged-particle beam is formed on the surface or substantially close to the surface of the sample. In some embodiments, it may be desirable to form the initial focal point on a top surface of the sample.

In some embodiments, a height sensor may comprise a laser diode assembly including a laser source irradiating the stage, or the sample (e.g., wafer 850 of FIG. 8) disposed on the stage, with a laser light having a predefined emission wavelength, and a laser detector configured to detect the reflected laser off the surface of the sample. Height sensors may communicate with a stage control module (e.g., stage control module 362 of FIG. 3), a beam control module (e.g., beam control module 365 of FIG. 3), or both. In some embodiments, the stage control module and the beam control module may communicate with each other to adjust the height of the stage to focus the primary charged-particle beam on the sample.

In step 930A, after forming the initial focal point on the sample in step 920A, the focus of the primary charged-particle beam may be further adjusted by manipulating an electromagnetic field associated with the sample using a second component. The second component may include, but is not limited to, control electrode (e.g., control electrode 824 of FIG. 8) of the objective lens, the stage, or the sample, among other things. In some embodiments, the second component may be located downstream of the focusing component of the objective lens. The electromagnetic field associated with the sample may comprise electric field and magnetic field influencing the sample. Manipulating the electromagnetic field may allow further adjusting the initial focal point of the charged-particle beam to form a final focal point on the sample. The electromagnetic field may be manipulated by, for example, adjusting an electrical signal applied to a control electrode (e.g., control electrode 824 of FIG. 8) of an objective lens assembly (e.g., objective lens assembly 820 of FIG. 8), adjusting an electrical signal to the stage, or adjusting a magnetic field configured to influence characteristics of the charged-particle beam.

In some embodiments, manipulating the electromagnetic field may comprise adjusting an electrical signal applied to the control electrode of the objective lens assembly. The initial focal point of the charged-particle beam may be adjusted along the Z-axis by adjusting an electrical excitation (e.g., voltage) of the control electrode. The initial height adjustment or the initial focal point of the charged-particle beam is achieved in step 920A by adjusting the height of the stage based on optical measurements. After the initial focal point is formed, the electrical excitation of the control electrode may be changed to adjust the path or energy of the charged-particle beam, thereby adjusting the focal point. For example, changing the voltage signal applied to the control electrode may manipulate the electric field experienced by the charged-particle beam, and therefore enable adjustment of the focal point of the charged-particle beam on the sample surface. A combination of optomechanical and electrical techniques, as described herein may enable a user to obtain high imaging quality and high resolution.

In some embodiments, manipulating the electromagnetic field may comprise adjusting an electrical signal applied to the stage. The initial focal point of the charged-particle beam may be adjusted along the Z-axis by adjusting the voltage signal applied to the stage. The voltage signal applied to the stage may adjust the landing energy of the charged-particle beam on the sample surface. As used herein, landing energy of the charged-particle beam may be defined as the energy of the charged-particles as they impact the sample and may be the difference between the acceleration voltage and the stage/sample bias voltage. To improve image resolution and contrast by adjusting the focal point of the incident primary charged-particle beam, users may apply a beam-energy modifying voltage to the stage to reduce or increase the beam energy of the incident charged-particle beam on the sample.

In some embodiments, manipulating the electromagnetic field may comprise adjusting an electrical signal be applied to the sample or wafer so that the charged particles are decelerated (lower landing energy) or accelerated (higher landing energy) before they are incident on the sample. For example, in a SEM, if the high voltage (accelerating voltage applied in the column) is 12 kV (e.g., created by setting the voltages of cathode 218 and anode 216 of FIG. 2, respectively, to −12 kV and ground) and the stage/sample bias voltage is −9 kV (relative to ground), the electrons are first accelerated in the column to an energy of 12 keV then, after leaving the column, decelerated by a 9 kV electric field, such that the landing energy of the charged-particles of the charged-particle beam is 3 keV. Accelerating or decelerating the charged-particles incident on the sample may change the penetration depth into the sample and may change the depth of focus of the beam. At a lower landing energy, for example, less than 1 keV, the charged-particle beam may interact mainly with the top surface of the sample. At a higher landing energy, for example, between 1 keV to 6 keV, the penetration depth may be larger, thus providing information from the bulk of the sample. In some embodiments, the landing energy of the charged-particle beam is in the range of 250 eV to 6 keV. Though lower landing energy may avoid bulk analysis, the signal strength of secondary charged particles generated may be low, thus negatively impacting the ability to analyze the sample. On the other hand, the higher landing energy may be desirable to extract bulk and sub-surface information, but it may charge the sample, thus negatively impacting the ability to analyze the sample. In some embodiments, the landing energy of the charged-particle beam is in the range of 500 eV to 3 keV, based on the sample, any requirements, and the application involved.

Adjusting the landing energy of the charged-particle beam may comprise applying one or more electrical signals to the stage. In some embodiments, the electrical signal may comprise a first component of a voltage signal or a second component of the voltage signal. The first component of the voltage signal may be a voltage applied to the stage or the sample to influence the acceleration of the charged-particle beam. For some applications, the focus of the charged-particle beam at the initial focal point on the sample may not be adequate, and therefore, the charged-particle beam may be further focused or adjusted to achieve better resolution or contrast, for example. In some embodiments, the first component of the voltage signal may be configured to coarse-adjust the initial focal point of the charged-particle beam on the sample surface. As used herein, coarse adjustment of the initial focal point may refer to adjustments of the focal point along the Z-axis. In some embodiments, the first component of the voltage signal may comprise a voltage signal in the range of 5 KV to 10 KV.

The second component of the voltage signal may be a voltage applied to the stage or the sample to fine-adjust the initial focal point formed by adjusting the position of the stage in the Z-axis. As used herein, fine-adjustment of the initial focal point may refer to adjustments of the focal point along the Z-axis to achieve a sharp focus. The second component of the voltage signal may deflect the incident charged-particle beam allowing minor position adjustments along the X-, Y-, or Z-axes to enable a sharper focus. In some embodiments, the second component of the voltage signal may comprise a voltage signal in the range of −150 V to +150 V. It is to be appreciated that the applied first or second components of the voltage signals may be higher or lower than the range mentioned herein, based on factors including, but not limited to, the application, the sample, and tool conditions.

In some embodiments, the landing energy of the charged-particle beam incident on the sample surface may be adjusted to manipulate the electromagnetic field by applying a single electrical signal. The single electrical signal may comprise the first and the second components of the voltage signals. For example, if the first component of the voltage signal for coarse-adjustment of the focal point is −9 KV and the second component of the voltage signal for fine-adjustment of the focal point is −100 V, then the single electrical signal would comprise a voltage signal of −9.1 KV. Alternatively, if the first component of the voltage signal for coarse adjustment of the focal point is −9 KV and the second component of the voltage signal for fine adjustment of the focal point is +100 V, then the single electrical signal would comprise a voltage signal of −8.9 KV.

In some embodiments, manipulating the electromagnetic field associated with the sample may comprise adjusting a magnetic field associated with the sample. In some embodiments, adjusting the electric field by applying electrical signals may result in adjustment of the magnetic field. The adjustment of magnetic field through electrical or magnetic components may influence characteristics of the charged-particle beam. For example, current passing through the coils of an electromagnetic lens create a magnetic field in the bore of the pole pieces that may be used to converge the charged-particle beam. In some embodiments, the characteristics of the charged-particle beam may include, but may not be limited to, a path, a direction, a velocity, or an acceleration of the charged-particle beam.

Reference is now made to FIG. 9B, which illustrates an exemplary method of focusing a charged-particle beam on a sample using charged-particle beam system 800, consistent with embodiments of the present disclosure. The method of focusing a sample may be performed by charged-particle beam system 300 of FIG. 3, charged-particle beam system 800 of FIG. 8, or EBI system 100 of FIG. 1.

In step 910B, analogous to steps 510, 610, 710 and 910A, a primary charged-particle beam (e.g., primary charged-particle beam 220 of FIG. 2) is generated from a charged-particle source. The sample disposed on stage (e.g., stage 860 of FIG. 8) is irradiated with the primary charged-particle beam. In some embodiments, at least a portion of the sample may be irradiated with at least a portion of the primary charged-particle beam. The primary charged-particle beam may be, for example, an electron beam generated from an electron source. The electron source may comprise, but not limited to, thermionic emission of electrons from a tungsten filament or LaB6 cathode, or field emission of electrons from a tungsten/ZrO2 cold-cathode.

The sample may be disposed directly on the stage. In some embodiments, the sample may be disposed on an adapter such as a sample holder, disposed on and secured to the stage. The geometric center of the sample, the sample holder, and the stage may be aligned with each other and with the primary optical axis (e.g., primary optical axis 801 of FIG. 8). The sample, sample holder, and the stage may be disposed in planes normal or substantially normal to the primary optical axis. In some embodiments, the sample or the stage may be tilted off-axis such that the primary charged-particle beam is incident on the sample at an angle smaller or larger than 90°. In some embodiments, the sample and the stage may be mechanically coupled such that the displacement of the stage in any of X-, Y-, or Z-axes results in the displacement of the sample correspondingly. In some embodiments, the sample holder and the stage may be electrically coupled such that there may be an ohmic contact or non-significant voltage potential gradient between them.

In step 920B, similar to step 920A, a location of an initial focal point of the charged-particle beam is adjusted with reference to the sample using a first component. As used herein, initial focal point refers to an approximate point or an approximate plane of focus of the charged-particle beam. In some embodiments, adjusting the location of the initial focal point may comprise determining an initial position of the stage in the Z-axis using more precise optical position sensing techniques including optical height sensors (e.g., height sensor 840 of FIG. 8), and based on the determined initial position of the stage and a desired focal plane of the primary charged-particle beam, adjusting the position of the stage such that the initial focal point of the primary charged-particle beam is formed on the surface or substantially close to the surface of the sample. In some embodiments, it may be desirable to form the initial focal point on a top surface of the sample.

In some embodiments, height sensors may comprise a laser diode assembly including a laser source irradiating the stage, or the sample (e.g., wafer 850 of FIG. 8) disposed on the stage, with a laser light having a predefined emission wavelength, and a laser detector configured to detect the reflected laser off the surface of the sample. Height sensors may communicate with a stage control module (e.g., stage control module 362 of FIG. 3), beam control module (beam control module 365 of FIG. 3), or both. In some embodiments, the stage control module and the beam control module may communicate with each other to adjust the height of the stage to focus of the primary charged-particle beam on the sample.

In step 930B, after forming the initial focal point on the sample in step 920B, the electromagnetic field may be manipulated by, for example, adjusting an electrical signal applied to a control electrode (e.g., control electrodes 824 of FIG. 8 or 204b of FIG. 2) of an objective lens (e.g., objective lens assemblies 820 of FIG. 8 or 204 of FIG. 2), to form the final focal point. The initial focal point of the charged-particle beam may be adjusted to form the final focal point along the Z-axis by adjusting the electrical excitation of the control electrode. The initial height adjustment or the initial focal point of the charged-particle beam is achieved in step 920B by adjusting the height of the stage based on optical measurements. After the initial focal point is formed, the electrical excitation of the control electrode may be changed to adjust the path or energy of the charged-particle beam, thereby adjusting the focal point. For example, changing the voltage signal applied to the control electrode may manipulate the electric field experienced by the charged-particle beam, and therefore enable adjustment of the focal point of the charged-particle beam on the sample surface. A combination of optomechanical and electrical techniques, as described herein may enable a user to obtain high imaging resolution.

As discussed above, one of the challenges encountered during inspection of IC chips having device architectures that include vertically stacked components is inadequate imaging range and resolution. For example, measuring the depth of a 4-5 μm deep metal contact hole, or detecting a buried defect particle at the base of a structure, may be useful to analyze defects and develop process conditions based on information extracted from imaging and accurate measurements, among other things. A large range of depth-of-focus (DOF) of a charged-particle beam system, such as a SEM, may enable a larger imaging range so that a top surface, a bottom surface, and the intermediate layers of a deep feature may be imaged simultaneously and in real-time while maintaining high imaging resolution.

Using existing techniques to inspect vertically stacked structures, e.g., 3D NAND flash devices, may provide either limited or inaccurate information, both of which may negatively impact the throughput and the quality of devices produced. Therefore, it may be desirable to enable the existing inspection tools with real-time 3D imaging capabilities, thus improving imaging range while maintaining high imaging resolution. The ability to adjust focal points of a charged-particle beam along the Z-axis by manipulating the electromagnetic field may be used to image multiple planes of a sample, a feature, or a region of interest within the sample in real-time, thus enabling obtaining accurate 3D morphology.

Figure 10:
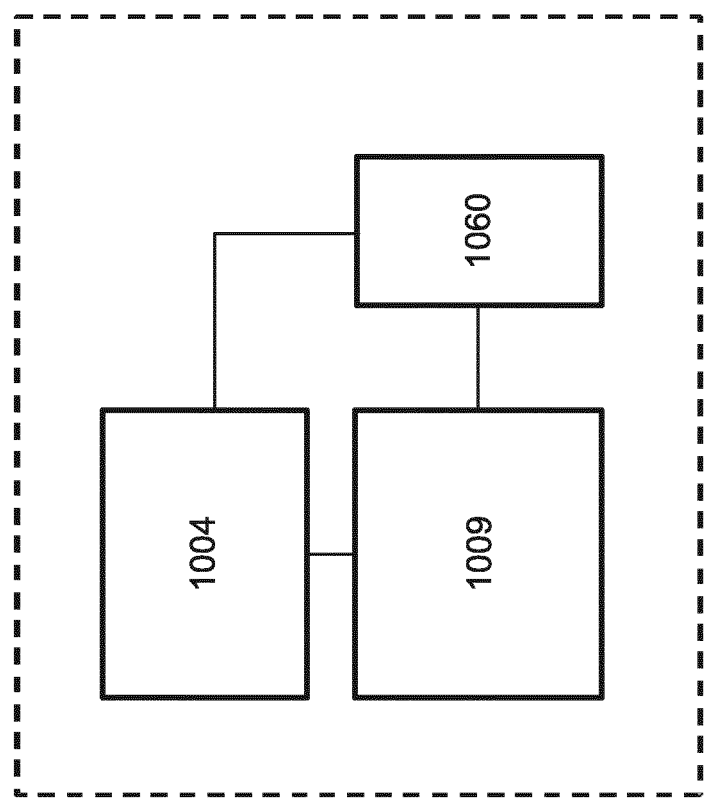
FIG. 10 is a schematic diagram illustrating an exemplary configuration of a charged-particle beam system including an electron beam inspection tool, consistent with embodiments of the present disclosure.

Reference is now made to FIG. 10, which is a schematic diagram illustrating a charged-particle beam system 1000 including an electron beam inspection tool 1004, consistent with embodiments of the present disclosure. As shown in FIG. 10, charged-particle beam system 1000 may include electron beam inspection tool 1004 that is analogous to electron beam tool 104 of FIG. 1, a controller 1009 electrically or electronically connected to electron beam inspection tool 1004, and an image acquisition system 1060 including a data processor. It is to be appreciated that while the image acquisition system 1060 is shown external to controller 1009, it may be a part of controller 1009.

In some embodiments, charged-particle beam system 1000 may provide a mechanism to support multiple modes of operation. For example, charged-particle beam system 1000 may be configured to operate in a 2D imaging mode to obtain high resolution planar images of a sample or a region of interest, or a 3D imaging mode to obtain high resolution morphological images of a sample comprising features and structures having a 3D shape. In some embodiments, charged-particle beam system 1000 may be configured to switch between modes within an inspection scan based on the desired analysis, sample being analyzed, or the application, among other things. For example, charged-particle beam system 1000 may at first perform inspection of a region of interest in 2D imaging mode, which typically provides higher throughput than the 3D imaging mode, and then switch to the 3D imaging mode to perform a high-resolution scan of a detected defect, for example. This may eliminate the need for two tools, thus improving the overall throughput of inspection process. In some embodiments, charged-particle beam system 1000 may only perform an inspection scan in the 3D imaging mode to obtain a high-resolution scan of a region of interest previously determined by the user.

In some embodiments, controller 1009 may comprise a computer or a processor configured to execute various controls of electron beam inspection tool 1004. Controller 1009 may be electronically connected to electron beam inspection tool 1004 and may include processing circuitry configured to execute various signal and image processing functions and generate various control signals to govern operations of charged-particle beam system 1000. In some embodiments, controller 1009 may be configured to switch between operation modes based on user input. Switching operation modes may include, but is not limited to, activating hardware components, executing software programs, and the like. For example, switching electron beam inspection tool 1004 to a 3D imaging mode may include adjusting a voltage signal applied to the stage, adjusting a voltage signal applied to a control electrode (e.g., control electrode 824 of FIG. 8) of objective lens (e.g., objective lens assembly 820 of FIG. 8), moving the stage in X-, Y-, or Z-axis to adjust the focal point of the charged-particle beam, instruct an image acquisition system 1060 to acquire images of the sample at focal points, execute algorithms to process image information, and the like. While image acquisition system 1060 is shown external to controller 1009, it may be a part of controller 1009.

Image acquisition system 1060 may be substantially similar to and may perform similar functions as image acquirer 260 of FIG. 2. In some embodiments, image acquisition system 1060 may be configured to acquire images or image frames and may comprise one or more processors (not shown) configured to perform functions related to imaging or post-processing, one or more storage units (not shown) configured to save the acquired image frames, post-processing information, analysis results, and the like. Image acquisition system 1060 may be configured to communicate with controller 1009. For example, upon determining that the desired focal point is obtained, controller 1009 may cause image acquisition system 1060 to acquire one or more image frames at that focal point. Image acquisition system 1060 may be operated through controller 1009 or by a user. In some embodiments, image acquisition system 1060 may be operated remotely through a computer-implemented program such as a software, an algorithm, or a set of instructions.

As discussed earlier, the focus achieved using optomechanical techniques may be inadequate for high resolution and large-range imaging in some applications, and therefore, a more precise and larger depth of focus may be desired. The larger depth of focus may allow high resolution imaging of deep 3D features such that the top and the bottom surfaces of the features may be simultaneously and clearly imaged. An exemplary method of focusing the charged-particle beam on a surface of the sample using the 3D imaging mode of operation of charged-particle beam system 1000 is discussed herein. It is to be appreciated that the number and the order of steps in the method of focusing are exemplary and for illustrative purposes only. Steps may be added, deleted, edited, reordered, and omitted, as needed. The 3D imaging mode of operation comprises using a combination of optomechanical and electrical techniques to enable focusing the charged-particle beam at multiple focal planes of the sample, thus allowing a user to clearly image the 3D feature in its entirety.

In 3D imaging mode, charged-particle beam system 1000 may be configured to perform the initial height adjustment of the stage (e.g., stage 860 of FIG. 8) using optomechanical techniques such that the focal point of the charged-particle beam coincides or substantially coincides with a desired focal plane of wafer 850 disposed on stage 860. In some embodiments, the initial height adjustment of stage 860 may be performed in 2D imaging mode, and the charged-particle beam system 1000 may be switched to operate in 3D imaging mode once the height of stage 860 is adjusted in 2D imaging mode using optical height sensors and piezoelectric motors.

Once the initial height adjustment is achieved, a controller (e.g., controller 1009 of FIG. 10) may cause electron beam inspection tool 1004 to adjust the initial focal point of the charged-particle beam by manipulating the electromagnetic field associated with the sample. The electromagnetic field may be manipulated to adjust the focal plane of the charged-particle beam along the Z-axis, allowing the charged-particle beam to be focused at multiple focal planes of the sample, and therefore, providing more accurate 3D morphology information. The electromagnetic field associated with the sample may be manipulated by adjusting the landing energy of the charged particles on the sample, adjusting the electrical excitation of a control electrode of an objective lens, or adjusting a stage bias voltage.

In some embodiments, manipulating the electromagnetic field by adjusting the landing energy may comprise applying a first component of a voltage signal to coarse-adjust the initial focal point of the charged-particle beam on a surface of the sample, and applying a second component of the voltage signal to the stage to fine-adjust the initial focal point of the charged-particle beam on the surface of the sample. The first component of the voltage signal may be determined based on the desired height adjustment to shift the focal plane by a predetermined distance along the Z-axis. The landing energy may vary based on the acceleration voltage applied to accelerate the charged particles towards the sample and the first component of the voltage signal applied to the stage. The second component of the voltage signal may be applied to further fine-tune the focal point along the Z-axis. The voltage signal may be applied to, for example, a control electrode (e.g., control electrode 824 of FIG. 8) of an objective lens, the stage (e.g., stage 860 of FIG. 8), or other opto-mechanical components configured to influence the electromagnetic field of the system.

After the charged-particle beam is focused using the electrical techniques, controller 1009 may instruct image acquisition system 1060 to acquire one or more image frames of the feature or the structure. The acquired image frames may be stored and accessed for analysis by the user. In some embodiments, the stored image frames and the corresponding focal plane information may be used to reconstruct a 3D image of the structure using a reconstruction algorithm, for example.

Figure 11C:
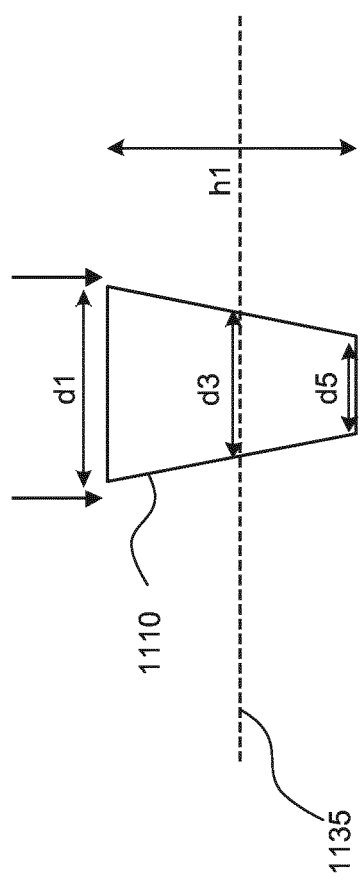
Figure 11D:
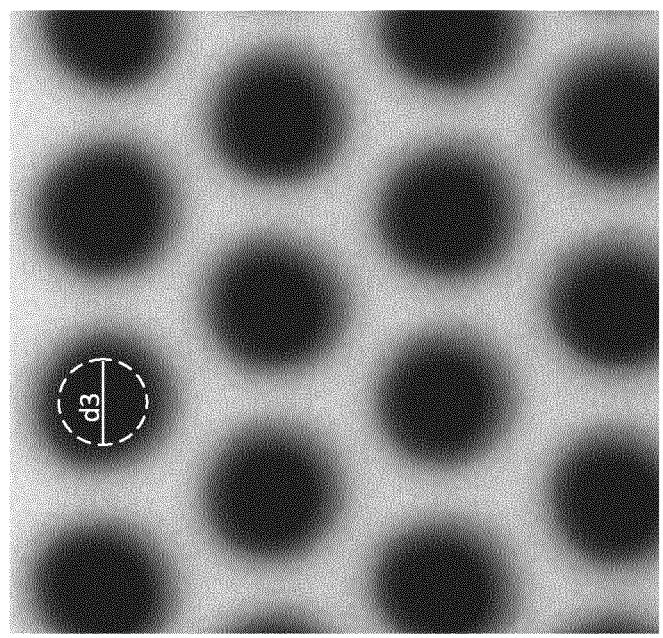
Figure 11E:
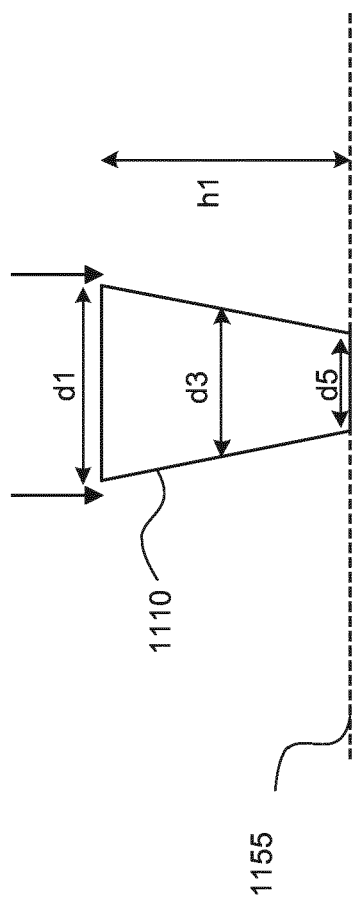
Figure 11F:
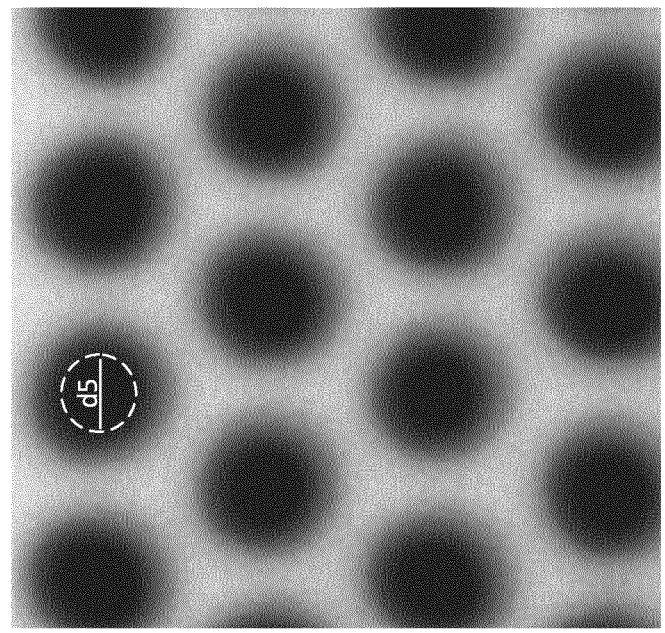

Reference is now made to FIGS. 11A-11F, which illustrate image frames and corresponding focal planes of a feature on a sample, consistent with embodiments of the present disclosure. FIGS. 11A, 11C, and 11E represent top, middle, and bottom focal planes, respectively, in cross-section illustrations of a feature such as a metal contact hole, and FIGS. 11B, 11D, and 11F represent SEM images of the corresponding focal planes. It is to be appreciated that other features including, but are not limited to, interconnects, metal pads, photoresist profiles, etc. may be imaged as well.

An exemplary feature 1110 on a sample (e.g., wafer 850 of FIG. 8) may comprise a metal contact hole, for example, in a 3D NAND flash memory device. In some embodiments, feature 1110 may have a conical, a cylindrical, a triangular, or a rectangular shape, and a circular or an elliptical cross-section. As shown in the cross-sectional illustration of FIG. 11A, for example, feature 1110 may comprise a conical metal contact hole having a height h1, a top diameter d1 along top plane 1115, an intermediate diameter d3 along an intermediate plane (e.g., intermediate plane 1135 of FIG. 11C), and a base diameter d5 along a base plane (e.g., base plane 1155 of FIG. 11E). In some embodiments, height h1, top diameter d1, and base diameter d5 may comprise critical dimensions of feature 1110. As used herein, critical dimensions of a feature or a device may refer to dimensions that can influence the electrical performance of the device because they may contribute parasitic capacitance and resistance. A person of ordinary skill in the art would appreciate that critical dimensions are dimensions that may be adjusted to optimize device performance and yield in manufacturing.

FIG. 11B shows an image frame 1150 (e.g., SEM image) of an array of feature 1110, as imaged by a focusing method using a combination of optomechanical and electrical techniques discussed above. The focal plane of the charged-particle beam in FIG. 11B is adjusted to coincide with top plane 1115 of feature 1110. It is to be appreciated that individual features 1110 of the array may have different dimensions including height h1, and the focal plane of the charged-particle beam may not coincide with the top plane of other features of the array. In such a case, controller 1009 may be configured to adjust the focal plane of the charged-particle beam based on feature 1110 being investigated and dimensions thereof.

Reference is now made to FIGS. 11C and 11D, which illustrate a schematic illustration of feature 1110 having an intermediate plane 1135 and a corresponding image frame 1152, respectively. While intermediate plane 1135 is shown to be in the center of top plane 1115 and base plane (e.g., base plane 1155 of FIG. 11E), it may be any plane between top plane 1115 and base plane 1155, perpendicular to the Z-axis. It is to be appreciated that though FIGS. 11A-F show three planes and corresponding image frames, any number of planes may be imaged, as appropriately needed. In some embodiments, one or more image frames may represent a plane of feature 1110. For example, image acquisition system 1060 may acquire more than one image frames of a plane, as needed.

FIGS. 11E and 11F illustrate a schematic illustration of feature 1110 having a base plane 1155 and a corresponding image frame 1154, respectively. As an example, feature 1110 is shown having a conical shape tapering in diameter along its height h1. In such a case, diameter of top plane of feature 1110 (e.g., d1) may be larger than intermediate diameter d3, and intermediate diameter d3 may be larger than base diameter d5 of feature 1110 (d1>d3>d5), as shown in FIGS. 11A, 11C, and 11E. In image frames 1150, 1152, and 1154 of FIGS. 11B, 11D, and 11F, respectively, the dark circular region highlighted by broken lines depicts the planar view of the in-focus plane of feature 1110. The diffused lighter region surrounding the dark region within the broken lines represents the out-of-focus layers of the sample. It is appreciated that the broken lines highlighting the in-focus plane provide a visual aid and are for illustrative purposes only.

Figure 12:
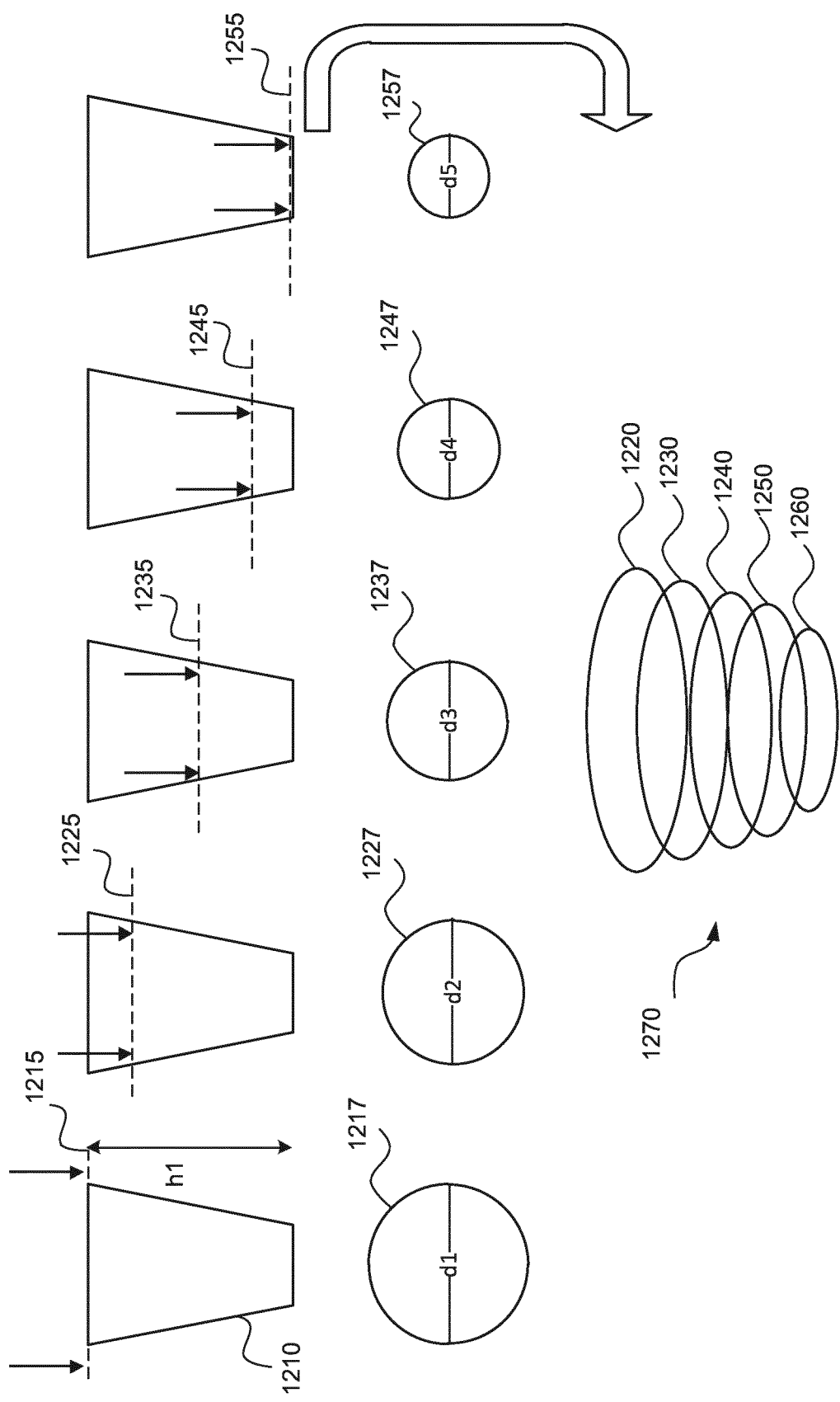
FIG. 12 is a schematic illustration of process steps of generating a 3D image reconstructed from the image frames captured at multiple focal planes, consistent with embodiments of the present disclosure.

Reference is now made to FIG. 12, which is a schematic illustration of process 1200 of generating a 3D image reconstructed from the image frames captured at multiple focal planes, consistent with embodiments of the present disclosure. Feature 1210, for example, may comprise a conical metal contact hole tapering in diameter along the height h1 such that the top diameter d1 is larger than base diameter d5. As shown in FIG. 12, top plane 1215 represents the top surface of feature 1210 having a top diameter d1 as shown in the corresponding top view 1217. Intermediate planes 1225, 1235, and 1245 represent the intermediate planes of feature 1210 having a diameter d2, d3, and d4, respectively, as shown in corresponding top views 1227, 1237, and 1247. Base plane 1255 represents the bottom surface of feature 1210 having a base diameter d5 as shown in corresponding top view 1257. Image frames 1220, 1230, 1240, 1250, and 1260 may be reconstructed to generate a 3D image 1270 of feature 1210.

In some embodiments, in 3D imaging mode, the charged-particle beam may be focused on a top surface of feature 1210 such that the focal plane of the charged-particle beam may coincide with the top plane 1215 of feature 1210. The focal plane coinciding with the top plane 1215 may also be referred to as the first focal plane. Image acquisition system 1060 may be configured to acquire a first image frame 1220 of top surface of feature 1210. The charged-particle beam may be focused by first adjusting the height of stage 860 to form an initial focal point of the charged-particle beam on the sample by optomechanical means, and then adjusting the initial focal point by electrical means including, but not limited to, adjusting the landing energy of the charged-particles, adjusting an electrical excitation of the control electrode, or adjusting the stage bias voltage. In some embodiments, image acquisition system 1060 may acquire more than one image frames at a focal plane. The acquired image frames may be stored in a storage medium (e.g., storage 270 of FIG. 2) such as a hard disk, random access memory (RAM), other types of computer readable memory, and the like. Storage medium may be coupled with image acquisition system 1060 and may be used for saving scanned raw image data as original images, and post-processed images. Information associated with the focal plane, acquisition conditions, tool parameters, etc. may also be stored in storage medium.

The focal point of the charged-particle beam may then be adjusted to focus on a second focal plane located at a distance below the first focal plane. In the context of this disclosure, "below" the first focal plane refers to a location deeper into the sample. The distance between the first and the second focal plane may be predetermined by the user based on the application or the requirement. In some embodiments, the distance may be adjusted dynamically based on a feature being imaged or material of the sample. Image acquisition system 1060 may be configured to acquire a second image frame 1230 of feature 1210 at a deeper intermediate plane 1225. The focal plane of the charged-particle beam may be shifted deeper into the sample by manipulating the electric field or the magnetic field, or both. For example, the landing energy of the charged particle may be adjusted to form the focal plane below the top surface of the sample. In some embodiments, the position of the focal planes may be shifted by adjusting the voltage applied to the control electrode of objective lens. Adjusting the voltage applied to the control electrode may manipulate the electromagnetic field associated with the sample and influence the path of charged-particles incident on the sample. For example, the charged particles may be accelerated, decelerated, deflected, filtered, or focused based on the electrical excitation and the voltage signal applied. Image acquisition system 1060 may be configured to acquire a third image frame 1240 at an intermediate plane 1235, a fourth image frame 1250 at an intermediate plane 1245, and a fifth image frame 1260 at base plane 1255. While FIG. 12 illustrates five imaging planes used to reconstruct a 3D image, any number of imaging planes allowing coverage of the depth of the feature (e.g., feature 1210) being imaged may be used to accurately reconstruct a feature.

In some embodiments, image frames 1220, 1230, 1240, 1250, and 1260 may be reconstructed to generate 3D image 1270 of feature 1210. In some embodiments, at least two image frames and associated focal plane information may be used to, for example, generate 3D image 1270 of feature 1210, extract critical dimension information, determine overlay shift, etc. The image frames may be reconstructed using a computer implemented 3D reconstruction algorithm, a software program, an image processing program, or the like.

Figure 13:
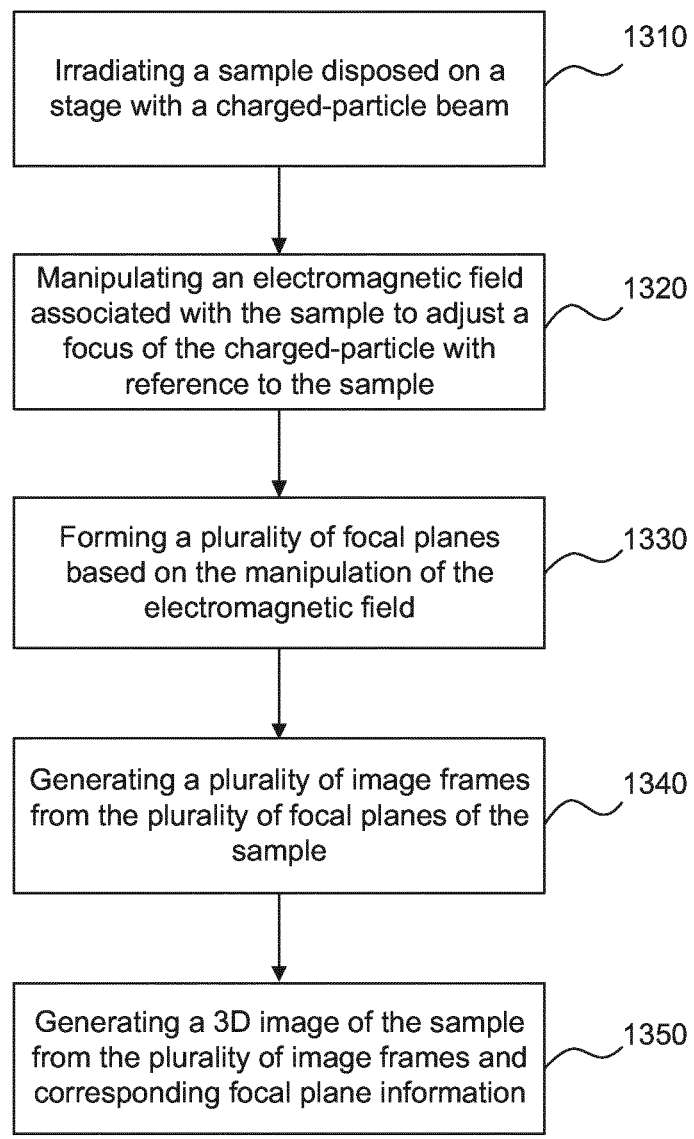
FIG. 13 is a flow chart showing an exemplary method of generating a 3D image of a sample in a charged-particle beam system of FIG. 8, consistent with embodiments of the present disclosure.

Reference is now made to FIG. 13, which illustrates a flow chart showing an exemplary method of generating a 3D image of a sample in a charged-particle beam system, consistent with embodiments of the present disclosure. The method of generating a 3D image of a sample may be performed by charged-EBI system 100 of FIG. 1, imaging system 200 of FIG. 2, charged-particle beam systems 300, 800, or 1000 of FIGS. 3, 8, and 10, respectively.

In step 1310, analogous to steps 510, 610, 710, and 910A, a primary charged-particle beam (e.g., primary charged-particle beam 220 of FIG. 2) is generated from a charged-particle source. The sample disposed on stage (e.g., stage 860 of FIG. 8) is irradiated with the primary charged-particle beam. In some embodiments, at least a portion of the sample may be irradiated with at least a portion of the primary charged-particle beam. The primary charged-particle beam may be, for example, an electron beam generated from an electron source. The electron source may comprise, but is not limited to, thermionic emission of electrons from a tungsten filament or LaB6 cathode, or field emission of electrons from a tungsten/ZrO2 cold-cathode.

The sample may be disposed directly on the stage. In some embodiments, the sample may be disposed on an adapter such as a sample holder, disposed on and secured to the stage. The geometric center of the sample, the sample holder, and the stage may be aligned with each other and with the primary optical axis (e.g., primary optical axis 801 of FIG. 8). The sample, sample holder, and the stage may be disposed in planes normal or substantially normal to the primary optical axis. In some embodiments, the sample or the stage may be tilted off-axis such that the primary charged-particle beam is incident on the sample at an angle smaller or larger than 90°. In some embodiments, the sample and the stage may be mechanically coupled such that the displacement of the stage in any of X-, Y-, or Z-axes results in the displacement of the sample correspondingly. In some embodiments, the sample holder and the stage may be electrically coupled such that there may be an ohmic contact or non-significant voltage potential gradient between them. In some embodiments, the sample and the sample holder may be electrically coupled such that there may be an ohmic contact or non-significant voltage potential gradient between them.

In step 1320, a focus of the primary charged-particle beam may be further adjusted by manipulating an electromagnetic field associated with the sample. Prior to adjusting the focus, a position of the stage in Z-axis is adjusted to form an initial focal point of the primary charged-particle beam at or substantially at a surface of the sample. As used herein, an initial focal point refers to an approximate point or an approximate plane of focus of the charged-particle beam. In some embodiments, adjusting the position of the stage may comprise determining an initial position of the stage in the Z-axis using precise optical position sensing techniques including optical height sensors (e.g., height sensor 840 of FIG. 8), and based on the determined initial position of the stage and a desired focal plane of the primary charged-particle beam, adjusting the position of the stage such that the initial focal point of the primary charged-particle beam is formed on the surface or substantially close to the surface of the sample. In some embodiments, it may be desirable to form the initial focal point on a top surface of the sample.

In some embodiments, height sensors may comprise a laser diode assembly including a laser source irradiating the stage, or the sample (e.g., wafer 850 of FIG. 8) disposed on the stage, with a laser light having a predefined emission wavelength, and a laser detector configured to detect the reflected laser off the surface of the sample. Height sensors may communicate with a stage control module (e.g., stage control module 362 of FIG. 3), beam control module (beam control module 365 of FIG. 3), or both. In some embodiments, the stage control module and the beam control module may communicate with each other to adjust the height of the stage to focus of the primary charged-particle beam on the sample.

The electromagnetic field associated with the sample may comprise electric field and magnetic field influencing the sample. Manipulating the electromagnetic field may allow further adjusting the initial focal point of the charged-particle beam to form a final focal point on the sample. The electromagnetic field may be manipulated by, for example, adjusting an electrical signal applied to a control electrode (e.g., control electrode 824 of FIG. 8) of an objective lens assembly (e.g., objective lens assembly 820 of FIG. 8), adjusting an electrical signal to the stage, or adjusting a magnetic field configured to influence characteristics of the charged-particle beam.

In some embodiments, manipulating the electromagnetic field may comprise adjusting an electrical signal applied to the control electrode of the objective lens assembly. The initial focal point of the charged-particle beam may be adjusted along the Z-axis by adjusting the electrical excitation of the control electrode. The initial height adjustment or the initial focal point of the charged-particle beam is achieved by adjusting the height of the stage based on optical measurements. After the initial focal point is formed, the electrical excitation of the control electrode may be changed to adjust the path or energy of the charged-particle beam, thereby adjusting the focal point. For example, changing the voltage signal applied to the control electrode may manipulate the electric field experienced by the charged-particle beam, and therefore enable adjustment of the focal point of the charged-particle beam on the sample surface. A combination of optomechanical and electrical techniques, as described herein may enable a user to obtain high imaging resolution.

In some embodiments, manipulating the electromagnetic field may comprise adjusting an electrical signal applied to the stage. The initial focal point of the charged-particle beam may be adjusted along the Z-axis by adjusting the voltage signal applied to the stage. The voltage signal applied to the stage may adjust the landing energy of the charged-particle beam on the sample surface. As used herein, landing energy of the charged-particle beam may be defined as the energy of the charged-particles as they impact the sample and is the difference between the acceleration voltage and the stage/sample bias voltage. To improve image resolution and contrast by adjusting the focal point of the incident primary charged-particle beam, users may apply a beam-energy modifying voltage to the stage to reduce or increase the beam energy of the incident charged-particle beam on the sample.

In some embodiments, a voltage may be applied to the stage or the sample so that the charged particles are decelerated (lower landing energy) or accelerated (higher landing energy) before they are incident on the sample. For example, in a SEM, if the high voltage (accelerating voltage applied in the column) is 12 kV and the stage/sample bias voltage is −9 kV, the electrons are first accelerated in the column to an energy of 12 keV then, after leaving the column, decelerated by 9 keV, such that the effective high voltage of the incident charged-particle beam is 3 kV, and the landing energy of the charged-particles of the charged-particle beam is 3 keV. Accelerating or decelerating the charged-particles incident on the sample may change the penetration depth into the sample. At a lower landing energy, for example, less than 1 keV, the charged-particle beam may interact mainly with the top surface of the sample. At a higher landing energy, for example, between 1 keV to 6 keV, the penetration depth may be larger, thus providing information from the bulk of the sample. In some embodiments, the landing energy of the charged-particle beam is in the range of 250 eV to 6 keV. Though the lower landing energy may avoid bulk analysis, the signal strength of secondary charged particles generated may be low, thus negatively impacting the ability to analyze the sample. On the other hand, the higher landing energy may be desirable to extract bulk and sub-surface information, but it may cause charging of the sample, thus negatively impacting the ability to analyze the sample. In some embodiments, the landing energy of the charged-particle beam is in the range of 500 eV to 3 keV, based on the sample, requirements, and application.

Adjusting the landing energy of the charged-particle beam may comprise applying one or more electrical signals to the stage. In some embodiments, the electrical signal may comprise a first and a second component of an electrical signal. The first component of the electrical signal may include a voltage applied to the stage or the sample to influence the acceleration of the charged-particle beam, and therefore to adjust the initial focal point formed by adjusting the position of the stage in the Z-axis. For some applications, the focus of the charged-particle beam at the initial focal point on the sample may not be adequate, and therefore, the charged-particle beam may be further focused or adjusted to achieve better resolution and contrast, for example. In some embodiments, the first component of the voltage signal may be configured to coarse-adjust the initial focal point of the charged-particle beam on the sample surface. As used herein, coarse adjustment of the initial focal point may refer to adjustments of the focal point along the Z-axis. In some embodiments, the first voltage signal may comprise a voltage signal in the range of 5 KV to 10 KV.

The second component of the electrical signal may be a voltage applied to the stage or the sample to fine-adjust the initial focal point formed by adjusting the position of the stage in the Z-axis. As used herein, fine-adjustment of the initial focal point may refer to adjustments of the focal point along the Z-axis to achieve a sharp focus. The second component of the voltage signal may deflect the incident charged-particle beam allowing minor position adjustments along the X-, Y-, or Z-axes to enable a sharper focus. In some embodiments, the second component of the voltage signal may comprise a voltage signal in the range of −150 V to +150 V. It is to be appreciated that the applied first and second components of the voltage signals may be higher or lower than the range mentioned herein, based on factors including, but not limited to, the application, the sample, and tool conditions.

In some embodiments, the landing energy of the charged-particle beam incident on the sample surface may be adjusted to manipulate the electromagnetic field by applying an electrical signal. In some embodiments, the electrical signal may be applied by one source. The electrical signal may comprise a voltage signal having one or more components. For example, if the first component of the voltage signal for coarse-adjustment of the focal point is −9 KV and the second component of the voltage signal for fine-adjustment of the focal point is −100 V, then the electrical signal would comprise a voltage signal of −9.1 KV. Alternatively, if the first component of the voltage signal for coarse adjustment of the focal point is −9 KV and the second component of the voltage signal for fine adjustment of the focal point is +100 V, then the electrical signal would comprise a voltage signal of −8.9 KV. In some embodiments, the first and the second component of the voltage signal may comprise a coarse and a fine adjustment signal, respectively, and the electrical signal may be a numerical sum of the first and second components of the voltage signal. It is to be appreciated that the electrical signal may comprise two or more components, as appropriate.

In some embodiments, manipulating the electromagnetic field associated with the sample may comprise adjusting a magnetic field associated with the sample. In some embodiments, adjusting the electric field by applying electrical signals may result in adjustment of the magnetic field. The adjustment of magnetic field through electrical or magnetic components may influence characteristics of the charged-particle beam. For example, current passing through the coils of an electromagnetic lens create a magnetic field in the bore of the pole pieces that may be used to converge the charged-particle beam. In some embodiments, the characteristics of the charged-particle beam may include, but may not be limited to, a path, a direction, a velocity, or an acceleration of the charged-particle beam. In some embodiments, adjusting the magnetic field using magnets may result in adjustment of the magnetic field. It is to be appreciated that any type of magnets may be used to adjust the magnetic field, as appropriate.

In step 1330, a plurality of focal planes may be formed based on the manipulation of the electromagnetic field. In 3D imaging mode, the charged-particle beam may be focused on a top surface of a feature (e.g., feature 1210 of FIG. 12) such that the focal plane of the charged-particle beam may coincide with the top plane (e.g., top plane 1215 of FIG. 12) of the feature. The focal plane coinciding with the top plane may also be referred to as the first focal plane. Image acquisition system (e.g., image acquisition system 1060 of FIG. 10) may be configured to acquire a first image frame (e.g., first image frame 1220 of FIG. 12) of top surface of the feature. The charged-particle beam may be focused by, for example, adjusting the height of stage to form an initial focal point of the charged-particle beam on the sample by optomechanical means, and adjusting the initial focal point by electrical means including, but is not limited to, adjusting the landing energy of the charged-particles, adjusting an electrical excitation of the control electrode, or adjusting the stage bias voltage.

The focal point of the charged-particle beam may then be adjusted to focus on a second focal plane (e.g., intermediate plane 1225 of FIG. 12) located at a distance below the first focal plane. The distance between the first and the second focal plane may be predetermined by the user based on the application or the requirement. In some embodiments, the distance may be adjusted dynamically based on a feature being imaged or material of the sample. Image acquisition system may be configured to acquire a second image frame of the feature at a deeper intermediate plane (e.g., intermediate plane 1225 of FIG. 12). The focal plane of the charged-particle beam may be shifted deeper into the sample by manipulating the electric field or the magnetic field, or both. In some embodiments, the position of the focal planes may be shifted by adjusting the voltage applied to the control electrode of objective lens. Adjusting the voltage applied to the control electrode may manipulate the electromagnetic field associated with the sample and influence the path of charged-particles incident on the sample. For example, the charged particles may be accelerated, decelerated, deflected, filtered, or focused based on the electrical excitation and the voltage signal applied. A plurality of focal planes (e.g., intermediate planes 1225, 1235, 1245, and 1255 of FIG. 12) may thus be formed based on the manipulation of electromagnetic field. It is to be appreciated that the number of intermediate focal planes may be adjusted, as appropriate.

In step 1340, image acquisition system may generate more than one image frame at a focal plane. In some embodiments, image acquisition system may generate one image frame corresponding to the focal plane. Image acquisition system may be configured to communicate with a controller (e.g., controller 1009 of FIG. 10). For example, after determining that the desired focal point is obtained, the controller may cause image acquisition system to acquire one or more image frames at that focal point. Image acquisition system may be operated through the controller or by a user. In some embodiments, image acquisition system may be operated remotely through a computer-implemented program such as a software, an algorithm, or a set of instructions. The acquired image frames may be stored in a storage medium and may be used for saving scanned raw image data as original images, and post-processed images. Information associated with the focal plane, acquisition conditions, tool parameters, etc. may also be stored in storage medium.

In step 1350, image frames acquired by image acquisition system and the corresponding focal plane information may be reconstructed to generate a 3D image (e.g., 3D image 1270 of FIG. 12). In some embodiments, at least two image frames and associated focal plane information may be used to, for example, generate 3D image of the feature, extract critical dimension information, determine overlay shift, etc. The image frames may be reconstructed using a computer implemented 3D reconstruction algorithm, a software program, an image processing program, or the like.

High throughput inspection of wafers in a production facility such as a wafer fab may require a stage of a SEM apparatus to move quickly and accurately in repetitive patterns of stop-and-go motion. The stop-and-go motion may include multiple cycles of high acceleration, high deceleration, and sudden stops of the stage to be displaced in the order of several microns or nanometers. Moving the stage with high speed and high acceleration may generate vibration due to system dynamics, which in turn may cause dynamic resonance within the system, for example, vibrational waves constructively interfering to cause a higher amplitude vibration throughout a charged-particle beam system. The vibrations caused by moving the stage may result in translation error or displacement error in more than one axes. For example, while inspecting a die on wafer disposed on stage moving in X-Y-axes, may cause dynamic resonance with other moving or non-moving components to cause stage vibration in Z-axis.

One of several challenges encountered includes loss of inspection resolution due to vibration and inadequate vibration compensation, among other things. In existing charged-particle beam systems, the stage is mechanically coupled with a housing chamber, and therefore, vibrations caused by moving the stage may cause vibration of the housing chamber and components attached thereto. For example, vibrations of the stage can cause vibrations of the housing chamber, position sensors attached on a surface of the housing chamber, charged-particle beam column attached to the housing chamber, among other things. Although position sensors may be employed to determine the stage vibration or the vibration of the wafer disposed thereon, however, the vibrations of the charged-particle beam column, and the position sensors themselves may be undetected or inadequately detected, causing inaccurate beam deflection signals applied to the beam controller, and thereby resulting in a loss of inspection resolution, and in reduced inspection throughput.

Further, in existing inspection systems such as a SEM, the position sensor measurements from the stage may be asynchronous with the application of actuation signal to the beam deflectors to compensate the vibration, resulting in inaccurate compensation of vibration, and loss of inspection resolution. One of the reasons for the mismatch in timing is due to the delays caused by digital signal processing of vibration signals to generate the vibration compensation signal. In addition, currently employed vibration detection and correction techniques may not be configured to adequately distinguish between the various vibration modes of the stage such as tilt, torsion, rotation, etc., and therefore, the vibration may be under-compensated, over-compensated, or uncompensated. Therefore, it may be desirable to provide a system and method to adequately identify vibration modes and compensate the vibration based on the identification, and dynamically predict the vibration to accurately compensate the computation and measurement delays.

Figure 14:
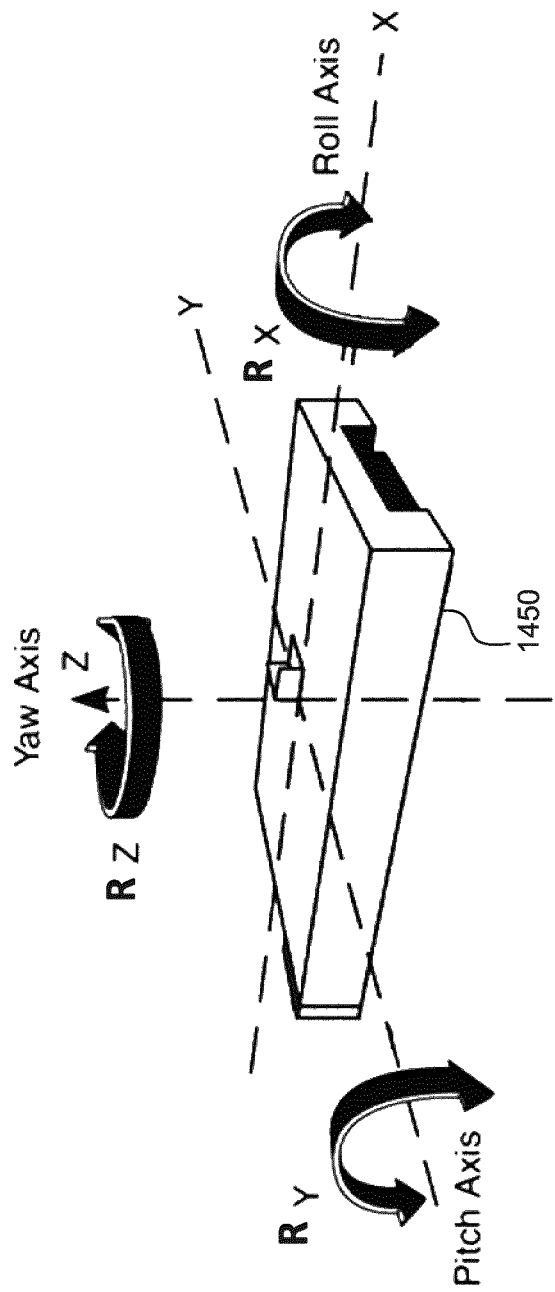
FIG. 14 is a schematic diagram illustrating translational and rotational axes of a sample stage in a charged-particle beam system, consistent with embodiments of the present disclosure.

Reference is now made to FIG. 14, which is a schematic diagram illustrating translational and rotational axes of a stage 1450 (e.g. which can be stage 201) in a charged-particle beam system, consistent with embodiments of the present disclosure. In some embodiments, stage 1450 may comprise a wafer stage, a wafer chuck, a sample holder, or a calibration unit. A sample including, but is not limited to, a wafer or a device to be imaged may be disposed on stage 1450. The sample may be secured on stage 1450 via a vacuum-assisted securing mechanism, for example. In some embodiments, a wafer chuck (not shown) may be secured on stage 1450, and a sample may be disposed on the wafer chuck. In such a configuration, the wafer chuck may be mechanically coupled with stage 1450 and the sample may be secured on the wafer chuck using mechanical coupling, vacuum-assisted means, or a combination thereof, among other things.

In some embodiments, stage 1450 may comprise an adjustable stage having six degrees of freedom. Stage 1450 may be configured to move in one or more of a linear translational axis such as X-, Y-, or Z-axis, or in one or more of a rotational axis such as Rx-, Ry-, or Rz-axis, as indicated in FIG. 14. In some embodiments, stage 1450 may be placed such that the Z-axis is substantially parallel to a primary optical axis (e.g., primary optical axis 801 of FIG. 8), and X-axis and Y-axis are substantially perpendicular to the primary optical axis. In some embodiments, stage 1450 may be tilted along one or more of rotational axes to adjust including, but is not limited to, a volume of interaction between the primary charged-particle beam and the sample, the regions of the sample to be inspected, a desired analysis, among other things.

In some embodiments, moving stage 1450 may cause vibration about any translational or rotational axis. For example, moving stage 1450 along X-Y plane may cause vibration of stage 1450 about the roll axis (Rx-axis), or pitch axis (Ry-axis), or yaw axis (Rz-axis), or a combination thereof.

In some embodiments, vibration of stage 1450 may have six degrees of freedom for movement and the vibration may comprise one or more vibration modes such as rotating, rocking, tilting, shifting, and the like, about one or more axes. It may be desirable to detect, isolate, and identify the vibration modes of stage 1450 to compensate the vibration via a beam deflection signal configured to adjust characteristics of the incident primary charged-particle beam, such as an X/Y location where the beam is incident on the sample, or a depth of focus of the beam. Although FIG. 14 illustrates translational and rotational axes of movement and vibration caused thereby for an exemplary stage 1450, it is appreciated that a housing chamber, a SEM column, position sensors, etc., may vibrate about one or more of the translational and rotational axes as well.

Figure 15:
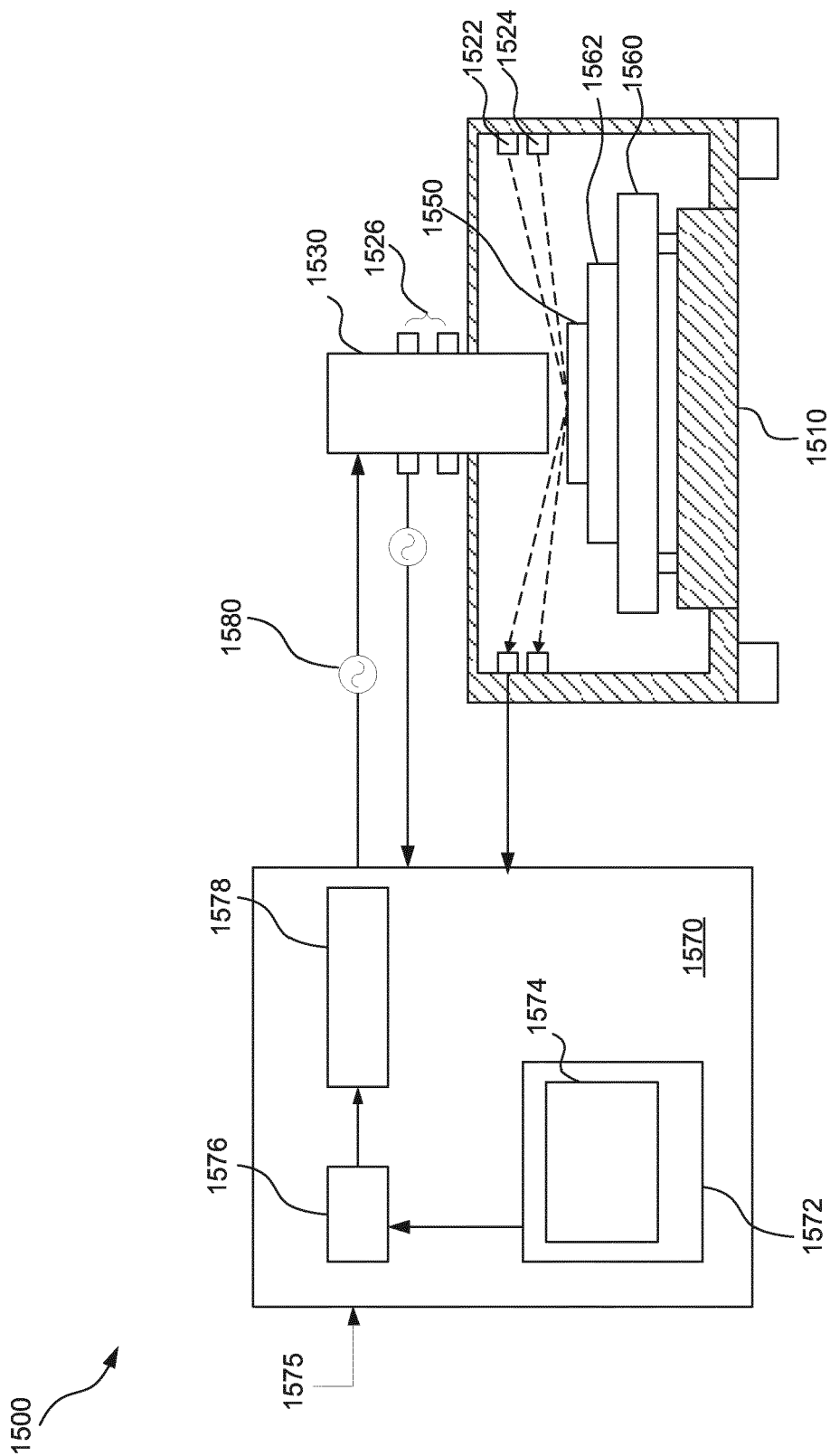
FIG. 15 is a schematic diagram illustrating an exemplary configuration of a charged-particle beam system including an electron beam inspection tool, consistent with embodiments of the present disclosure.

Reference is now made to FIG. 15, which illustrates a charged-particle beam system 1500 consistent with embodiments of the present disclosure. Charged-particle beam system 1500 may include a housing chamber 1510, position sensors 1522 and 1524 disposed on housing chamber 1510, acceleration sensor(s) 1526, a charged-particle beam column 1530 (also referred to herein as SEM column), and a sample 1550 disposed on a wafer chuck 1562 of a stage 1560 (which can be stage 201 of FIGS. 2-4). Charged-particle beam system 1500 may further include a control module 1570 configured to receive vibration signals and generate vibration compensation signals to compensate the vibration of one or more components of charged-particle beam system 1500. Control module 1570 may include a signal processor 1572 comprising a processor 1574 configured to process signals received from position sensors 1522 and 1524, acceleration sensor 1526, a digital image controller 1576 configured to receive beam scan signal 1575, and an actuator 1578 configured to generate a beam deflection signal 1580 to be applied to SEM column 1530. Alternatively, charged-particle beam system 1500 (such as an electron beam system) may be a part of imaging system 200 of FIG. 2 or EBI system 100 of FIG. 1. It is to be appreciated that although not explicitly described, charged-particle beam system 1500 may comprise other standard or non-standard components to perform functions including, but not limited to, beam focusing, beam deflection, electron detection, beam-current limiting, and the like. It is to be appreciated that the described components may perform more or fewer functions than discussed, as appropriate.

As illustrated in FIG. 15, charged-particle beam system 1500 may comprise housing chamber 1510 configured to house components including, but are not limited to, stage 1560, wafer chuck 1562, sample 1550, position sensors 1522 and 1524, a portion of charged-particle beam column 1530, among other things. In some embodiments, housing chamber 1510 may be substantially similar to and may perform substantially similar functions as chamber 101 of FIG. 1. It is appreciated that although a portion of charged-particle beam column 1530 is illustrated as being housed within housing chamber 1510, charged-particle beam column 1530 may be housed within housing chamber 1510 in its entirety.

In some embodiments, housing chamber 1510 may be configured to house electro-mechanical component of charged-particle beam column 1530. In the context of this disclosure, electro-mechanical component of charged-particle beam column 1530 may include, but is not limited to, stage 1560, wafer chuck 1562, sample 1550, stage motion control motors, drives, and the like. Housing chamber 1510 may be placed on an anti-vibration platform, or a vibration-dampening platform (not illustrated) to minimize the impact of vibrations on the overall performance and inspection resolution of images obtained by charged-particle beam system 1500.

In some embodiments, stage 1560 may be configured to move in one or more of X-, Y-, Z-, Rx-, Ry-, or Rz-axes (such as that described with respect to stage 1450 of FIG. 14). Stage 1560 may comprise a wafer chuck 1562 disposed and secured thereon. In some embodiments, stage 1560 may be configured to move in X- and Y-axes, and wafer chuck 1562 may be configured to move in Z-axis. Sample 1550 may be placed on wafer chuck 1562 using mechanical clamping, or vacuum-assisted, or other suitable non-contact clamping mechanisms. For example, wafer chuck 1562 may comprise a vacuum sample holder configured to hold, and secure sample 1550 while being moved in one or more axes for inspection. In some embodiments, wafer chuck 1562 may be configured to be electrically charged to adjust the landing energy of incident primary charged-particle beam, among other things. It is to be appreciated that sample 1550 may be directly placed on stage 1560 capable of adjusting its position in one or more axes, thus eliminating the use of wafer chuck 1562.

In some embodiments, stage 1560 may be mechanically coupled with housing chamber 1510 such that the vibration of stage 1560 may cause vibration of housing chamber 1510 as well. In the context of this disclosure, mechanically coupled refers to physically attached to (e.g., via multiple intermediate components) or in physical contact with a portion of housing chamber 1510. Stage 1560 may be mechanically coupled with housing chamber 1510 using techniques including, but is not limited to, thermal welding, spot welding, riveting, soldering, gluing, and the like. In some embodiments, the coupling mechanism may depend on the impact of the mechanism on vacuum pressure within housing chamber 1510. For example, some metal glues may outgas, causing a virtual leak in housing chamber 1510, and therefore may negatively affect the overall inspection resolution of charged-particle beam system 1500.

Charged-particle beam system 1500 may comprise charged-particle beam column 1530 configured to generate and focus a charged-particle beam (e.g., electron beam) on sample 1550. In some embodiments, SEM column 1530 may be referred to as the electro-optic component. The electro-optic component may include a charged-particle source configured to generate charged-particles, and a plurality of lenses (optical and electromagnetic) and apertures configured to focus the generated charged-particle beam on sample 1550, for example. In some embodiments, SEM column 1530 may be mechanically coupled with a portion of housing chamber 1510 such that the vibrations of housing chamber 1510 may cause vibration of SEM column 1530.

Charged-particle beam system 1500 may comprise position sensors 1522 and 1524, configured to determine displacement of stage 1560. Position sensors 1522 and 1524 may comprise a laser interferometer. It is to be appreciated that position sensing system of charged-particle beam system 1500 may comprise more than one position sensors, and other suitable components as well, for example, signal amplifiers, band-pass filters, data storage units, data processing units, among other things.

In some embodiments, position sensors 1522 and 1524 may comprise a laser diode-sensor assembly including a one-dimensional Position Sensitive Detector (1-D PSD), or a linear array of photodiodes, among other things. In some embodiments, position sensors 1522 and 1524 may be configured to determine lateral displacement of stage 1560. Lateral displacement of stage 1560, as referred to herein, may correspond to the difference between a target location and an actual location of stage 1560 in the X- or Y-axis.

In some embodiments, position sensors 1522 and 1524 may be configured to detect vibration modes of stage 1560. For example, position sensor 1522 may be configured to detect vibration modes such as torsion, tilt, rotation in the X-axis, and position sensor 1524 may be configured to detect vibration modes such as torsion, tilt, rotation in the Y-axis. In some embodiments, more than two position sensors may be employed. For example, a first position sensor to detect vibration along X-axis, a second position sensor to detect vibration along Y-axis, a third sensor to detect vibration about Rx-axis, and a fourth sensor to detect vibration about Ry-axis. It is appreciated that fewer or more position sensors such as laser interferometers may be employed based on the complexity and the accuracy of sensing desired, the application, the sample, and the like. Other position sensing and vibration detection techniques may be used, as appropriate.

Exemplary position sensors 1522 and 1524 may be configured to communicate with control module 1570 (described later in detail) such that an output of position sensors 1522 and 1524 is analyzed and used to further adjust the beam characteristics to compensate the vibration. Position sensors 1522 and 1524 may be further configured to generate an output signal comprising a displacement signal. In some embodiments, the output data from one or more position sensors 1522 and 1524 may be used to modify beam focus, beam energy, beam scan speed, beam scan frequency, beam scan duration, or beam scan range by applying a beam deflection signal to charged-particle beam system 1500. It is appreciated that other suitable means of focusing the incident beam may be employed.

In some embodiments, one or more position sensors 1522 and 1524 may be disposed on a surface of housing chamber 1510. In a configuration including laser interferometers as position sensors 1522 and 1524, an optical detector surface of the laser interferometer may be positioned to receive optical signals representing displacement or vibration of stage 1560 or sample 1550. In some embodiments, position sensors 1522 and 1524 may be mechanically coupled with housing chamber 1510 or mounted on housing chamber 1510, as appropriate. In some embodiments, position sensors 1522 and 1524 may be configured to adjust a position of stage 1560 or sample 1550 in one or more of X-, Y-, Z-, Rx-, Ry-, Rz-axes as well as detect vibration in one or more of X-, Y-, Z-, Rx-, Ry-, Rz-axes.

In some embodiments, position sensors 1522 and 1524 may comprise, for example, a homodyne laser interferometer or a heterodyne laser interferometer. A homodyne laser interferometer uses a single-frequency laser source, whereas a heterodyne laser interferometer uses a laser source with two close frequencies. The laser source may comprise a He—Ne gas laser emitting laser light at a wavelength of 633 nm. It is appreciated that other laser sources with single or multiple wavelength or frequency emissions may be used as well, as appropriate.

As an example, stage positioning or vibration detection using laser interferometers may include two split laser beams directed to a reference mirror and a mirror attached to the stage in each direction. The interferometers may compare the position of the stage mirror to that of the reference mirror to detect and correct any stage position errors. For example, one laser interferometer for X-axis, and a second laser interferometer for the Y-axis. In some embodiments, more than one laser interferometers may be used for a single axis, such as, X- or Y-axis. Other suitable techniques may be employed as well. In some embodiments, as shown in FIG. 15, additional laser interferometers may be employed for vibration detection in Rx-axis and Ry-axis.

One of several challenges encountered in charged-particle beam systems such as a SEM, includes loss of inspection resolution due to undetected vibrations and inadequate compensation of detected vibrations, among other things. For example, in existing inspection systems, vibration of stage 1560 may cause vibration of housing chamber 1510, which in turn may cause vibration of SEM column 1530. These vibrations of SEM column 1530 may remain undetected, and therefore uncompensated. Therefore, it may be desirable to provide a method or a system to detect, determine, and compensate the vibrations of SEM column 1530.

Charged-particle beam system 1500 may comprise an acceleration sensor 1526 configured to determine the vibration of SEM column 1530. Acceleration sensor 1526 may be configured to measure the vibration, or acceleration of motion of SEM column 1530. In some embodiments, acceleration sensor 1526 may comprise a piezoelectric accelerometer, a capacitive accelerometer, a micro electromechanical systems (MEMS) based accelerometer, or a piezoresistive accelerometer. In piezoelectric accelerometers, configured to measure vibrations, the force caused by vibration or a change in motion (acceleration) causes the mass to "squeeze" the piezoelectric material, which produces an electrical charge that is proportional to the force exerted upon it. Since the charge is proportional to the force, and the mass is a constant, the charge is also proportional to the acceleration.

In some embodiments, acceleration sensor 1526 may comprise a high impedance charge output accelerometer. In this type of accelerometer, the piezoelectric crystal produces an electrical charge that is connected directly to the measurement instrument. In some embodiments, acceleration sensor 1526 may comprise a low impedance output accelerometer. A low impedance accelerometer has a charge accelerometer and a micro-circuit including transistors that converts that charge into a low impedance voltage signal. The low impedance accelerometer may produce a voltage signal based on the frequency response or sensitivity of the accelerometer. It is appreciated that other suitable types of accelerometers may be employed as well, as appropriate.

In some embodiments, acceleration sensor 1526 may be configured to detect the vibration of SEM column 1530 as well as detect vibration modes including, but are not limited to, tilting, rotation, torsion, shifting, etc. In some embodiments, charged-particle beam system 1500 may comprise more than one acceleration sensors 1526 mounted on SEM column 1530. The output signal generated by acceleration sensor 1526 may comprise an electrical signal such as a voltage signal. The accelerometer may generate a voltage signal in response to the vibration detected and based on the frequency of vibration detected.

Charged-particle beam system 1500 may comprise control module 1570 configured to process vibration signals of charged-particle beam system 1500 and apply vibration compensation signal to SEM column 1530 to compensate the vibration. In some embodiments, control module 1570 may comprise signal controller 1572, image controller 1576 configured to receive beam scan signal 1575, and actuator 1578 configured to generate a beam deflection signal 1580 to be applied to SEM column 1530.

In existing techniques for vibration detection and compensation, the vibration signals generated by position sensors may be directly added to a beam scan signal to form a vibration compensation signal. One of the several problems with this approach may include inadequate compensation of vibration resulting in loss of inspection resolution because the vibration compensation signal may not account for the vibration modes in all translational and rotational axes. Additionally, because the vibration signal is directly added to the beam scan signal, the delay between measuring a vibration and applying the vibration compensation may not be considered, causing the controller to generate under-compensating or over-compensating vibration compensation signals. Therefore, it may be desirable to provide a method of determining vibration compensation based on identified vibration modes and estimating the vibration to compensate the computation delay and control sampling delays.

In some embodiments, control module 1570 may be configured to receive signals associated with vibration detection from position sensors 1522 and 1524, and acceleration sensor 1526. Control module 1570 may comprise signal processor 1572 configured to receive the signals from position sensors 1522 and 1524, and acceleration sensor 1526, and may be further configured to utilize the received signals to identify the vibration modes of stage 1560 and SEM column 1530. In some embodiments, signal processor 1572 may comprise a field-programmable gate array (FPGA) based controller and may be configured to process vibration signals from position sensors 1522 and 1524, and acceleration sensor 1526. In some embodiments, signal processor 1572 may also be referred to as Digital Vibration Estimation Controller (DVEC) and may be configured to identify modes of vibration based on the input vibration signals from position sensors 1522 and 1524, and acceleration sensor 1526.

In some embodiments, signal processor 1572 may be configured to determine a vibration compensation signal based on the signals from position sensors 1522 and 1524, and acceleration sensor 1526 using a dynamic vibration estimation algorithm (discussed later in detail with reference to FIG. 16) executed by, for example, processor 1574. Signal processor 1572 may comprise other relevant components (not illustrated) including, but are not limited to, a data storage unit, a memory, a timing control circuit, among other things, to support processor 1574 or signal processor 1572.

In some embodiments, signal processor 1572 may be configured to determine a predicted vibration signal based on the signals from position sensors 1522 and 1524, and acceleration sensor 1526 using the dynamic vibration estimation algorithm executed by, for example, processor 1574. The predicted vibration signal may be applied in combination with beam scan signal 1575 to digital image controller 1576. Beam scan signal 1575 may be applied directly to digital image controller 1576 or may be applied to digital image controller 1576 via control module 1570. In some embodiments, beam scan signal 1575 may be generated by a user, a host, or a beam control module (e.g., beam control module 365 of FIG. 3), among other things. Digital image controller 1576 may be configured to generate a compensated beam scan signal based on beam scan signal 1575 and predicted vibration signal from signal processor 1572. In some embodiments, although not preferred, signal processor 1572 may be configured to receive beam scan signal 1575 from the host as well as determine a predicted vibration signal based on the signals from position sensors 1522 and 1524, and acceleration sensor 1526.

In some embodiments, control module 1570 may further comprise actuator 1578 configured to receive a compensated beam scan signal from digital image controller 1576 and generate a beam deflection signal 1580 based on the received compensated beam scan signal. In some embodiments, actuator 1578 may comprise a digital wave generator configured to generate an electrical waveform using digital signal processing techniques. Beam deflection signal 1580 may be applied to SEM column 1530. In some embodiments, beam deflection signal 1580 may be applied to SEM column 1530 through a beam deflection controller (e.g., beam deflection controller 367 of FIG. 3) or a beam control module (e.g., beam control module 365 of FIG. 3). Beam deflection signal 1580 may be configured to compensate the vibration of charged-particle beam system 1500 by, for example, adjusting a characteristic of the primary charged-particle beam based on the vibration detected. It is appreciated that although signal processor 1572, digital image controller 1576, and actuator 1578 are illustrated as components of control module 1570, one or more of these components may be used as stand-alone elements of charged-particle beam system 1500. For example, control module 1570 may comprise signal processor 1572 and digital image controller 1576, while actuator 1578 may be independently operated. It is also appreciated that charged-particle beam system 1500 may not comprise control module 1570, but instead comprises signal processor 1572, digital image controller 1576, and actuator 1578 as discrete components.

Figure 16:
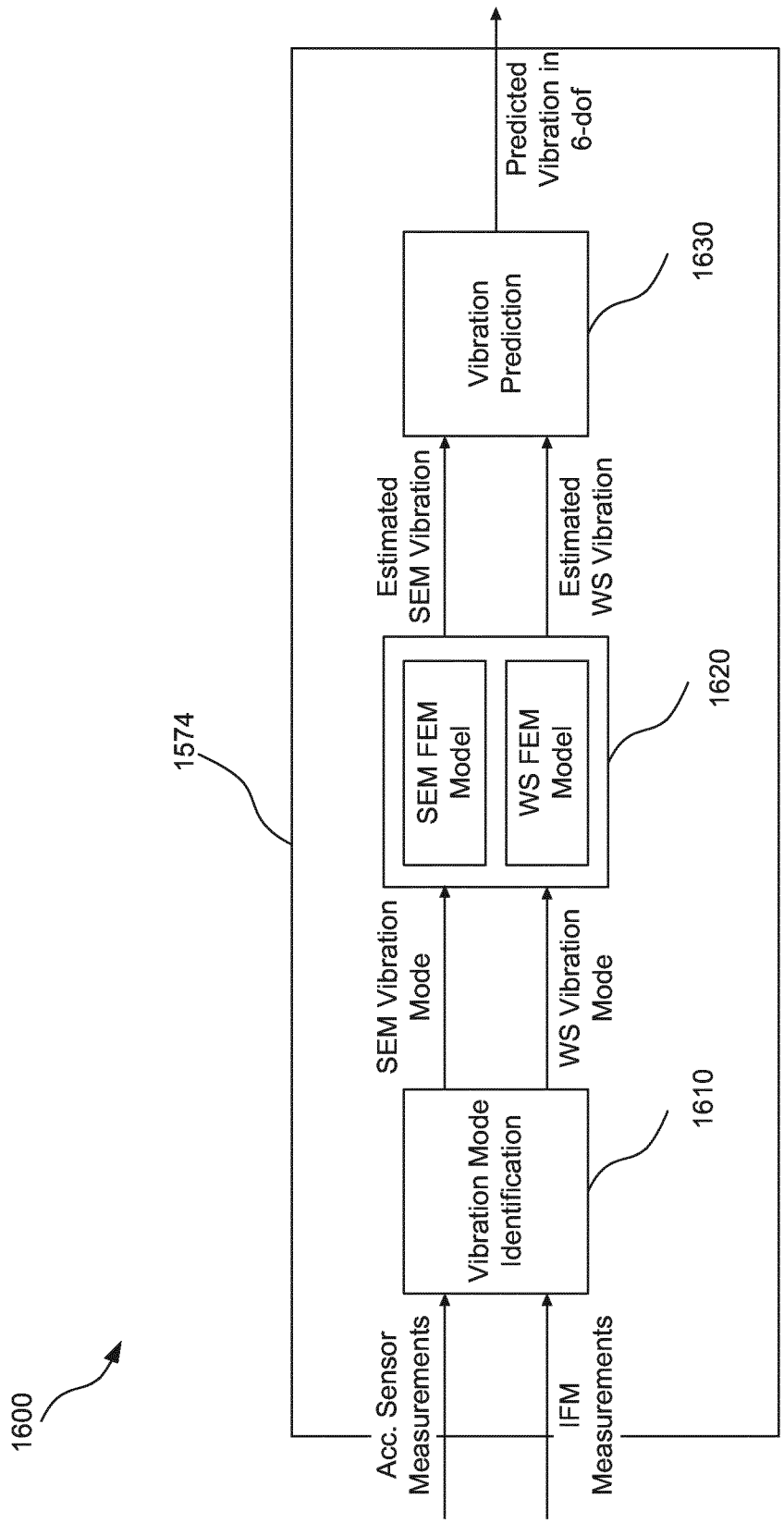
FIG. 16 is a schematic diagram illustrating steps of an exemplary algorithm to determine vibration estimation and compensation signal, consistent with embodiments of the present disclosure.

Reference is now made to FIG. 16, which illustrates steps of an exemplary algorithm 1600 to determine vibration estimation and compensation signal, consistent with embodiments of the present disclosure. One or more steps of algorithm 1600 may be executed by, for example, processor 1574. In some embodiments, algorithm 1600 may be executed in real-time. In the context of this disclosure, "real-time" may refer to occurrence of events within a very short time period in the order of milliseconds, or microseconds. In other words, occurrence of events with negligible delay therebetween. For example, in the context of this disclosure, step 1610 may be performed virtually immediately after measurement of vibration by position sensors 1522 and 1524, and acceleration sensor 1526.

In step 1610 of algorithm 1600, vibration measurement signals from position sensors 1522 and 1524, and acceleration sensor 1526 may be utilized to identify vibration modes of stage 1560 and SEM column 1530, respectively. Signal processor 1572 (DVEC) may be configured to perform vibration mode identification. In some embodiments, identification of vibration modes may include compatibilization of signals from position sensors 1522 and 1524, and acceleration sensor 1526. For example, the vibration measurement signal from acceleration sensor 1526 may comprise a voltage signal, whereas the vibration measurement signal from position sensors 1522 and 1524 may comprise a distance or a displacement signal. In some embodiments, signal processor 1572 may be configured to convert the voltage signal from acceleration sensor 1526 to a corresponding displacement signal, so that the input signal for identification of vibration modes from stage 1560 and SEM column 1530 are compatible.

In some embodiments, identification of vibration modes may further include forming a vibration mode identification matrix of vibration measurements from six degrees of freedom for stage 1560 and SEM column 1530, based on the compatibilized vibration measurement signals. The vibration mode identification matrix may include measurement of vibrations in each direction (X, Y, Z, Rx, Ry, and Rz). In this step, the vibration modes of SEM column 1530 may be identified with reference to stage 1560.

Vibration mode identification in step 1610 may further include decoupling the vibrations of position sensors 1522 and 1524 from the vibrations of stage 1560, using the vibration measurement from acceleration sensor 1526. Because position sensors 1522 and 1524 may be mounted on or mechanically coupled with housing chamber 1510, vibration of housing chamber 1510 may result in vibration of position sensors 1522 and 1524. The vibration measurement obtained by position sensors 1522 and 1524 may include the vibration and vibration modes of position sensors 1522 and 1524 in addition to the vibration of stage 1560. Therefore, it may be desirable to decouple and isolate the vibration of stage 1560 from vibration of position sensors 1522 and 1524.

Based on the vibration mode identification matrix, the vibration modes of SEM column 1530 and stage 1560 may be determined, and corresponding output signals may be generated.

In step 1620, the identified vibration modes from step 1610 may be used to estimate vibration of SEM column 1530 and stage 1560, using a simulation model or a mathematical model. In some embodiments, a three-dimensional finite element analysis model (3D-FEM) may be used to estimate vibrations of SEM column 1530 and stage 1560 along any or all of X, Y, Z, Rx, Ry, and Rz axes.

In step 1630, the vibrations of SEM column 1530 and stage 1560 may be predicted based on the estimated vibrations from step 1620. One of several problems encountered in digital signal processing techniques includes computation and measurement delay, also referred to as "one-sample delay". To mitigate the negative impact of signal processing delays, it may be desirable to determine and apply a "predicted" vibration signal to compensate the vibrations.

In this context, a one-sample delay may refer to as the delay between measurement of vibration and application of actuation signal or beam deflection signal 1580. For example, the vibration measurement may be performed at a first timestamp and the correction signal or the beam deflection signal to compensate the measured vibration may be performed at a second timestamp, wherein the time difference between the first and the second time-stamp is the amount of time required to process the measured vibration signal and generate a vibration compensation signal. Because of the time-delay, the vibration measured and compensation signal applied are asynchronous, thereby resulting in inaccurate vibration compensation.

To compensate the digital signal processing delay, vibration may be predicted or forecasted based on the estimated vibrations of SEM column 1530 and stage 1560 in the second timestamp, such that the vibration measurement and application of compensation signal may be synchronized.

In some embodiments, steps of algorithm 1600 may be performed to predict vibrations of SEM column 1530 and stage 1560 in one or more of X-axis, Y-axis, or Rz-axis. One of several ways to compensate the vibration in Z-axis, Rx-axis, or Ry-axis, may include adjusting the focal depth of incident primary charged-particle beam by adjusting the landing energy, among other things.

Figure 17:
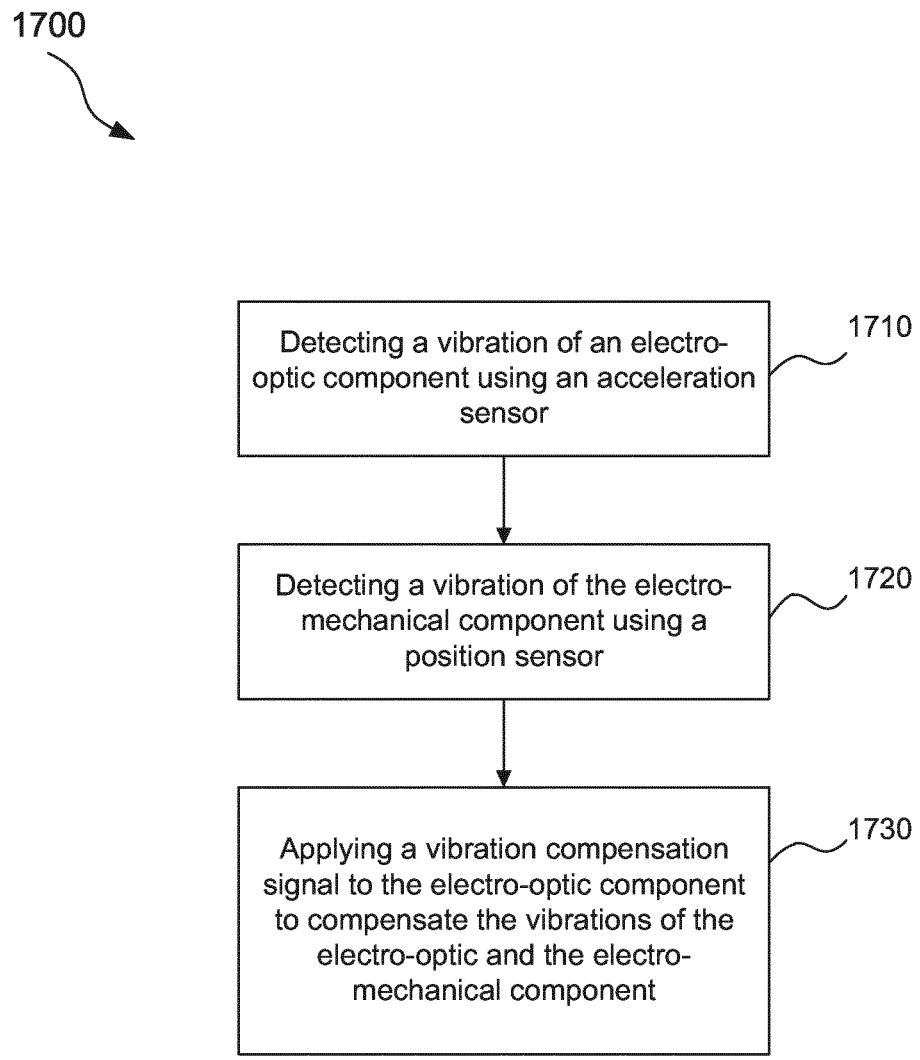
FIG. 17 is a flow chart showing an exemplary method of focusing a charged-particle beam on a sample in a charged-particle beam system of FIG. 15, consistent with embodiments of the present disclosure.

Reference is now made to FIG. 17, which illustrates a flow chart showing an exemplary method 1700 of focusing a charged-particle beam (e.g., electron beam) on a sample in a charged-particle beam system, consistent with embodiments of the present disclosure. The method of focusing the electron beam on a sample may be performed by charged-particle EBI system 100 of FIG. 1, imaging system 200 of FIG. 2, or charged-particle beam system 1500. It is appreciated that the charged-particle beam system 1500 may be controlled to observe, image, and inspect a sample (e.g., sample 1550 of FIG. 15) or a region of interest on the sample. Imaging may comprise scanning the sample to image at least a portion of the sample, a pattern on the sample, or the sample itself. Inspecting the sample may comprise scanning the sample to inspect at least a portion of the sample, a pattern on the sample, or the sample itself. Observing the sample may comprise monitoring sample or regions of interest on sample for reproducibility and repeatability of patterns.

A primary charged-particle beam (e.g., primary charged-particle beam 220 of FIG. 2) is generated from a charged-particle source. The sample disposed on stage (e.g., stage 201 of FIGS. 2-4, stage 1560 of FIG. 15) is irradiated with the primary charged-particle beam. In some embodiments, at least a portion of the sample may be irradiated with at least a portion of the primary charged-particle beam. The primary charged-particle beam may be, for example, an electron beam generated from an electron source. The electron source may comprise, but is not limited to, thermionic emission of electrons from a tungsten filament or LaB6 cathode, or field emission of electrons from a tungsten/ZrO2 cold cathode.

The sample may be disposed directly on the stage. In some embodiments, the sample may be disposed on an adapter such as a sample holder (e.g., wafer chuck 1562 of FIG. 15), disposed on and secured to the stage. The geometric center of the sample, the sample holder, and the stage may be aligned with each other and with the primary optical axis (e.g., primary optical axis 801 of FIG. 8). The sample, sample holder, and the stage may be disposed in planes normal or substantially normal to the primary optical axis. In some embodiments, the sample or the stage may be tilted off-axis such that the primary charged-particle beam is incident on the sample at an angle smaller or larger than 90°. In some embodiments, the sample and the stage may be mechanically coupled such that the displacement of the stage in any of X-, Y-, or Z-axes results in the displacement of the sample correspondingly.

The stage may be mechanically coupled with a housing chamber (e.g., housing chamber 1510 of FIG. 15) such that the vibration of the stage may cause vibration of housing chamber as well. The stage may be mechanically coupled with the housing chamber using techniques including, but is not limited to, thermal welding, spot welding, riveting, soldering, gluing, and the like. The housing chamber may be configured to house electro-mechanical component of charged-particle beam column. In the context of this disclosure, electro-mechanical component of charged-particle beam column may refer to parts or elements including, but is not limited to, the stage, the wafer chuck, the sample, stage motion control motors, drives, and the like. The housing chamber may be placed on an anti-vibration platform, or a vibration-dampening platform to minimize the impact of vibrations on the overall performance and inspection resolution of images obtained. In some embodiments, SEM column (e.g., charged-particle beam column 1530 of FIG. 15) may be referred to as the electro-optic component. The electro-optic component may include a charged-particle source configured to generate charged-particles, and a plurality of lenses (optical and electromagnetic) and apertures configured to focus the generated charged-particle beam on the sample, for example. The SEM column may be mechanically coupled with a portion of housing chamber such that the vibrations of housing chamber may cause vibration of SEM column.

In step 1710, an acceleration sensor (e.g., acceleration sensor 1526 of FIG. 15) may be used to detect a vibration of the electro-optic component of charged-particle beam system. The electro-optic component may comprise the SEM column. The acceleration sensor may be configured to measure the vibration, or acceleration of motion of SEM column. The acceleration sensor may comprise a piezoelectric accelerometer, a capacitive accelerometer, a micro electromechanical systems (MEMS) based accelerometer, or a piezoresistive accelerometer. In piezoelectric accelerometers, configured to measure vibrations, the force caused by vibration or a change in motion (acceleration) produces an electrical charge that is proportional to the force exerted upon it. Since the charge is proportional to the force, and the mass is a constant, the charge is also proportional to the acceleration. The acceleration sensor may comprise a high impedance charge output accelerometer or a low impedance output accelerometer configured to generate a voltage signal in response to the vibration detected and based on the frequency of vibration detected. The acceleration sensor may detect the vibration of SEM column as well as detect vibration modes including, but are not limited to, tilting, rotation, torsion, shifting, etc. Charged-particle beam system may comprise more than one acceleration sensors mounted on the SEM column. The output signal generated by the acceleration sensor may comprise an electrical signal such as a voltage signal.

In step 1720, a position sensor (e.g., position sensor 1522 of FIG. 15) may be used to detect a vibration of the electro-mechanical component of charged-particle beam system. The electro-mechanical component of charged-particle beam system may comprise the stage, the wafer chuck, the sample, stage motion control motors, drives, and the like. One or more position sensors may be employed to detect the vibration and vibration modes of the stage in X- or Y-axis. The position sensor(s) may comprise a laser diode-sensor assembly including a one-dimensional Position Sensitive Detector (1-D PSD), or a linear array of photodiodes, among other things. The position sensors may be configured to determine lateral displacement of the stage and to detect vibration modes of the stage such as torsion, tilt, rotation, shift, in the translational X- or Y-axes and rotational Rx- and Ry-axes. In some embodiments, a first position sensor to detect vibration along X-axis, a second position sensor to detect vibration along Y-axis, a third sensor to detect vibration about Rx-axis, and a fourth sensor to detect vibration about Ry-axis. The position sensor(s) may communicate with a control module (e.g., control module 1570 of FIG. 15) such that an output signal of position sensor(s) may be analyzed and used to further adjust the beam characteristics to compensate the vibration. The output signal may comprise a displacement signal.

The position sensor(s) may be disposed on a surface of or mounted on the housing chamber. The position sensors may comprise laser interferometers. The position sensor(s) may be mechanically coupled with the housing chamber such that a vibration of the housing chamber causes the position sensors to vibrate. The position sensors may be configured to adjust a position of the stage or the sample in one or more of X-, Y-, Z-, Rx-, Ry-, Rz-axes as well as detect vibration in one or more of X-, Y-, Z-, Rx-, Ry-, Rz-axes. The position sensor(s) may comprise, for example, a homodyne laser interferometer or a heterodyne laser interferometer. A homodyne laser interferometer uses a single-frequency laser source, whereas a heterodyne laser interferometer uses a laser source with two close frequencies. The laser source may comprise a He—Ne gas laser emitting laser light at a wavelength of 633 nm. It is appreciated that other laser sources with single or multiple wavelength or frequency emissions may be used as well, as appropriate. The position sensor(s) may generate a displacement signal, or a distance signal based on the frequency of the vibration or the type of vibration mode detected.

In step 1730, a vibration compensation signal may be applied to the SEM column to compensate the vibrations of the electro-optic component and the electro-mechanical component. The vibration compensation signal may be generated by controller (e.g., signal processor 1572 of FIG. 15), also referred to herein as the Dynamic Vibration Estimation Controller (DVEC). The controller may be configured to receive signals associated with vibration detection from the position sensor(s) and acceleration sensor, process the received signals, and generate a vibration compensation signal based on the processed vibration signals. The DVEC may comprise a field-programmable gate array (FPGA) based controller and may be configured to process vibration signals from position sensor(s) and acceleration sensor(s).

The DVEC may be configured to predict or calculate a vibration compensation signal based on the signals from position sensor(s) and acceleration sensor(s) using a dynamic vibration estimation algorithm. The algorithm may comprise the steps of identifying vibration modes of the SEM column and the stage in each of X-, Y-, Z-, Rx-, Ry-, Rz-axes based on the vibration measurements from the position sensor(s) and acceleration sensor(s), estimating the vibrations of the SEM column and the stage based on the identified vibration modes, and predicting or calculating the vibration in six degrees of freedom to be applied to the SEM column.

The algorithm may be implemented in real-time and executed by the DVEC. In the vibration mode identification step, vibration measurement signals from position sensor(s) and acceleration sensor(s) may be utilized to identify vibration modes of the stage and the SEM column, respectively. The DVEC may perform vibration mode identification. Identification of vibration modes may include compatibilization of signals from position sensor(s) and acceleration sensor(s). For example, the vibration measurement signal from acceleration sensor may comprise a voltage signal, whereas the vibration measurement signal from position sensors may comprise a distance or a displacement signal. DVEC may convert the voltage signal from the acceleration sensor to a corresponding displacement signal, so that the input signal for identification of vibration modes from the stage and the SEM column are compatible.

Identification of vibration modes may further include forming a vibration mode identification matrix of vibration measurements from six degrees of freedom for the stage and the SEM column, based on the compatibilized vibration measurement signals. The vibration mode identification matrix may include measurement of vibrations in each direction (X, Y, Z, Rx, Ry, and Rz). In this step, the vibration modes of the SEM column may be identified with reference to the stage.

Vibration mode identification may further include decoupling the vibrations of position sensor(s) from the vibrations of the stage, using the vibration measurement from acceleration sensor(s). Because position sensors are mounted on or mechanically coupled with the housing chamber, vibration of the housing chamber may result in a vibration of position sensors. The vibration measurement obtained by position sensors may include the vibration and vibration modes of position sensors in addition to the vibration of the stage. Therefore, the vibration of the stage is decoupled and isolated from vibration of the position sensor(s). Based on the vibration mode identification matrix, the vibration modes of the SEM column and the stage may be determined, and corresponding output signals may be generated.

The identified vibration modes may be used to estimate the vibration of the SEM column and the stage, using a simulation model or a mathematical model. A three-dimensional finite element analysis model (3D-FEM) may be used to estimate the vibrations of the SEM column and the stage along X, Y, Z, Rx, Ry, and Rz axes. It is appreciated that other simulation models may be used, as appropriate.

The vibrations of the SEM column and the stage may be predicted based on the estimated vibrations. One of several problems encountered in digital signal processing techniques includes computation and measurement delay, also referred to as "one-sample delay". To mitigate the negative impact of signal processing delays, it may be desirable to determine and apply a "predicted" vibration signal to compensate the vibrations.

In this context, a one-sample delay may refer to as the delay between measurement of vibration and application of actuation signal or beam deflection signal. For example, the vibration measurement may be performed at a first timestamp and the correction signal or the beam deflection signal to compensate the measured vibration may be performed at a second timestamp, wherein the time difference between the first and the second time-stamp is the amount of time required to process the measured vibration signal and generate a vibration compensation signal. Because of the time-delay, the vibration measured and compensation signal applied are asynchronous, thereby resulting in inaccurate vibration compensation. To compensate the digital signal processing delay, vibration may be predicted or forecast based on the estimated vibrations of the SEM column and the stage in the second timestamp, such that the vibration measurement and application of compensation signal may be synchronized.

The predicted vibration signal may be applied in combination with a beam scan signal (e.g., beam scan signal 1575 of FIG. 15) to an image controller (e.g., digital image controller 1576 of FIG. 15). The beam scan signal may be applied directly to the digital image controller or may be applied to the digital image controller via the control module. In some embodiments, the beam scan signal may be generated by a user, a host, or a beam control module (e.g., beam control module 365 of FIG. 3). The image controller may be configured to generate a compensated beam scan signal based on the beam scan signal and the predicted vibration signal from the signal processor or the controller.

An actuator (e.g., actuator 1578 of FIG. 15) may be configured to receive the compensated beam scan signal from the image controller and generate a beam deflection signal (e.g., beam deflection signal 1580 of FIG. 15) based on the received compensated beam scan signal. The actuator may comprise a digital wave generator configured to generate an electrical waveform using digital signal processing techniques. Beam deflection signal may be applied to the SEM column to adjust a beam characteristic and compensate the vibration. The beam deflection signal may be applied to the SEM column through a beam deflection controller (e.g., beam deflection controller 367 of FIG. 3) or the beam control module. The beam deflection signal may be configured to compensate the vibration of charged-particle beam system by, for example, adjusting a characteristic of the primary charged-particle beam based on the vibration detected. It is appreciated that although the signal processor, the digital image controller, and the actuator are illustrated as components of the control module, one or more of these components may be used as stand-alone elements of charged-particle beam system.

The embodiments may further be described using the following clauses:

1. A charged-particle beam system comprising:
   a stage configured to hold a sample and is movable in at least one of X-Y and Z axes;
   a position sensing system configured to determine a lateral and vertical displacement of the stage; and
   a controller configured to:
   apply a first signal to deflect a primary charged-particle beam incident on the sample to at least partly compensate for the lateral displacement of the stage; and
   apply a second signal to adjust a focus of a deflected charged-particle beam incident on the sample to at least partly compensate for the vertical displacement of the stage.

2. The system of clause 1, wherein the first signal comprises an electrical signal affecting how the primary charged-particle beam is deflected in the at least one of X-Y axes.

3. The system of clause 2, wherein the electrical signal comprises a signal having a bandwidth in a range of 10 kHz to 50 kHz.

4. The system of any one of clauses 1-3, wherein the lateral displacement corresponds to a difference between a current position of the stage and a target position of the stage in the at least one of X-Y axes.

5. The system of any one of clauses 1-4, wherein the controller is further configured to dynamically adjust at least one of the first signal or the second signal during scanning of the primary charged-particle beam on the sample.

6. The system of any one of clauses 1-5, wherein the second signal comprises a voltage signal applied to the stage, affecting how the deflected charged-particle beam incident on the sample is focused in the Z-axis.

7. The system of clause 6, wherein the voltage signal comprises a signal having a bandwidth in a range of 50 kHz to 200 kHz.

8. The system of any one of clauses 1-7, wherein the vertical displacement corresponds to a difference between a current position of the stage and a target position of the stage in the Z-axis, and wherein the vertical displacement varies during scanning of the primary charged-particle beam on the sample to at least partly compensate for an angular rotation about at least one of X or Y axes.

9. The system of any one of clauses 1-8, further comprising a stage motion controller, wherein the stage motion controller comprises a plurality of motors configured to be independently controlled by a third signal.

10. The system of clause 9, wherein each of the plurality of motors are independently controlled to adjust a leveling of the stage, such that the stage is substantially perpendicular to an optical axis of the primary charged-particle beam.

11. The system of any one of clauses 9 and 10, wherein the third signal comprises a plurality of control signals, each of the plurality of control signals corresponding to at least one of the plurality of motors.

12. The system of any one of clauses 9-11, wherein the plurality of motors comprises at least one of a piezoelectric motor, piezoelectric actuator, or an ultrasonic piezomotor.

13. The system of clause 11, further comprising:
   a first component configured to form an embedded control signal based on the plurality of control signals; and
   a second component configured to extract at least one of the plurality of control signals from the embedded control signal.

14. The system of any one of clauses 10-13, wherein adjusting the leveling of the stage is based on a geometric model of an actuation output of the stage.

15. The system of any one of clauses 1-14, wherein the position sensing system determines the lateral and vertical displacement of the stage using a combination of a laser interferometer and a height sensor.
16. The system of clause 15, wherein the laser interferometer is configured to determine at least the lateral displacement of the stage.
17. The system of clause 15, wherein the height sensor is configured to determine at least the vertical displacement of the stage.
18. A charged-particle beam system comprising:
a stage configured to hold a sample and is movable in at least a Z axis;
a position sensing system configured to determine a vertical displacement of the stage; and
a controller configured to apply a voltage signal to the stage, affecting how the charged-particle beam incident on the sample is focused in the Z-axis.
19. The system of clause 18, wherein the vertical displacement corresponds to a difference between a current position of the stage and a target position of the stage in the Z-axis, and wherein the vertical displacement varies during scanning of the primary charged-particle beam on the sample to at least partly compensate for an angular rotation about at least one of X or Y axes.
20. The system of any one of clauses 18 and 19, wherein the controller is further configured to dynamically adjust the voltage signal during scanning of the primary charged-particle beam on the sample.
21. The system of any one of clauses 18-20, wherein the voltage signal comprises a signal having a bandwidth in a range of 50 kHz to 200 kHz.
22. The system of any one of clauses 18-21, further comprising a stage motion controller, wherein the stage motion controller comprises a plurality of motors configured to be independently controlled by a control signal.
23. The system of clause 22, wherein each of the plurality of motors are independently controlled to adjust a leveling of the stage, such that the stage is substantially perpendicular to an optical axis of the primary charged-particle beam.
24. The system of any one of clauses 22 and 23, wherein the control signal comprises a plurality of control signals, each of the plurality of control signals corresponding to at least one of the plurality of motors.
25. The system of clause 24, further comprising:
a first component configured to form an embedded control signal based on the plurality of control signals; and
a second component configured to extract at least one of the plurality of control signals from the embedded control signal.
26. The system of any one of clauses 18-25, wherein the positioning system comprises a height sensor to determine the vertical displacement of the stage.
27. A method for irradiating a sample disposed on a stage in a charged-particle beam system, the method comprising:
generating a primary charged-particle beam from a charged-particle source;
determining a lateral and a vertical displacement of the stage, wherein the stage is movable in at least one of X-Y and Z axes;
applying a first signal to deflect the primary charged-particle beam incident on the sample to at least partly compensate for the lateral displacement of the stage; and
applying a second signal to the stage to adjust a focus of a deflected charged-particle beam incident on the sample to at least partly compensate for the vertical displacement of the stage.
28. The method of clause 27, wherein the first signal comprises an electrical signal affecting how the primary charged-particle beam is deflected in the at least one of X-Y axes.
29. The method of clause 28, wherein the electrical signal comprises a signal having a bandwidth in a range of 10 kHz to 50 kHz.
30. The method of any one of clauses 27-29, wherein the lateral displacement corresponds to a difference between a current position of the stage and a target position of the stage in the at least one of X-Y axes.
31. The method of any one of clauses 27-30, wherein the vertical displacement corresponds to a difference between a current position of the stage and a target position of the stage in the Z-axis, and wherein the vertical displacement varies during scanning of the primary charged-particle beam on the sample to at least partly compensate for an angular rotation about at least one of X or Y axes.
32. The method of any one of clauses 27-31, further comprising dynamically adjusting at least one of the first signal or the second signal during scanning of the primary charged-particle beam on the sample.
33. The method of any one of clauses 27-32, wherein the second signal comprises a voltage signal applied to the stage, affecting how the deflected charged-particle beam incident on the sample is focused in the Z-axis.
34. The method of clause 33, wherein the voltage signal comprises a signal having a bandwidth in a range of 50 kHz to 200 kHz.
35. The method of any one of clauses 27-34, further comprising applying a third signal to a stage motion controller, wherein the stage motion controller comprises a plurality of motors configured to be independently controlled by the third signal.
36. The method of clause 35, wherein each of the plurality of motors are independently controlled to adjust a leveling of the stage, such that the stage is substantially perpendicular to an optical axis of the primary charged-particle beam.
37. The method of any one of clauses 35 and 36, wherein the third signal comprises a plurality of control signals, each of the plurality of control signals corresponding to at least one of the plurality of motors.
38. The method of any one of clauses 35-37, wherein applying the third signal comprises:
embedding the plurality of control signals to form an embedded control signal; and
extracting at least one of the plurality of control signals from the embedded control signal.
39. The method of any one of clauses 36-38, wherein adjusting the leveling of the stage is based on a geometric model of an actuation output of the stage.
40. The method of any one of clauses 27-39, wherein the lateral and vertical displacement of the stage are determined by a position sensing system.
41. The method of clause 40, wherein the position sensing system determines the lateral and vertical displacement of the stage using a combination of a laser interferometer and a height sensor.
42. The method of clause 41, wherein the laser interferometer is configured to determine the lateral displacement of the stage.

43. The method of clause 41, wherein the height sensor is configured to determine the vertical displacement of the stage.
44. A method for irradiating a sample disposed on a stage in a charged-particle beam system, the method comprising:
generating a primary charged-particle beam from a charged-particle source;
determining a vertical displacement of the stage, wherein the stage is movable in a Z-axis; and
applying a voltage signal to the stage to adjust a focus of a deflected charged-particle beam incident on the sample to at least partly compensate for the vertical displacement of the stage.
45. The method of clause 44, wherein the vertical displacement corresponds to a difference between a current position of the stage and a target position of the stage in the Z-axis, and wherein the vertical displacement varies during scanning of the primary charged-particle beam on the sample to at least partly compensate for an angular rotation about at least one of X or Y axes.
46. The method of any one of clauses 44 and 45, further comprising:
determining a lateral displacement of the stage, wherein the stage is movable in at least one of X-Y axes; and
applying a beam deflection signal to deflect a focused charged-particle beam incident on the sample to at least partly compensate for the lateral displacement.
47. The method of any one of clauses 44-46, further comprising dynamically adjusting at least one of the voltage signal or the beam deflection signal during scanning of the primary charged-particle beam on the sample.
48. The method of any one of clauses 44-47, wherein the voltage signal comprises a signal having a bandwidth in a range of 50 kHz to 200 kHz.
49. The method of clause 46, wherein the beam deflection signal comprises an electrical signal affecting how the focused charged-particle beam is deflected in the at least one of X-Y axes.
50. The method of clause 49, wherein the electrical signal comprises a signal having a bandwidth in a range of 10 kHz to 50 KHz.
51. The method of any one of clauses 46-50, wherein the lateral displacement corresponds to a difference between a current position of the stage and a target position of the stage in the at least one of X-Y axes.
52. The method of any one of clauses 44-51, further comprising applying a control signal to a stage motion controller, wherein the stage motion controller comprises a plurality of motors configured to be independently controlled by the control signal.
53. The method of clause 52, wherein each of the plurality of motors are independently controlled to adjust a leveling of the stage, such that the stage is substantially perpendicular to an optical axis of the primary charged-particle beam.
54. The method of any one of clauses 52 and 53, wherein the control signal comprises a plurality of control signals, each of the plurality of control signals corresponding to at least one of the plurality of motors.
55. The method of any one of clauses 52-54, wherein the plurality of motors comprises at least one of a piezoelectric motor, piezoelectric actuator, or an ultrasonic piezomotor.
56. The method of any one of clauses 52-55, wherein applying the control signal comprises:
embedding the plurality of control signals to form an embedded control signal; and
extracting at least one of the plurality of control signals from the embedded control signal.
57. The method of any one of clauses 53-56, wherein adjusting the leveling of the stage is based on a geometric model of an actuation output of the stage.
58. The method of any one of clauses 46-57, wherein the lateral and vertical displacement of the stage are determined by a position sensing system.
59. The method of clause 58, wherein the position sensing system determines the lateral and vertical displacement of the stage using a combination of a laser interferometer and a height sensor.
60. The method of clause 59, wherein the laser interferometer is configured to determine the lateral displacement of the stage.
61. The method of clause 59, wherein the height sensor is configured to determine the vertical displacement of the stage.
62. A non-transitory computer readable medium comprising a set of instructions that is executable by one or more processors of an apparatus to cause the apparatus to perform a method, wherein the apparatus includes a charged-particle source to generate a primary charged-particle beam and the method comprising:
determining a lateral displacement of a stage, wherein the stage is movable in at least one of X-Y axes; and
instructing a controller to apply a first signal to deflect the primary charged-particle beam incident on the sample to at least partly compensate for the lateral displacement.
63. The medium of clause 62, wherein the set of instructions that is executable by the one or more processors of the apparatus to cause the apparatus to further perform:
determining a vertical displacement of the stage, wherein the stage is movable in a Z-axis; and
instructing the controller to apply a second signal to adjust a focus of the primary charged-particle beam incident on the sample to at least partly compensate for the vertical displacement.
64. The medium of any one of clauses 62 and 63, wherein the set of instructions that are executable by the one or more processors of the apparatus to cause the apparatus to further perform:
applying a third signal to a stage motion controller configured to adjust a leveling of the stage, such that the stage is substantially perpendicular to an optical axis of the primary charged-particle beam.
65. A method of focusing a charged-particle beam on a sample, the method comprising:
irradiating the sample disposed on a stage of a charged-particle beam system with the charged-particle beam;
adjusting, using a first component of the charged-particle system, a location of a first focal point of the charged-particle beam with reference to the sample; and
manipulating, using a second component, an electromagnetic field associated with the sample to form a second focal point by adjusting the first focal point of the charged-particle beam with reference to the sample, wherein the second component is located downstream of a focusing component of an objective lens of the charged-particle system.

66. The method of clause 65, wherein adjusting the location of the first focal point comprises adjusting a position of the stage in a Z-axis.
67. The method of clause 66, wherein adjusting the position of the stage in the Z-axis comprises:
determining, using a height sensor, a position of the sample in the Z-axis; and
adjusting, using a stage motion controller, the position of the stage in the Z-axis based on the determined position of the sample.
68. The method of any one of clauses 65-67, wherein the first component is configured to adjust a focal depth of the charged-particle beam with reference to the sample.
69. The method of any one of clauses 65-68, wherein the first component is located upstream of the focusing component of the objective lens of the charged-particle system.
70. The method of clause 69, wherein the first component comprises a charged-particle source, an anode of the charged-particle source, or a condenser lens, and wherein the first component of the charged-particle system is different from the second component of the charged-particle system.
71. The method of any one of clauses 65-70, wherein manipulating the electromagnetic field comprises adjusting an electrical signal applied to the second component of the charged-particle system.
72. The method of any one of clauses 65-71, wherein the second component of the charged-particle system comprises one or more of a control electrode of the objective lens, the sample, or the stage.
73. The method of any one of clauses 71-72, wherein adjusting the electrical signal applied to the second component adjusts a landing energy of the charged-particle beam on the sample.
74. The method of any one of clauses 72-73, wherein adjusting the electrical signal comprises:
adjusting a first component of the electrical signal applied to the control electrode of the objective lens; and
adjusting a second component of the electrical signal applied to the stage.
75. The method of clause 74, wherein adjusting the first component of the electrical signal applied to the control electrode coarse-adjusts the first focal point of the charged-particle beam with reference to the sample, and wherein adjusting the second component of the electrical signal applied to the stage fine-adjusts the first focal point of the charged-particle beam with reference to the sample.
76. The method of any one of clauses 74-75, wherein the first component of the electrical signal is determined based on an acceleration voltage and the landing energy of the charged-particle beam.
77. The method of any one of clauses 74-76, wherein the first component of the electrical signal comprises a voltage signal with an absolute value in a range of 5 KV to 10 KV, and wherein the second component of the electrical signal comprises a voltage signal with an absolute value in a range of 0 V to 150 V.
78. The method of any one of clauses 65-77, wherein manipulating the electromagnetic field further comprises adjusting an electric field configured to influence a characteristic of the charged-particle beam.
79. The method of any one of clauses 65-78, wherein manipulating the electromagnetic field further comprises adjusting a magnetic field configured to influence a characteristic of the charged-particle beam.
80. The method of any one of clauses 78 and 79, wherein the characteristic of the charged-particle beam comprises at least one of a path, a direction, a velocity, or an acceleration of the charged-particle beam.
81. The method of any one of clauses 73-80, wherein the landing energy of the charged-particle beam is in a range of 500 eV to 3 keV.
82. A method of focusing a charged-particle beam on a sample, the method comprising: irradiating the sample disposed on a stage of a charged-particle beam system with the charged-particle beam;
adjusting, using a first component of the charged-particle system, a location of a first focal point of the charged-particle beam with reference to the sample; and
manipulating, by adjusting a first component of an electrical signal applied to a control electrode of an objective lens, an electromagnetic field associated with the sample to form a second focal point by adjusting the first focal point of the charged-particle beam on the sample.
83. The method of clause 82, wherein adjusting the location of the first focal point comprises adjusting a position of the stage in a Z-axis.
84. The method of clause 83, wherein adjusting the position of the stage in the Z-axis comprises:
determining, using a height sensor, a position of the sample in the Z-axis; and
adjusting, using a stage motion controller, the position of the stage in the Z-axis based on the determined position of the sample.
85. The method of any one of clauses 82-84, wherein the first component is configured to adjust a focal depth of the charged-particle beam with reference to the sample.
86. The method of any one of clauses 82-85, wherein the first component is located upstream of a focusing component of the objective lens of the charged-particle system, and wherein the first component comprises a charged-particle source, an anode of the charged-particle source, or a condenser lens.
87. The method of any one of clauses 82-86, wherein the control electrode comprises a second component of the charged-particle system and is located downstream of a focusing component of the objective lens of the charged-particle system.
88. The method of clause 87, wherein adjusting the electrical signal applied to the second component adjusts a landing energy of the charged-particle beam on the sample.
89. The method of clause 88, wherein the landing energy of the charged-particle beam is in a range of 500 eV to 3 keV.
90. The method of any one of clauses 87-89, wherein the second component of the charged-particle system comprises one or more of the control electrode of the objective lens, the sample, or the stage.
91. The method of any one of clauses 87-90, wherein the first component of the charged-particle system is different from the second component of the charged-particle system.
92. The method of any one of clauses 82-91, wherein manipulating the electromagnetic field further comprises adjusting a second component of the electrical signal applied to the stage.
93. The method of any one of clauses 88-92, wherein the first component of the electrical signal is determined based on an acceleration voltage and the landing energy of the charged-particle beam.

94. The method of any one of clauses 92 and 93, wherein the first component of the electrical signal comprises a voltage signal with an absolute value in a range of 5 KV to 10 KV, and wherein the second component of the electrical signal comprises a voltage signal with an absolute value in a range of OV to 150 V.

95. The method of any one of clauses 92-94, wherein adjusting the first component of the electrical signal applied to the control electrode coarse-adjusts the first focal point of the charged-particle beam, and wherein adjusting the second component of the electrical signal applied to the stage fine-adjusts the first focal point of the charged-particle beam with reference to the sample.

96. The method of any one of clauses 82-95, wherein manipulating the electromagnetic field further comprises adjusting a magnetic field configured to influence a characteristic of the charged-particle beam.

97. The method of clause 96, wherein the characteristic of the charged-particle beam comprises at least one of a path, a direction, a velocity, or an acceleration of the charged-particle beam.

98. A charged-particle beam system comprising:
a stage configured to hold a sample and is movable along at least one of X-Y axes or Z-axis; and
a controller having circuitry and configured to:
   adjust, using a first component of the charged-particle system, a location of a first focal point of the charged-particle beam with reference to the sample; and
   manipulate, using a second component, an electromagnetic field associated with the sample to form a second focal point by adjusting the first focal point of the charged-particle beam with reference to the sample, wherein the second component is located downstream of a focusing component of an objective lens of the charged-particle system.

99. The system of clause 98, wherein adjustment of the location of the first focal point comprises adjustment of a position of the stage in the Z-axis.

100. The system of any one of clauses 98 and 99, further comprising a position sensing system configured to determine a position of the sample in the Z-axis, wherein the position sensing system comprises a height sensor including a laser diode-sensor assembly.

101. The system of clause 100, wherein the controller is configured to adjust the position of the stage in the Z-axis based on the position of the sample determined by the position sensing system.

102. The system of any one of clauses 100 and 101, wherein the height sensor is configured to determine the position of the sample in the Z-axis, and wherein the controller is configured to adjust the position of the stage in the Z-axis to form the first focal point of the charged-particle beam on the sample.

103. The system of any one of clauses 98-102, wherein the first component is configured to adjust a focal depth of the charged-particle beam with reference to the sample.

104. The system of any one of clauses 98-103, wherein the first component is located upstream of the focusing component of the objective lens of the charged-particle system.

105. The system of clause 104, wherein the first component comprises a charged-particle source, an anode of the charged-particle source, or a condenser lens and wherein the first component of the charged-particle system is different from the second component of the charged-particle system.

106. The method of any one of clauses 98-105, wherein manipulation of the electromagnetic field comprises adjustment of an electrical signal applied to the second component of the charged-particle system.

107. The system of any one of clauses 98-106, wherein the second component of the charged-particle system comprises one or more of a control electrode of the objective lens, the sample, or the stage.

108. The system of any one of clauses 106 and 107, wherein adjustment of the electrical signal applied to the second component adjusts a landing energy of the charged-particle beam on the sample.

109. The system of any one of clauses 107 and 108, wherein the adjustment of the electrical signal comprises:
an adjustment of a first component of the electrical signal applied to the control electrode of the objective lens; and
an adjustment of a second component of the electrical signal applied to the stage.

110. The system of clause 109, wherein adjustment of the first component of the electrical signal applied to the control electrode coarse-adjusts the first focal point of the charged-particle beam, and wherein adjustment of the second component of the electrical signal applied to the stage fine-adjusts the first focal point of the charged-particle beam with reference to the sample.

111. The system of any one of clauses 98-110, wherein the controller is further configured to manipulate the electromagnetic field by adjusting a magnetic field configured to influence a characteristic of the charged-particle beam.

112. The system of clause 111, wherein the characteristic of the charged-particle beam comprises at least one of a path, a direction, a velocity, or an acceleration of the charged-particle beam.

113. The system of any one of clauses 110-112, wherein the first component of the electrical signal is determined based on an acceleration voltage and the landing energy of the charged-particle beam.

114. The system of any one of clauses 110-113, wherein the first component of the electrical signal comprises a voltage signal with an absolute value in a range of 5 KV to 10 KV, and wherein the second component of the electrical signal comprises a voltage signal with an absolute value in a range of 0 V to 150 V.

115. The system of any one of clauses 109-114, wherein the landing energy of the charged-particle beam is in a range of 500 eV to 3 keV.

116. A non-transitory computer readable medium comprising a set of instructions that is executable by one or more processors of an apparatus to cause the apparatus to perform a method, wherein the apparatus includes a charged-particle source to generate a charged-particle beam and the method comprising:
adjusting, using a first component of the charged-particle system, a location of a first focal point of the charged-particle beam with reference to the sample; and
manipulating, using a second component, an electromagnetic field associated with the sample to form a second focal point by adjusting the first focal point of the charged-particle beam with reference to the sample, wherein the second component is located downstream of a focusing component of an objective lens of the charged-particle system.

117. The non-transitory computer readable medium of clause 116, wherein the set of instructions that is executable by one or more processors of the apparatus causes the apparatus to further perform:
determining, using a height sensor, a position of the sample in a Z-axis; and
adjusting, using a stage motion controller, the position of the stage in the Z-axis based on the determined position of the sample to form the initial focal point of the charged-particle beam on the sample.

118. The non-transitory computer readable medium of any one of clauses 116 and 117, wherein the set of instructions that is executable by one or more processors of the apparatus causes the apparatus to further perform manipulating an electromagnetic field associated with the sample by:
adjusting a first component of an electrical signal to coarse-adjust the first focal point of the charged-particle beam on a surface of the sample; and
adjusting a second component of the electrical signal to the stage to fine-adjust the first focal point of the charged-particle beam on the surface of the sample.

119. A method of generating a 3D image of a sample in a charged-particle beam apparatus, the method comprising:
irradiating the sample disposed on a stage with a charged-particle beam;
manipulating an electromagnetic field associated with the sample to adjust a focus of the charged-particle beam with reference to the sample;
forming a plurality of focal planes substantially perpendicular to a primary optical axis of the charged-particle beam based on the manipulation of the electromagnetic field;
generating a plurality of image frames from the plurality of focal planes of the sample, wherein an image frame of the plurality of image frames is associated with a corresponding focal plane of the plurality of focal planes; and
generating a 3D image of the sample from the plurality of image frames and corresponding focal plane information.

120. The method of clause 119, wherein manipulating the electromagnetic field comprises adjusting a first component of an electrical signal applied to a control electrode of an objective lens of the charged-particle beam apparatus.

121. The method of clause 120, wherein manipulating the electromagnetic field further comprises adjusting a second component of the electrical signal applied to the stage of the charged-particle beam apparatus.

122. The method of clause 121, wherein adjusting the second component of the electrical signal adjusts a landing energy of the charged-particle beam on the sample.

123. The method of any one of clauses 121 and 122, wherein adjusting the first component of the electrical signal applied to the control electrode coarse-adjusts the first focal point of the charged-particle beam, and wherein adjusting the second component of the electrical signal applied to the stage fine-adjusts the first focal point of the charged-particle beam with reference to the sample.

124. The method of any one of clauses 121-123, wherein the first component of the electrical signal comprises a voltage signal with an absolute value in a range of 5 KV to 10 KV, and wherein the second component of the electrical signal comprises a voltage signal with an absolute value in a range of 0 V to 150 V.

125. The method of any one of clauses 122-124, wherein the landing energy of the charged-particle beam is in a range of 500 eV to 3 keV.

126. The method of any one of clauses 119-125, further comprising forming a first focal plane of the plurality of focal planes coinciding with a top surface of the sample.

127. The method of clause 126, further comprising forming a second focal plane of the plurality of focal planes at a distance below the first focal plane.

128. The method of clause 127, wherein the distance between the first focal plane and the second focal plane is adjusted dynamically based on a feature being imaged or a material of the sample.

129. The method of any one of clauses 119-128, further comprising generating a plurality of image frames at each focal plane of the plurality of focal planes of the sample.

130. The method of any one of clauses 119-129, wherein generating the 3D image comprises reconstructing the plurality of image frames using a reconstruction algorithm.

131. A charged-particle beam system comprising:
a stage configured to hold a sample and is movable along at least one of X-Y axes or Z-axis; and
a controller having circuitry configured to:
manipulate an electromagnetic field associated with the sample to adjust a focus of the charged-particle beam with reference to the sample;
form a plurality of focal planes substantially perpendicular to a primary optical axis of the charged-particle beam based on the manipulation of the electromagnetic field;
generate a plurality of image frames from the plurality of focal planes, wherein an image frame of the plurality of image frames is associated with a corresponding focal plane of the plurality of focal planes; and
generate a 3D image of the sample from the plurality of image frames and corresponding focal plane information.

132. The system of clause 131, wherein manipulation of the electromagnetic field comprises adjustment of a first component of an electrical signal applied to a control electrode of an objective lens of the charged-particle beam system.

133. The system of clause 132, wherein manipulation of the electromagnetic field further comprises adjustment of a second component of the electrical signal applied to the stage of the charged-particle beam system.

134. The system of clause 133, wherein adjustment of the second component of the electrical signal adjusts a landing energy of the charged-particle beam on the sample.

135. The system of any one of clauses 133 and 134, wherein adjustment of the first component of the electrical signal applied to the control electrode coarse-adjusts the first focal point of the charged-particle beam, and wherein adjustment of the second component of the electrical signal applied to the stage fine-adjusts the first focal point of the charged-particle beam with reference to the sample.

136. The system of any one of clauses 133-135, wherein the first component of the electrical signal comprises a voltage signal with an absolute value in a range of 5 KV to 10 KV, and wherein the second component of the electrical signal comprises a voltage signal with an absolute value in a range of 0 V to 150 V.

137. The system of any one of clauses 134-136, wherein the landing energy of the charged-particle beam is in a range of 500 eV to 3 keV.

138. The system of any one of clauses 131-137, wherein the plurality of focal planes includes a first focal plane that coincides with a top surface of the sample.

139. The system of clause 138, wherein the plurality of focal planes includes a second focal plane that is formed at a distance below the first focal plane.

140. The system of clause 139, wherein the distance between the first focal plane and the second focal plane is adjusted dynamically based on a feature being imaged or a material of the sample.

141. The system of any one of clauses 131-140, wherein the controller is further configured to generate a plurality of image frames at each focal plane of the plurality of focal planes of the sample.

142. The system of any one of clauses 131-141, wherein the controller is further configured to generate the 3D image of the sample by reconstructing the plurality of image frames using a reconstruction algorithm.

143. A non-transitory computer readable medium comprising a set of instructions that is executable by one or more processors of an apparatus to cause the apparatus to perform a method, wherein the apparatus includes a charged-particle source to generate a charged-particle beam and the method comprising:
manipulating an electromagnetic field associated with a sample to adjust a focus of the charged-particle beam with reference to the sample;
forming a plurality of focal planes substantially perpendicular to a primary optical axis of the charged-particle beam based on the manipulation of the electromagnetic field;
generating a plurality of image frames from the plurality of focal planes of the sample, wherein an image frame of the plurality of image frames is associated with a corresponding focal plane of the plurality of focal planes; and
generating a 3D image of the sample from the plurality of image frames and corresponding focal plane information.

144. The non-transitory computer readable medium of clause 143, wherein the set of instructions that is executable by the one or more processors of the apparatus to cause the apparatus to further perform:
forming a first focal plane of the plurality of focal planes coinciding with a top surface of the sample; and
forming a second focal plane of the plurality of focal planes at a predetermined distance below the first focal plane.

145. A method of determining a vibration of a charged-particle beam apparatus, the method comprising:
detecting a first vibration of an electro-optic component configured to direct the charged-particle beam towards the sample; and
detecting a second vibration of an electro-mechanical component configured to hold the sample; and
applying, to the electro-optic component, a vibration compensation signal to compensate the first and the second vibration based on the determined vibration of the charged-particle beam apparatus.

146. The method of clause 145, further comprising adjusting a position of the sample with reference to one or more axes, wherein adjusting the position of the sample causes vibration of the electro-optic component and the electro-mechanical component.

147. The method of any one of clauses 145 and 146, wherein detecting the first vibration comprises detecting a vibration of the electro-optic component about one or more axes by use of a first sensor.

148. The method of clause 147, wherein the first sensor comprises an acceleration sensor mechanically coupled with the electro-optic component.

149. The method of clause 148, wherein the acceleration sensor comprises a piezoelectric sensor, a capacitive accelerometer, a micro electromechanical systems (MEMS) based accelerometer, or a piezoresistive accelerometer.

150. The method of any one of clauses 147-149, wherein the first sensor is configured to generate a voltage signal based on a frequency of the detected first vibration.

151. The method of any one of clauses 150, wherein detecting the second vibration comprises detecting a vibration of the electro-mechanical component in translational and rotational axes by use of a second sensor.

152. The method of clause 151, wherein the second sensor comprises a plurality of position sensors configured to generate a displacement signal based on a frequency of the detected second vibration.

153. The method of clause 152, wherein a first position sensor of the plurality of position sensors is configured to detect vibration of the electro-mechanical component in translational axes, and wherein a second position sensor of the plurality of position sensors is configured to detect vibration of the electro-mechanical component in rotational axes.

154. The method of any one of clauses 152-153, further comprising:
receiving, by a first controller, the voltage signal and the displacement signal; and
determining, using the first controller, the vibration compensation signal based on the received voltage signal and the displacement signal.

155. The method of clause 154, wherein determining the vibration compensation signal comprises:
identifying a plurality of vibration modes based on the information associated with the first and the second vibration;
estimating the vibration of the electro-optic component and the electro-mechanical component based on the identified plurality of vibration modes;
determining the vibration in a plurality of axes based on the estimated vibration of the electro-optic component and the electro-mechanical component; and
determining the vibration compensation signal based on the determined vibration in the plurality of axes.

156. The method of any one of clauses 145-155, wherein the vibration compensation signal is determined to compensate the vibration based on an estimation of a predicted vibration for a future time with reference to a measurement time of the first and the second vibration.

157. The method of any one of clauses 155 and 156, wherein identifying the plurality of vibration modes comprises converting the voltage signal to a corresponding distance signal.

158. The method of any one of clauses 155-157, wherein identifying the plurality of vibration modes further comprises decoupling the second vibration of the electro-mechanical component and a vibration of a housing of the electro-mechanical component.

159. The method of any one of clauses 155-158, wherein estimating the vibration of the electro-optic component and the electro-mechanical component comprises using a simulation model.

160. The method of clause 159, wherein the simulation model comprises a three-dimensional finite element analysis model (3D-FEM), a finite difference analysis model (FDM), or a mathematical analysis model.

161. The method of clauses 154-160, further comprising receiving the determined vibration compensation signal by a second controller.

162. The method of clause 161, further comprising:
receiving, by the second controller, a beam scan signal; and
generating, by the second controller, a modified beam scan signal based on the received beam scan signal and the received vibration compensation signal.

163. The method of clause 162, further comprising generating a beam deflection signal, by a signal generator, based on the modified beam scan signal.

164. The method of clause 163, wherein the beam deflection signal is applied to the electro-optic component, and is used to adjust a characteristic of the charged-particle beam incident on the sample.

165. The method of any one of clauses 163 and 164, wherein the beam deflection signal is applied to a beam deflection controller associated with the electro-optic component.

166. The method of any one of clauses 164 and 165, wherein the characteristic of the charged-particle beam comprises a beam scan speed, a beam scan frequency, a beam scan duration, or a beam scan range.

167. The method of any one of clauses 158-166, wherein the plurality of position sensors are disposed on a surface of the housing of the electro-mechanical component.

168. The method of any one of clauses 145-167, wherein the electro-optic component comprises a charged-particle column, and wherein the electro-mechanical component comprises a stage configured to hold the sample and is movable in one or more of X-, Y-, or Z-axes.

169. A charged-particle beam system comprising:
a first sensor configured to detect a first vibration of an electro-optic component of the charged-particle beam system;
a second sensor configured to detect a second vibration of an electro-mechanical component of the charged-particle beam system; and
a first controller including circuitry to generate a vibration compensation signal based on the detected first and the second vibration applied to the electro-optic component.

170. The system of clause 169, wherein the electro-optic component comprises a charged-particle column and is configured to direct a charged-particle beam towards a sample.

171. The system of clause 170, wherein the electro-mechanical component comprises a stage configured to hold the sample and is movable in one or more of X-, Y-, or Z-axes.

172. The system of any one of clauses 170 and 171, wherein an adjustment of a position of the sample causes vibration of the electro-optic component and the electro-mechanical component.

173. The system of any one of clauses 169-172, further comprising a housing configured to house the electro-mechanical component of the charged-particle beam apparatus.

174. The system of clause 173, wherein the electro-mechanical component is mechanically coupled with the housing such that moving the stage causes a vibration of the housing.

175. The system of any one of clauses 173 and 174, wherein the electro-optic component is mechanically coupled with the housing such that the vibration of the housing causes the first vibration of the electro-optic component.

176. The system of any one of clauses 169-175, wherein the first sensor is further configured to detect the first vibration of the electro-optic component about one or more axes.

177. The system of any one of clauses 169-176, wherein the first sensor comprises an acceleration sensor mechanically coupled with the electro-optic component.

178. The system of clause 177, wherein the acceleration sensor comprises a piezoelectric sensor, a capacitive accelerometer, a micro electromechanical systems (MEMS) based accelerometer, or a piezoresistive accelerometer.

179. The system of any one of clauses 169-178, wherein the first sensor is configured to generate a voltage signal based on a frequency of the detected first vibration.

180. The system of any one of clauses 179, wherein the second sensor is configured to detect the second vibration of the electro-mechanical component in translational and rotational axes.

181. The system of any one of clauses 179 and 180, wherein the second sensor comprises a plurality of position sensors configured to generate a displacement signal based on a frequency of the detected second vibration.

182. The system of clause 181, wherein a first position sensor of the plurality of position sensors is configured to detect vibration of the electro-mechanical component in translational axes, and wherein a second position sensor of the plurality of position sensors is configured to detect vibration of the electro-mechanical component in rotational axes.

183. The system of clause 182, wherein the first and the second position sensors are disposed on a surface of the housing of the electro-mechanical component.

184. The system of any one of clauses 181-183, wherein the first controller is further configured to:
receive the voltage signal and the displacement signal; and
determine the vibration compensation signal based on the voltage signal and the displacement signal.

185. The system of any one of clauses 169-184, wherein the first controller includes circuitry to:
identify a plurality of vibration modes based on information associated with the first and the second vibration;

estimate the vibration of the electro-optic component and the electro-mechanical component based on the identified plurality of vibration modes;

determine the vibration in a plurality of axes based on the estimated vibration of the electro-optic component and the electro-mechanical component; and determine the vibration compensation signal based on the determined vibration in the plurality of axes.

186. The system of any one of clauses 169-185, wherein the vibration compensation signal is determined to compensate the vibration based on an estimation of a predicted vibration for a future time with reference to a measurement time of the first and the second vibration.

187. The system of any one of clauses 185 and 186, wherein identification of the plurality of vibration modes comprises conversion of the voltage signal to a corresponding distance signal.

188. The system of any one of clauses 185-187, wherein identification of the plurality of vibration modes further comprises decoupling of the second vibration of the electro-mechanical component and a vibration of the housing of the electro-mechanical component.

189. The system of any one of clauses 184-188, wherein estimation of the vibration of the electro-optic component and the electro-mechanical component comprises using a simulation model.

190. The system of clause 189, wherein the simulation model comprises a three-dimensional finite element analysis model (3D-FEM), a finite difference analysis model (FDM), or a mathematical analysis model.

191. The system of any one of clauses 184-190, further comprising a second controller includes circuitry to receive the determined vibration compensation signal.

192. The system of clause 191, wherein the second controller includes circuitry to:

receive a beam scan signal; and generate a modified beam scan signal based on the received beam scan signal and the vibration compensation signal.

193. The system of clause 192, further comprising a signal generator configured to generate a beam deflection signal based on the modified beam scan signal.

194. The system of clause 193, wherein the beam deflection signal is applied to the electro-optic component, and is configured to adjust a characteristic of the charged-particle beam incident on the sample.

195. The system of any one of clauses 193 and 194, wherein the beam deflection signal is applied to a beam deflection controller associated with the electro-optic component.

196. The system of any one of clauses 194 and 195, wherein the characteristic of the charged-particle beam comprises a beam scan speed, a beam scan frequency, a beam scan duration, or a beam scan range.

197. A non-transitory computer readable medium comprising a set of instructions that is executable by one or more processors of an apparatus to cause the apparatus to perform a method of determining a vibration of a charged-particle beam apparatus, the method comprising:

detecting a first vibration of an electro-optic component configured to direct the charged-particle beam towards a sample; and detecting a second vibration of an electro-mechanical component configured to hold the sample; and applying, to the electro-optic component, a vibration compensation signal to compensate the first and the second vibration based on the determined vibration of the charged-particle beam apparatus.

198. The non-transitory computer readable medium of clause 197, wherein the set of instructions that is executable by the one or more processors of the apparatus to cause the apparatus to further perform adjusting a position of the sample with reference to one or more axes, wherein adjusting the position of the sample causes vibration of the electro-optic component and the electro-mechanical component.

199. The non-transitory computer readable medium of any one of clauses 197 and 198, wherein the set of instructions that is executable by the one or more processors of the apparatus to cause the apparatus to further perform determining a vibration compensation signal based on the voltage signal and the displacement signal, the determining comprising the steps of:

identifying a plurality of vibration modes based on the information associated with the first and the second vibration;

estimating the vibration of the electro-optic component and the electro-mechanical component based on the identified plurality of vibration modes;

determining the vibration in a plurality of axes based on the estimated vibration of the electro-optic component and the electro-mechanical component; and determining the vibration compensation signal based on the determined vibration in the plurality of axes.

200. The non-transitory computer readable medium of any one of clauses 197-199, wherein the set of instructions that is executable by the one or more processors of the apparatus to cause the apparatus to further perform:

receiving, by a controller, a beam scan signal;

generating a modified beam scan signal based on the received beam scan signal and the vibration compensation signal;

generating a beam deflection signal, by a signal generator, based on the modified beam scan signal, wherein the beam deflection signal is applied to the electro-optic component and is configured to adjust a characteristic of the charged-particle beam incident on the sample; and applying the beam deflection signal to a beam deflection controller associated with the electro-optic component.

A non-transitory computer readable medium may be provided that stores instructions for a processor (for example, processor of controller 109, processor 430) to carry out wafer inspection, wafer imaging, stage calibrations, displacement error calibration, displacement error compensation, manipulating the electromagnetic field associated with the sample, communicate with image acquisition system, activating an acceleration sensor, activating the laser interferometers, operating DVEC, executing algorithm to estimate vibrations of the SEM column and the stage, operations of a charged particle beam apparatus, or other imaging device, etc. Common forms of non-transitory media include, for example, a floppy disk, a flexible disk, hard disk, solid state drive, magnetic tape, or any other magnetic data storage medium, a Compact Disc Read Only Memory (CD-ROM), any other optical data storage medium, any physical medium with patterns of holes, a Random Access Memory (RAM), a Programmable Read Only Memory (PROM), and Erasable Programmable Read Only Memory (EPROM), a FLASH-EPROM or any other flash memory, Non-Volatile Random Access Memory (NVRAM), a cache, a register, any other memory chip or cartridge, and networked versions of the same.

The block diagrams in the figures illustrate the architecture, functionality, and operation of possible implementations of systems, methods, and computer hardware or software products according to various exemplary embodiments of the present disclosure. In this regard, each block in a flowchart or block diagram may represent a module, segment, or portion of code, which comprises one or more executable instructions for implementing the specified logical functions. It should be understood that in some alternative implementations, functions indicated in a block may occur out of the order noted in the figures. For example, two blocks shown in succession may be executed or implemented substantially concurrently, or two blocks may sometimes be executed in reverse order, depending upon the functionality involved. Some blocks may also be omitted. It should also be understood that each block of the block diagrams, and combination of the blocks, may be implemented by special purpose hardware-based systems that perform the specified functions or acts, or by combinations of special purpose hardware and computer instructions.

It will be appreciated that the embodiments of the present disclosure are not limited to the exact construction that has been described above and illustrated in the accompanying drawings, and that various modifications and changes may be made without departing from the scope thereof.

The invention claimed is:

1. A charged-particle beam system comprising:
    a stage configured to hold a sample and is movable in at least one of X-Y and Z axes;
    a position sensing system configured to determine a lateral and vertical displacement of the stage; and
    a controller configured to:
        apply a first signal to deflect a primary charged-particle beam incident on the sample to at least partly compensate for the lateral displacement of the stage; and
        apply a second signal to adjust a focus of a deflected charged-particle beam incident on the sample to at least partly compensate for the vertical displacement of the stage.

2. The system of claim 1, wherein the first signal comprises an electrical signal affecting how the primary charged-particle beam is deflected in the at least one of X-Y axes.

3. The system of claim 2, wherein the electrical signal comprises a signal having a bandwidth in a range of 10 kHz to 50 kHz.

4. The system of claim 1, wherein the lateral displacement corresponds to a difference between a current position of the stage and a target position of the stage in the at least one of X-Y axes.

5. The system of claim 1, wherein the controller is further configured to dynamically adjust at least one of the first signal or the second signal during scanning of the primary charged-particle beam on the sample.

6. The system of claim 1, wherein the second signal comprises a voltage signal applied to the stage, affecting how the deflected charged-particle beam incident on the sample is focused in the Z-axis.

7. The system of claim 6, wherein the voltage signal comprises a signal having a bandwidth in a range of 50 kHz to 200 kHz.

8. The system of claim 1, wherein the vertical displacement corresponds to a difference between a current position of the stage and a target position of the stage in the Z-axis, and wherein the vertical displacement varies during scanning of the primary charged-particle beam on the sample to at least partly compensate for an angular rotation about at least one of X or Y axes.

9. The system of claim 1, further comprising a stage motion controller, wherein the stage motion controller comprises a plurality of motors configured to be independently controlled by a third signal.

10. The system of claim 9, wherein each of the plurality of motors are independently controlled to adjust a leveling of the stage, such that the stage is substantially perpendicular to an optical axis of the primary charged-particle beam.

11. The system of claim 9, wherein the third signal comprises a plurality of control signals, each of the plurality of control signals corresponding to at least one of the plurality of motors.

12. The system of claim 9, wherein the plurality of motors comprises at least one of a piezoelectric motor, piezoelectric actuator, or an ultrasonic piezomotor.

13. The system of claim 11, further comprising:
    a first component configured to form an embedded control signal based on the plurality of control signals; and
    a second component configured to extract at least one of the plurality of control signals from the embedded control signal.

14. The system of claim 10, wherein adjusting the leveling of the stage is based on a geometric model of an actuation output of the stage.

15. A non-transitory computer readable medium comprising a set of instructions that is executable by one or more processors of an apparatus to cause the apparatus to perform a method, wherein the apparatus includes a charged-particle source to generate a primary charged-particle beam and the method comprising:
    determining a lateral displacement of a stage, wherein the stage is movable in at least one of X-Y axes; and
    instructing a controller to apply a first signal to deflect the primary charged-particle beam incident on a sample on the stage to at least partly compensate for the lateral displacement.

16. A charged-particle beam system comprising:
    a stage configured to hold a sample and is movable in at least one of X-Y and Z axes;
    a position sensing system configured to determine a lateral and vertical displacement of the stage;
    a controller configured to:
        apply a first signal to deflect a primary charged-particle beam incident on the sample to at least partly compensate for the lateral displacement of the stage; and
        apply a second signal to adjust a focus of a deflected charged-particle beam incident on the sample to at least partly compensate for the vertical displacement of the stage;
    a stage motion controller comprising a plurality of motors configured to be independently controlled by a plurality of control signals;
    a first component configured to form an embedded control signal based on the plurality of control signals; and
    a second component configured to extract at least one of the plurality of control signals from the embedded control signal.

* * * * *